(12) United States Patent
Ichikawa

(10) Patent No.: US 11,362,306 B2
(45) Date of Patent: Jun. 14, 2022

(54) LIGHT EMITTING ELEMENT UNIT

(71) Applicant: Sony Semiconductor Solutions Corporation, Kanagawa (JP)

(72) Inventor: Tomoyoshi Ichikawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/970,280

(22) PCT Filed: Mar. 1, 2019

(86) PCT No.: PCT/JP2019/008109
§ 371 (c)(1),
(2) Date: Aug. 14, 2020

(87) PCT Pub. No.: WO2019/172121
PCT Pub. Date: Sep. 12, 2019

(65) Prior Publication Data
US 2021/0143367 A1    May 13, 2021

(30) Foreign Application Priority Data
Mar. 6, 2018 (JP) .............................. JP2018-039598

(51) Int. Cl.
*H01L 51/50* (2006.01)
*H01L 51/52* (2006.01)
*H01L 27/32* (2006.01)

(52) U.S. Cl.
CPC ........ *H01L 51/5253* (2013.01); *H01L 27/322* (2013.01); *H01L 27/3209* (2013.01); *H01L 51/504* (2013.01); *H01L 51/5044* (2013.01); *H01L 2251/308* (2013.01)

(58) Field of Classification Search
CPC ............... H01L 51/5253; H01L 51/504; H01L 51/5044; H01L 27/322
See application file for complete search history.

(56) References Cited

U.S. PATENT DOCUMENTS 5,917,280 A * 6/1999 Burrows ............. H01L 27/3209
                                                          313/506
6,030,700 A * 2/2000 Forrest .................... C09K 11/06
                                                          428/336

(Continued)

FOREIGN PATENT DOCUMENTS

JP          2006-278257 A       10/2006

*Primary Examiner* — Ida M Soward
(74) *Attorney, Agent, or Firm* — Michael Best & Friedrich LLP

(57) ABSTRACT

A light emitting element unit includes three light emitting elements. A first light emitting element 10a is obtained by laminating a 1a-th electrode 21a, a first organic layer 23a including a first light emitting layer, a 2a-th electrode 22a, a second organic layer 23b including a second light emitting layer, and a third organic layer 23c including a third light emitting layer. A second light emitting element 10b is obtained by laminating the first organic layer 23a, a 1b-th electrode 21b, the second organic layer 23b, a 2b-th electrode 22b, and the third organic layer 23c. A third light emitting element 10c is obtained by laminating the first organic layer 23a, the second organic layer 23b, a 1c-th electrode 21c, the third organic layer 23c, and a 2c-th electrode 22c.

10 Claims, 28 Drawing Sheets

(56) References Cited

U.S. PATENT DOCUMENTS

| | | | |
|---|---|---|---|
| 6,297,516 B1* | 10/2001 | Forrest | H01L 51/5036 |
| | | | 313/504 |
| 7,327,081 B2* | 2/2008 | Lo | H01L 51/5271 |
| | | | 313/506 |
| 9,065,079 B2* | 6/2015 | Liu | G09G 3/30 |
| 9,853,232 B2* | 12/2017 | Shin | H01L 51/5044 |
| 9,893,303 B2* | 2/2018 | Suzuki | H01L 51/5016 |
| 9,923,032 B2* | 3/2018 | Lee | H01L 27/3209 |
| 10,170,521 B2* | 1/2019 | Jung | H01L 51/5265 |
| 10,367,034 B2* | 7/2019 | Lin | H01L 27/3209 |
| 10,686,149 B2* | 6/2020 | Park | H01L 27/302 |
| 11,069,669 B2* | 7/2021 | Chang | H01L 27/153 |
| 2008/0136337 A1* | 6/2008 | Rogojevic | H01L 25/048 |
| | | | 313/504 |
| 2019/0228686 A1* | 7/2019 | Tsukamoto | H01L 51/5056 |

* cited by examiner

LIGHT EMITTING ELEMENT UNIT

TECHNICAL FIELD

The present disclosure relates to a light emitting element unit.

BACKGROUND ART

In recent years, not only to a direct-view display such as a monitor device but also to an ultra-small display (microdisplay) requiring a pixel pitch of several microns, an organic EL display device that displays an image using an organic electroluminescence phenomenon (organic EL phenomenon) has been applied. In addition, in the organic EL display device, there is a strong demand for developing technology of efficiently extracting light. This is because when light extraction efficiency is low, the actual emission amount in an organic EL element is not effectively utilized, which causes a large loss in terms of power consumption and the like.

In a conventional direct-view organic EL display device, a red light emitting element, a green light emitting element, and a blue light emitting element are often manufactured by a mask vapor deposition process. That is, an RGB color-separated structure is achieved. However, it is difficult to adopt the RGB color-separated structure in an organic EL display device having a fine pixel pitch due to the accuracy of mask alignment and the like. Therefore, a "white method" structure is adopted in which three light emitting layers of a red light emitting layer, a green light emitting layer, and a blue light emitting layer are laminated over all pixels and white light is emitted from each light emitting element. Each light emitting element includes a color filter. In addition, by causing white light emitted from a light emitting element to pass through a color filter, red light, green light, or blue light is obtained.

CITATION LIST

Patent Document

Patent Document 1: Japanese Patent Application Laid-Open No. 2006-278257

SUMMARY OF THE INVENTION

Problems to be Solved by the Invention

However, in the white method, white light emitted from a light emitting element is color-separated by a color filter. Therefore, light absorption (loss) in the color filter is large, and luminous efficiency is ⅓ or less of the luminous efficiency of the RGB color-separating method disadvantageously. For this disadvantage, a reflective film is formed on a light emitting element, and a microcavity (resonator structure) is formed between a transparent electrode and the reflective film disposed in the light emitting element. In addition, for example, from Japanese Patent Application Laid-Open No. 2006-278257, technology is known in which in a light emitting element having three layers of a red light emitting layer, a green light emitting layer, and a blue light emitting layer, a red light emitting element that selectively emits red light is disposed by optimizing a microcavity for red light emission. Similarly, a green light emitting element that selectively emits green light is disposed by optimizing a microcavity for green light emission, and a blue light emitting element that selectively emits blue light is disposed by optimizing a microcavity for blue light emission However, in this technology, although light extraction efficiency is improved, luminous efficiency and color purity are lower than those in the RGB color-separating method.

Therefore, an object of the present disclosure is to provide a light emitting element unit having a configuration and a structure capable of achieving high luminous efficiency and color purity.

Solutions to Problems

A light emitting element unit according to a first aspect of the present disclosure for achieving the object described above includes three light emitting elements, in which a first light emitting element is obtained by laminating a 1a-th electrode, a first organic layer including a first light emitting layer, a 2a-th electrode, a second organic layer including a second light emitting layer, and a third organic layer including a third light emitting layer, a second light emitting element is obtained by laminating the first organic layer, a 1b-th electrode, the second organic layer, a 2b-th electrode, and the third organic layer, and a third light emitting element is obtained by laminating the first organic layer, the second organic layer, a 1c-th electrode, the third organic layer, and a 2c-th electrode.

A light emitting element unit according to a second aspect of the present disclosure for achieving the object described above includes three light emitting elements, in which a first light emitting element and a second light emitting element are juxtaposed, the first light emitting element includes a 1a-th electrode, a first organic layer including a first light emitting layer, and a 2a-th electrode, and the second light emitting element includes a 1b-th electrode, the first organic layer, and a 2b-th electrode, a third light emitting element is obtained by laminating the first organic layer, a 1c-th electrode, a third organic layer including a third light emitting layer, and a 2c-th electrode, a first color filter is disposed on a light emission side of the first light emitting element, and a second color filter is disposed on a light emission side of the second light emitting element.

A light emitting element unit according to a third aspect of the present disclosure for achieving the object described above includes three light emitting elements, in which a first light emitting element is obtained by laminating a 1a-th electrode, a first organic layer including a first light emitting layer, and a 2a-th electrode, a second light emitting element is obtained by laminating the first organic layer, a 1b-th electrode, a second organic layer including a second light emitting layer, and a 2b-th electrode, and a third light emitting element is obtained by laminating the first organic layer, the second organic layer, a 1c-th electrode, a third organic layer including a third light emitting layer, and a 2c-th electrode.

A light emitting element unit according to a fourth aspect of the present disclosure for achieving the object described above includes a plurality of light emitting elements having a laminated structure obtained by laminating a plurality of organic layers each including a light emitting layer, in which each of the light emitting elements includes a first electrode, any one of the plurality of organic layers, and a second electrode, and the first electrodes constituting the respective light emitting elements do not overlap with each other between the light emitting elements.

BRIEF DESCRIPTION OF DRAWINGS

FIG. 27A illustrates a front view of the digital still camera, and FIG. 27B illustrates a rear view thereof.

MODE FOR CARRYING OUT THE INVENTION

Figure 1A:
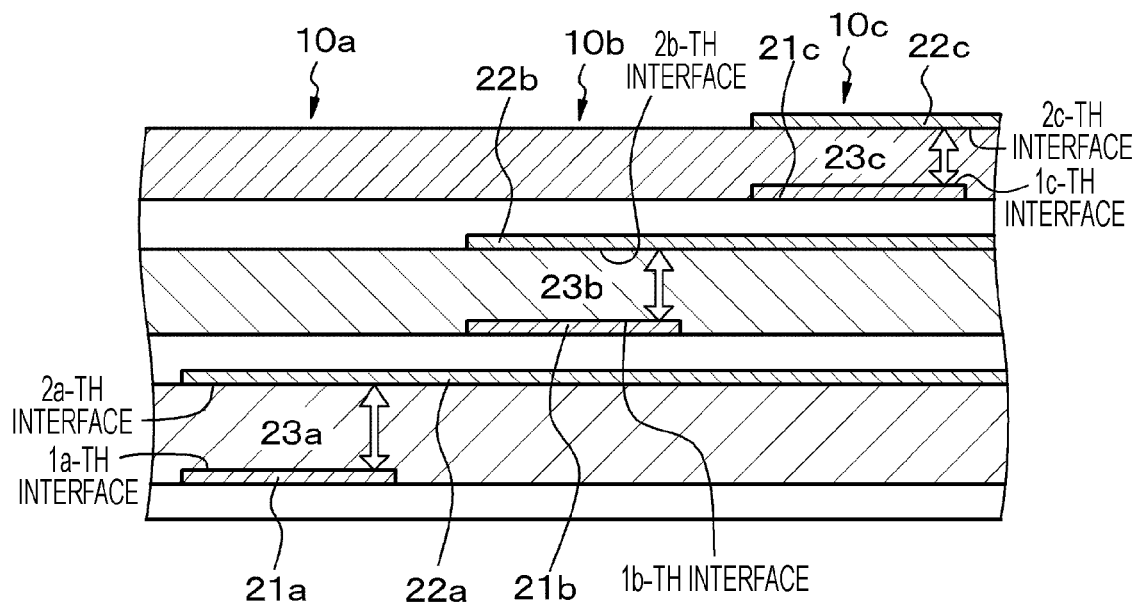
FIGS. 1A and 1B are conceptual diagrams of a light emitting element unit of Example 1.

Hereinafter, the present disclosure will be described on the basis of Examples with reference to the drawings. However, the present disclosure is not limited to Examples, and various numerical values and materials in Examples are illustrative. Note that description will be made in the following order.

1. General description of light emitting element units according to first to fourth aspects of the present disclosure
2. Example 1 (light emitting element units according to first and fourth aspects of the present disclosure)
3. Example 2 (light emitting element units according to second and fourth aspects of the present disclosure)
4. Example 3 (light emitting element units according to third and fourth aspects of the present disclosure)
5. Others

General Description of Light Emitting Element Units According to First to Fourth Aspects of the Present Disclosure A light emitting element unit according to a first aspect of the present disclosure can adopt a form in which a 2a-th electrode, a 2b-th electrode, and a 2c-th electrode are each constituted by a common second electrode.

The light emitting element unit according to the first aspect of the present disclosure including the preferable form described above can adopt a form in which the same potential is applied to the 2a-th electrode, the 2b-th electrode, and the 2c-th electrode.

The light emitting element unit according to the first aspect of the present disclosure including the various preferable forms described above can adopt, for example, a form in which the 2a-th electrode, the 2b-th electrode, and the 2c-th electrode each have a laminated structure of a transparent conductive layer and a semi-transmissive conductive layer. Note that the transparent conductive layer may be used as an upper layer (that is, may be located on a second substrate side), and the semi-transmissive conductive layer may be used as a lower layer (that is, may be located on a first substrate side). Alternatively, the transparent conductive layer may be used as a lower layer, and the semi-transmissive conductive layer may be used as an upper layer. In addition, in this case, for example, a form can be adopted in which the transparent conductive layer contains an oxide of indium and zinc (IZO), and the semi-transmissive conductive layer contains an alloy of magnesium (Mg) and silver (Ag). Moreover, the semi-transmissive conductive layer may have a laminated structure. In this case, the upper layer (layer located on a second substrate side) can contain an alloy of magnesium (Mg) and silver (Ag), and the lower layer (layer located on a first substrate side) can contain calcium (Ca). The same applies to 2a-th electrode, a 2b-th electrode, and a 2c-th electrode in a light emitting element unit according to a third aspect of the present disclosure, and a second electrode in a light emitting element unit according to a fourth aspect of the present disclosure. Furthermore, a 2a-th electrode and a 2b-th electrode in a light emitting element unit according to a second aspect of the present disclosure may have a laminated structure of a transparent conductive layer and a semi-transmissive conductive layer in a similar manner to the above-described case. In some cases, moreover, the semi-transmissive conductive layer may have a laminated structure. Furthermore, a 2c-th electrode may be a semi-transmissive conductive layer, specifically, a semi-transmissive conductive layer containing magnesium (Mg) and silver (Ag). That is, in the light emitting element unit according to the second aspect of the present disclosure, a material of the second electrode constituting a light emitting element may be changed depending on the light emitting element, and structures of the 2a-th electrode and the 2b-th electrode may be different from a structure of the 2c-th electrode.

Moreover, the light emitting element unit according to the first aspect of the present disclosure including the various preferable forms described above can adopt a form in which in the first light emitting element, between a 1a-th interface constituted by an interface between the 1a-th electrode and the first organic layer or a first light reflecting layer, and a 2a-th interface constituted by an interface between the 2a-th electrode and the first organic layer, light emitted in the first light emitting layer is resonated, and a part of the resonated light is emitted from the 2a-th electrode, in the second light emitting element, between a 1b-th interface constituted by an interface between the 1b-th electrode and the second organic layer or a second light reflecting layer, and a 2b-th interface constituted by an interface between the 2b-th electrode and the second organic layer, light emitted in the second light emitting layer is resonated, and a part of the resonated light is emitted from the 2b-th electrode, and in the third light emitting element, between a 1c-th interface constituted by an interface between the 1c-th electrode and the third organic layer or a third light reflecting layer, and a 2c-th interface constituted by an interface between the 2c-th electrode and the third organic layer, light emitted in the third light emitting layer is resonated, and a part of the resonated light is emitted from the 2c-th electrode. That is, each of the light emitting elements preferably has a resonator structure.

The same applies to the third light emitting element in the light emitting element unit according to the second aspect of the present disclosure or the light emitting element unit according to the third aspect of the present disclosure. The light emitting element unit according to the fourth aspect of the present disclosure can adopt a form in which between a first interface constituted by an interface between a first electrode and an organic layer or a light reflecting layer, and a second interface constituted by an interface between a second electrode and the organic layer, light emitted in a light emitting layer is resonated, and a part of the resonated light is emitted from the second electrode.

In addition, in this case, specifically, a form can be adopted in which when a distance from a maximum emission position of the first light emitting layer to the 1a-th interface is represented by $L_{1A}$, an optical distance thereof is represented by $OL_{1A}$, a distance from the maximum emission position of the first light emitting layer to the 2a-th interface is represented by $L_{2A}$, an optical distance thereof is represented by $OL_{2A}$, and $m_{1A}$ and $m_{2A}$ represent integers, the following formulas (A-1), (A-2), (A-3), and (A-4) are satisfied, when a distance from a maximum emission position of the second light emitting layer to the 1b-th interface is represented by $L_{1B}$, an optical distance thereof is represented by $OL_{1B}$, a distance from the maximum emission position of the second light emitting layer to the 2b-th interface is represented by $L_{2B}$, an optical distance thereof is represented by $OL_{2B}$, and $m_{1B}$ and $m_{2B}$ represent integers, the following formulas (B-1), (B-2), (B-3), and (B-4) are satisfied, and when a distance from a maximum emission position of the third light emitting layer to the 1c-th interface is represented by $L_{1C}$, an optical distance thereof is represented by $OL_{1C}$, a distance from the maximum emission position of the third light emitting layer to the 2c-th interface is represented by $L_{2C}$, an optical distance thereof is represented by $OL_{2C}$, and $m_{1C}$ and $m_{2C}$ represent integers, the following formulas (C-1), (C-2), (C-3), and (C-4) are satisfied.

$$0.7\{-\Phi_{1A}/(2\pi)+m_{1A}\} \leq 2\times OL_{1A}/\lambda_A \leq 1.2\{-\Phi_{1A}/(2\pi)+m_{1A}\} \quad (A\text{-}1)$$

$$0.7\{-\Phi_{2A}/(2\pi)+m_{2A}\} \leq 2\times OL_{2A}/\lambda_A \leq 1.2\{-\Phi_{2A}/(2\pi)+m_{2A}\} \quad (A\text{-}2)$$

$$L_{1A} < L_{2A} \quad (A\text{-}3)$$

$$m_{1A} < m_{2A} \quad (A\text{-}4)$$

$$0.7\{-\Phi_{1B}/(2\pi)+m_{1B}\} \leq 2\times OL_{1B}/\lambda_B \leq 1.2\{-\Phi_{1B}/(2\pi)+m_{1B}\} \quad (B\text{-}1)$$

$$0.7\{-\Phi_{2B}/(2\pi)+m_{2B}\} \leq 2\times OL_{2B}/\lambda_B \leq 1.2\{-\Phi_{2B}/(2\pi)+m_{2B}\} \quad (B\text{-}2)$$

$$L_{1B} < L_{2B} \quad (B\text{-}3)$$

$$m_{1B} < m_{2B} \quad (B\text{-}4)$$

$$0.7\{-\Phi_{1C}/(2\pi)+m_{1C}\} \leq 2\times OL_{1C}/\lambda_C \leq 1.2\{-\Phi_{1C}/(2\pi)+m_{1C}\} \quad (C\text{-}1)$$

$$0.7\{-\Phi_{2C}/(2\pi)+m_{2C}\} \leq 2\times OL_{2C}/\lambda_C \leq 1.2\{-\Phi_{2C}/(2\pi)+m_{2C}\} \quad (C\text{-}2)$$

$$L_{1C} < L_{2C} \quad (C\text{-}3)$$

$$m_{1C} < m_{2C} \quad (C\text{-}4)$$

Here, $\lambda_A$: maximum peak wavelength of a spectrum of light generated in the first light emitting layer (or a desired wavelength of light generated in the first light emitting layer)

$\Phi_{1A}$: phase shift amount of light reflected by the 1a-th interface (unit: radian)

Provided that $-2\pi < \Phi_{1A} \leq 0$ is satisfied.

$\Phi_{2A}$: phase shift amount of light reflected by the 2a-th interface (unit: radian)

Provided that $-2\pi < \Phi_{2A} \leq 0$ is satisfied.

$\lambda_B$: maximum peak wavelength of spectrum of light generated in the second light emitting layer (or a desired wavelength of light generated in the second light emitting layer)

$\Phi_{1B}$: phase shift amount of light reflected by the 1b-th interface (unit: radian)

Provided that $-2\pi < \Phi_{1B} \leq 0$ is satisfied.

$\Phi_{2B}$: phase shift amount of light reflected by the 2b-th interface (unit: radian)

Provided that $-2\pi < \Phi_{2B} \leq 0$ is satisfied.

$\lambda_C$: maximum peak wavelength of a spectrum of light generated in the third light emitting layer (or a desired wavelength of light generated in the third light emitting layer)

$\Phi_{1C}$: phase shift amount of light reflected by the 1c-th interface (unit: radian)

Provided that $-2\pi < \Phi_{1C} \leq 0$ is satisfied.

$\Phi_{2C}$: phase shift amount of light reflected by the 2c-th interface (unit: radian)

Provided that $-2\pi < \Phi_{2C} \leq 0$ is satisfied.

Moreover, in this case, $m_{1A}=0$, $m_{2A}=1$, $m_{1B}=0$, $m_{2B}=1$, $m_{1C}=0$, and $m_{2C}=1$ are preferably satisfied.

In general, at a reflection interface constituted by layers $\alpha$ and $\beta$ each containing a transparent material, a part of incident light passes through the reflection interface, and the rest is reflected by the reflection interface. Therefore, a phase change (phase shift) occurs in the reflected light. A phase change $\varphi_{AB}$ of light when light is reflected by the reflection interface constituted by the layers $\alpha$ and $\beta$ can be determined by measuring a complex refractive index $(n_A, k_A)$ of the layer $\alpha$ and a complex refractive index $(n_B, k_B)$ of the layer $\beta$, and performing a calculation on the basis of these values (see, for example, Principles of Optics, Max Born and Emil Wolf, 1974 (PERGAMON PRESS)). A refractive index of a light emitting layer or an organic layer can be measured using a spectroscopic ellipsometry measuring device.

The distance $L_1$ from the maximum emission position of the light emitting layer to the first interface means an actual distance (physical distance) from the maximum emission position of the light emitting layer to the first interface, and the distance $L_2$ from the maximum emission position of the light emitting layer to the second interface means an actual distance (physical distance) from the maximum emission position of the light emitting layer to the second interface. Furthermore, the optical distance is also called an optical path length, and generally means n×L when a light ray passes through a medium having a refractive index n for a distance L. The same applies to the following description. Therefore, if an average refractive index is represented by $n_{ave}$, the following relations are satisfied.

$$OL_1 = L_1 \times n_{ave}$$

$$OL_2 = L_2 \times n_{ave}$$

Here, the average refractive index $n_{ave}$ is obtained by summing up a product of the refractive index and the thickness of each layer constituting an organic layer (or an organic layer and an interlayer insulating layer), and dividing the resulting sum by the thickness of the organic layer (or the organic layer and the interlayer insulating layer).

The light emitting element unit according to the second aspect of the present disclosure can adopt a form in which the same potential is applied to the 2a-th electrode and the 2b-th electrode, and moreover, can adopt a form in which the same potential is applied to the 2a-th electrode, the 2b-th electrode, and the 2c-th electrode.

In the first light emitting element and the second light emitting element in the light emitting element unit according to the second aspect of the present disclosure, the third organic layer may be formed on (or above) the 2a-th electrode and the 2b-th electrode.

In the first light emitting element in the light emitting element unit according to the third aspect of the present disclosure, the second organic layer may be formed on (or above) the 2a-th electrode.

The light emitting element units according to the first to fourth aspects of the present disclosure including the various preferable forms described above may be collectively referred to as "light emitting element unit and the like of the present disclosure". The light emitting element constituting the light emitting element unit and the like of the present disclosure may be referred to as "light emitting element and the like of the present disclosure" for convenience.

In the light emitting element unit and the like of the present disclosure, in a form in which one pixel (or sub-pixel) is constituted by one light emitting element, examples of arrangement of pixels (or sub-pixels) include stripe arrangement, diagonal arrangement, delta arrangement, and rectangle arrangement although not being limited thereto. Furthermore, in a form in which one pixel (or sub-pixel) is constituted by assembly of a plurality of light emitting elements, examples of arrangement of pixels (or sub-pixels) include stripe arrangement although not being limited thereto.

A red organic EL light emitting element has, for example, a structure obtained by sequentially laminating a hole injection layer, a hole transport layer, a red light emitting layer, and an electron transport layer from a first electrode side. In the red light emitting layer, by applying an electric field thereto, some of holes injected from the first electrode through the hole injection layer and the hole transport layer are recombined with some of electrons injected from the second electrode through the electron transport layer to generate red light. The red light emitting layer contains at least one of a red light emitting material, a hole transport material, an electron transport material, or a both charge transport material, for example. The red light emitting material may be a fluorescent material or a phosphorescent material. For example, the red light emitting layer generates red light utilizing an organic EL phenomenon, and is formed, for example, by mixing 30% by mass of 2,6-bis[(4'-methoxydiphenylamino) styryl]-1,5-dicyanonaphthalene (BSN) with 4,4-bis(2,2-diphenylvinin) biphenyl (DPVBi).

A green organic EL light emitting element has, for example, a structure obtained by sequentially laminating a hole injection layer, a hole transport layer, a green light emitting layer, and an electron transport layer from a first electrode side. In the green light emitting layer, by applying an electric field thereto, some of holes injected from the first electrode through the hole injection layer, the hole transport layer, and an emission separation layer are recombined with some of electrons injected from the second electrode through the electron transport layer to generate green light. The green light emitting layer contains at least one of a green light emitting material, a hole transport material, an electron transport material, or a both charge transport material, for example. The green light emitting material may be a fluorescent material or a phosphorescent material. For example, the green light emitting layer generates green light utilizing an organic EL phenomenon, and is formed, for example, by mixing 5% by mass of coumarin 6 with DPVBi.

A blue organic EL light emitting element has, for example, a structure obtained by sequentially laminating a hole injection layer, a hole transport layer, a blue light emitting layer, and an electron transport layer from a first electrode side. In the blue light emitting layer, by applying an electric field thereto, some of holes injected from the first electrode through the hole injection layer, the hole transport layer, and an emission separation layer are recombined with some of electrons injected from the second electrode through the electron transport layer to generate blue light. The blue light emitting layer contains at least one of a blue light emitting material, a hole transport material, an electron transport material, or a both charge transport material, for example. The blue light emitting layer may be a fluorescent material or a phosphorescent material. For example, the blue light emitting layer generates blue light utilizing an organic EL phenomenon, and is formed, for example, by mixing 2.5% by mass of 4,4'-bis[2-{4-(N,N-diphenylamino) phenyl} vinyl] biphenyl (DPAVBi) with DPVBi.

The hole injection layer injects holes into the hole transport layer, and contains, for example, a hexaazatriphenylene (HAT) derivative. The hole transport layer transports the holes injected from the hole injection layer to the light emitting layer, and contains, for example, 4,4',4"-tris(3-methylphenylphenylamino) triphenylamine (m-MTDATA) or α-naphthylphenyl diamine (αNPD).

The electron transport layer transports electrons to the light emitting layer, and contains, for example, 8-hydroxyquinoline aluminum (Alq3), BCP (2,9-dimethyl-4,7-diphenyl-1,10-phenanthroline), and butophenanthroline (BPhen). The electron transport layer includes at least one layer and may include an electron transport layer doped with an alkali metal or an alkaline earth metal. In the electron transport layer doped with an alkali metal or an alkaline earth metal, examples of a host material include BCP (2,9-dimethyl-4,7-diphenyl-1,10-phenanthroline), Alq3, and butophenanthroline (BPhen), and examples of a dopant material include an alkali metal such as lithium (Li), sodium (Na), potassium (K), rubidium (Rb), or cesium (Cs), and an alkaline earth metal such as magnesium (Mg), calcium (Ca), strontium (Sr), or barium (Ba). In addition, by co-depositing the host material and the dopant material, for example, an electron transport layer doped with 0.5% by mass to 15% by mass of the dopant material can be obtained.

An electron injection layer may be disposed between the electron transport layer and the second electrode. The electron injection layer is disposed in order to enhance injection of electrons from a cathode electrode and contains, for example, lithium fluoride (LiF).

However, the materials constituting the layers are illustrative, and are not limited to these materials. Furthermore, for example, the light emitting layer may be constituted by a blue light emitting layer and a yellow light emitting layer, or may be constituted by a blue light emitting layer and an orange light emitting layer. The thickness of the hole injection layer may be 1 nm to 20 nm, the thickness of the hole transport layer may be 10 nm to 200 nm, the thickness of the light emitting layer may be 5 nm to 50 nm, and the thickness of the electron transport layer may be 10 nm to 200 nm.

In the light emitting element unit according to the first aspect or the third aspect of the present disclosure, the first light emitting element can be constituted by a red light emitting element (red organic EL light emitting element), the second light emitting element can be constituted by a green light emitting element. (green organic EL light emitting element), and the third light emitting element can be constituted by a blue light emitting element (blue organic EL light emitting element). In the light emitting element unit according to the second aspect of the present disclosure, the first light emitting element and the second light emitting element can be each constituted by a yellow light emitting element (yellow organic EL light emitting element), or can be constituted by an orange light emitting element (orange organic EL light emitting element). In addition, in this case, the first color filter is only required to be a filter that selectively transmits red color, and the second color filter is only required to be a filter that selectively transmits green color. Furthermore, the third light emitting element is only required to be constituted by a blue light emitting element (blue organic EL light emitting element).

In a case where the first electrode is caused to function as an anode electrode in the light emitting element and the like of the present disclosure, examples of a material constituting the first electrode (light reflecting material) include a metal having high work function, such as platinum (Pt), gold (Au), silver (Ag), chromium (Cr), tungsten (W), nickel (Ni), copper (Cu), iron (Fe), cobalt (Co), or tantalum (Ta), and an alloy thereof (for example, an Ag—Pd—Cu alloy containing silver as a main component and containing 0.3% by mass to 1% by mass of palladium (Pd) and 0.3% by mass to 1% by mass of copper (Cu) or an Al—Nd alloy). Moreover, in a case of using a conductive material having a small work function value and high light reflectivity, such as aluminum (Al) or an alloy containing aluminum, by improving a hole injection property, for example, by disposing an appropriate hole injection layer, the first electrode can be used as an anode electrode. The thickness of the first electrode may be 0.1 μm to 1 μm, for example. Alternatively, the first electrode may have a structure obtained by laminating a transparent conductive material having excellent hole injection characteristics, such as an oxide of indium and tin (ITO) or an oxide of indium and zinc (IZO) on a dielectric multilayer film or a reflective film having high light reflectivity, including aluminum (Al) and the like. Meanwhile, in a case where the first electrode is caused to function as a cathode electrode, the first electrode is desirably constituted by a conductive material having a small work function value and high light reflectivity. However, by improving an electron injection property, for example, by disposing an appropriate electron injection layer in a conductive material having high light reflectivity used as an anode electrode, the first electrode can also be used as a cathode electrode.

Meanwhile, in a case where the second electrode is caused to function as a cathode electrode, a material constituting the second electrode (a semi-light transmitting material or a light transmitting material) is desirably constituted by a conductive material having a small work function value so as to be able to transmit emitted light and inject electrons into the light emitting layer efficiently. Examples of the material constituting the second electrode include a metal having a small work function or an alloy thereof, such as aluminum (Al), silver (Ag), magnesium (Mg), calcium (Ca), sodium (Na), strontium (Sr), an alkali metal or an alkaline earth metal and silver (Ag) [for example, an alloy of magnesium (Mg) and silver (Ag) (Mg—Ag alloy)], an alloy of magnesium and calcium (Mg—Ca alloy), or an alloy of aluminum (Al) and lithium (Li) (Al—Li alloy). Among these materials, an Mg—Ag alloy is preferable, and a volume ratio between magnesium and silver may be Mg:Ag=2:1 to 30:1, for example. Alternatively, as a volume ratio between magnesium and calcium may be Mg:Ca=2:1 to 10:1, for example. In addition, the second electrode can have a laminated structure of layers constituted by these materials (lower layer: calcium (Ca), barium (Ba), lithium (Li), cesium (Cs), indium (In), magnesium (Mg), or silver (Ag)/upper layer: magnesium (Mg), silver (Ag), or an alloy thereof). The thickness of the second electrode may be 3 nm to 50 nm, preferably 4 nm to 20 nm, and more preferably 6 nm to 12 nm, for example. Alternatively, the second electrode can have a laminated structure constituted by, from the organic layer side, the material layer described above and a so-called transparent electrode (for example, thickness $3 \times 10^{-8}$ m to $1 \times 10^{-6}$ m) including, for example, ITO or IZO. In a case where the second electrode has a laminated structure, the thickness of the material layer described above can be reduced to 1 nm to 4 nm. Furthermore, the second electrode can be constituted only by a transparent electrode. Meanwhile, in a case where the second electrode is caused to function as an anode electrode, the second electrode is desirably constituted by a conductive material that transmits emitted light and has a large work function value.

Furthermore, a bus electrode (auxiliary electrode) containing a low resistance material such as aluminum, an aluminum alloy, silver, a silver alloy, copper, a copper alloy, gold, or a gold alloy may be disposed in the second electrode to reduce resistance as the whole second electrode.

Examples of a method for forming the first electrode or the second electrode include a combination of a vapor deposition method including an electron beam vapor deposition method, a hot filament vapor deposition method, and a vacuum vapor deposition method, a sputtering method, a chemical vapor deposition method (CVD method), an MOCVD method, and an ion plating method with an etching method; various printing methods such as a screen printing method, an inkjet printing method, and a metal mask printing method; a plating method (an electroplating method or an electroless plating method); a lift-off method; a laser ablation method; and a sol-gel method. According to the various printing methods and the plating method, the first electrode or the second electrode having a desired shape (pattern) can be formed directly. Note that, in a case where the first electrode or the second electrode is formed after the organic layer is formed, the first electrode or the second electrode is preferably formed particularly on the basis of a film formation method in which energy of film formation particles is small, such as a vacuum vapor deposition method, or a film formation method such as an MOCVD method from a viewpoint of preventing the organic layer from being damaged. When the organic layer is damaged, non-light emitting pixels (or non-light emitting sub-pixels) called "dark spots" due to generation of a leak current may be generated. Furthermore, processes from formation of the organic layer to formation of these electrodes are preferably performed without exposure thereof to the atmosphere from a viewpoint of preventing deterioration of the organic layer due to moisture in the atmosphere. The second electrode does not have to be patterned.

Examples of a material constituting the light reflecting layer include aluminum, an aluminum alloy (for example, Al—Nd or Al—Cu), an Al/Ti laminated structure, an Al—Cu/Ti laminated structure, chromium (Cr), silver (Ag), a silver alloy (for example, Ag—Pd—Cu or Ag—Sm—Cu), platinum (Pt), gold (Au), and tungsten (W). The light reflecting layer can be formed, for example, by a vapor deposition method including an electron beam vapor deposition method, a hot filament vapor deposition method, and a vacuum vapor deposition method, a sputtering method, a CVD method, an ion plating method; a plating method (an electroplating method or an electroless plating method); a lift-off method; a laser ablation method; a sol-gel method; and the like.

The organic layer includes, for example, the light emitting layer containing an organic light emitting material. Specifically, as described above, for example, the organic layer can be constituted by a laminated structure of a hole transport layer, a light emitting layer, and an electron transport layer, a laminated structure of a hole transport layer and a light emitting layer serving also as an electron transport layer, a laminated structure of a hole injection layer, a hole transport layer, a light emitting layer, an electron transport layer, and an electron injection layer, and the like. Examples of a method for forming the light emitting layer or the organic layer include a physical vapor deposition method (PVD method) such as a vacuum vapor deposition method; a printing method such as a screen printing method or an inkjet printing method; a laser transfer method in which an organic layer on a laser absorption layer is separated by irradiating a laminated structure of the laser absorption layer and the organic layer formed on a transfer substrate with a laser and the organic layer is transferred; and various coating methods. If desired, the light emitting layer or the organic layer may be formed on the entire surface without being patterned.

In the light emitting element unit and the like of the present disclosure, a plurality of light emitting elements is formed on a first substrate. Here, examples of the first substrate or a second substrate include a high strain point glass substrate, a soda glass ($Na_2O \cdot CaO \cdot SiO_2$) substrate, a borosilicate glass ($Na_2O \cdot B_2O_3 \cdot SiO_2$) substrate, a forsterite ($2MgO \cdot SiO_2$) substrate, a lead glass ($Na_2O \cdot PbO \cdot SiO_2$) substrate, an alkali-free glass, various glass substrates each having an insulating film formed on a surface thereof, a quartz substrate, a quartz substrate having an insulating film formed on a surface thereof, a silicon substrate having an insulating film formed on a surface thereof, and an organic polymer such as polymethyl methacrylate (PMMA), polyvinyl alcohol (PVA), polyvinyl phenol (PVP), polyether sulfone (PES), polyimide, polycarbonate, or polyethylene terephthalate (PET) (having a form of a polymer material such as a plastic film, a plastic sheet, or a plastic substrate constituted by a polymer material and having flexibility). Materials constituting the first substrate and the second substrate may be the same as or different from each other. However, in a case of a top emission type in which light is emitted through the second substrate, the second substrate is required to be transparent with respect to light emitted from a light emitting element. In a case of a bottom emission type in which light is emitted through the first substrate, the first substrate is required to be transparent with respect to light emitted from a light emitting element.

In the light emitting element unit according to the second aspect of the present disclosure, a color filter may be disposed on the second substrate side or the first substrate side. The color filter disposed on the first substrate side is also called an on-chip color filter (OCCF). The color filter is only required to be constituted by a known material. Specifically, the color filter is constituted by a resin to which a coloring agent containing a desired pigment or dye is added. By selecting a pigment or a dye, adjustment is performed such that light transmittance in a target color wavelength range is high, and light transmittance in another wavelength range is low. A light shielding layer may be disposed on the second substrate side or the first substrate side. Specific examples of a light shielding material constituting the light shielding layer include a material capable of shielding light, such as titanium (Ti), chromium (Cr), tungsten (W), tantalum (Ta), aluminum (Al), or $MoSi_2$. The light shielding layer can be formed by a vapor deposition method including an electron beam vapor deposition method, a hot filament vapor deposition method, and a vacuum vapor deposition method, a sputtering method, a CVD method, an ion plating method, and the like. A black matrix layer may be disposed on the second substrate side or the first substrate side. For example, the black matrix layer is constituted by a black resin film (specifically, for example, a black polyimide-based resin) having an optical density of 1 or more, mixed with a black coloring agent, or a thin film filter utilizing interference of a thin film. For example, the thin film filter is formed by laminating two or more thin films containing metal, metal nitride, or metal oxide, and attenuates light by utilizing interference of a thin film. Specific examples of the thin film filter include a thin film filter obtained by alternately laminating Cr and chromium(III) oxide ($Cr_2O_3$).

In the top emission type, the first electrode is disposed, for example, on an interlayer insulating layer, or is disposed above the interlayer insulating layer. An interlayer insulating layer is disposed between a first light emitting element and a second light emitting element and between the second light emitting element and a third light emitting element. A light emitting element driving unit formed on the first substrate is covered with an insulating layer, and an interlayer insulating layer is formed on the insulating layer.

The light emitting element driving unit is constituted by one or more thin film transistors (TFTs). The TFTs are electrically connected to the first electrode through a contact plug disposed in an interlayer insulating layer. A gate electrode can contain, for example, a metal such as aluminum (Al) or polysilicon. A gate insulating film is disposed on the entire surface of the first substrate so as to cover the gate electrode. The gate insulating film can contain, for example, silicon oxide ($SiO_2$) or silicon nitride (SiN). A semiconductor layer contains, for example, amorphous silicon, polycrystalline silicon, or an oxide semiconductor, and is only required to be formed on the gate insulating film. A source/drain region is constituted by a partial region of the semiconductor layer. A region of the semiconductor layer between the drain region and the source region and above the gate electrode corresponds to a channel forming region. Therefore, a bottom gate type thin film transistor is disposed on the first substrate. However, the light emitting element driving unit is not limited to the bottom gate type thin film transistor, and can be a top gate type thin film transistor.

Examples of a material constituting the interlayer insulating layer, the insulating layer, or the insulating film include a $SiO_X$-based material (material constituting a silicon-based oxide film) such as $SiO_2$, non-doped silicate glass (NSG), borophosphosilicate glass (BPSG), PSG, BSG, AsSG, SbSG, PbSG, spin on glass (SOG), low temperature oxide (LTO, low temperature CVD-$SiO_2$), low melting point glass, or glass paste; a SiN-based material including a SiON-based material; SiOC; SiOF; and SiCN. Alternatively, examples of the material include an inorganic insulating material such as titanium oxide ($TiO_2$), tantalum oxide ($Ta_2O_5$), aluminum oxide ($Al_2O_3$), magnesium oxide (MgO), chromium oxide ($CrO_x$), zirconium oxide ($ZrO_2$), niobium oxide ($Nb_2O_5$), tin oxide ($SnO_2$), or vanadium oxide ($VO_x$). Alternatively, examples of the material include various resins such as an epoxy-based resin, an acrylic resin, a polyimide-based resin, and a novolac-based resin; and a low dielectric constant insulating material such as SiOCH, organic SOG, or a fluorine-based resin (for example, a material having a dielectric constant k ($=\varepsilon/\varepsilon_0$) of 3.5 or less, for example, and specific examples thereof include fluorocarbon, cycloperfluorocarbon polymer, benzocyclobutene, cyclic fluorine-based resin, polytetrafluoroethylene, amorphous tetrafluoroethylene, polyaryl ether, fluorinated aryl ether, fluorinated polyimide, amorphous carbon, parylene (polyparaxylylene), and fluorinated fullerene). Examples of the material further include Silk (trademark of The Dow Chemical Co., coating type low dielectric constant interlayer insulating film material) and Flare (trademark of Honeywell Electronic Materials Co., polyallyl ether (PAE)-based material). In addition, these materials can be used singly or in appropriate combination thereof. In some cases, the interlayer insulating layer, the insulating layer, or the insulating film can be formed on the basis of a known method such as various CVD methods, various coating methods, various PVD methods including a sputtering method and a vacuum vapor deposition method, various printing methods such as a screen printing method, a plating method, an electrodeposition method, an immersion method, or a sol-gel method. In a bottom emission type having a configuration and a structure in which light emitted from a light emitting element passes through an interlayer insulating layer, the interlayer insulating layer needs to contain a material transparent to the light emitted from the light emitting element, and the light emitting element driving unit needs to be formed so as not to block the light emitted from the light emitting element. In the bottom emission type, it is also possible to dispose the light emitting element driving unit above the first electrode.

An insulating or conductive protective film is preferably disposed above the organic layer in order to prevent moisture from reaching the organic layer. The protective film is preferably formed particularly on the basis of a film formation method in which the energy of film formation particles is small, such as a vacuum vapor deposition method, or a film formation method such as a CVD method or an MOCVD method because an influence on a base can be reduced. Alternatively, in order to prevent reduction in brightness due to deterioration of the organic layer, a film formation temperature is desirably set to room temperature. Moreover, in order to prevent peeling of the protective film, the protective film is desirably formed under a condition minimizing a stress of the protective film. Furthermore, the protective film is preferably formed without exposure of an already formed electrode to the atmosphere. As a result, deterioration of the organic layer due to moisture or oxygen in the atmosphere can be prevented. Moreover, in a case of the top emission type, the protective film is desirably constituted by a material that transmits light generated in the organic layer by, for example, 80% or more. Specific examples of the material include an inorganic amorphous insulating material such as the following materials. Such an inorganic amorphous insulating material does not generate grains, and therefore has low water permeability and constitutes a good protective film. Specifically, as a material constituting the protective film, a material that is transparent to light emitted from the light emitting layer, is dense, and does not transmit moisture is preferably used. More specific examples of the material include amorphous silicon ($\alpha$-Si), amorphous silicon carbide ($\alpha$-SiC), amorphous silicon nitride ($\alpha$-$Si_{1-x}N_x$), amorphous silicon oxide ($\alpha$-$Si_{1-y}O_y$), amorphous carbon ($\alpha$-C), amorphous silicon oxide/nitride ($\alpha$-SiON), $Al_2O_3$, and $TiO_2$. The thickness of the protective film may be, for example, 1 µm to 8 µm, but is not limited to these values. Note that in a case where the protective film is constituted by a conductive material, the protective film is only required to be constituted by a transparent conductive material such as ITO or IZO.

The first substrate and the second substrate can be bonded (sealed) to each other with an adhesive layer (sealing layer). Examples of a material constituting the adhesive layer (sealing layer) include a thermosetting adhesive such as an acrylic adhesive, an epoxy-based adhesive, a urethane-based adhesive, a silicone-based adhesive, or a cyanoacrylate-based adhesive, and an ultraviolet curable adhesive. Note that even the bottom emission type organic EL display device can adopt a form in which the second substrate is disposed above the second electrode, and the protective film and the adhesive layer described above are formed from the first electrode side between the first electrode and the second substrate.

In a case where a display device is constituted by the light emitting element unit and the like of the present disclosure, examples of the display device include an organic electroluminescence display device (abbreviated as an organic EL display device). When the organic EL display device is used as a color display organic EL display device, each of organic EL elements constituting the organic EL display device constitutes a subpixel as described above. Here, one pixel is constituted by three types of subpixels, for example, a red light emitting subpixel that emits red light, a green light emitting subpixel that emits green light, and a blue light emitting subpixel that emits blue light. Therefore, in this case, in a case where the number of organic EL elements constituting the organic EL display device is N×M, the number of pixels is (N×M)/3. On an outermost surface (specifically, an outer surface of the second substrate) that emits light in the display device, an ultraviolet absorbing layer, a contamination preventing layer, a hard coat layer, and an antistatic layer may be formed, or a protective member (for example, cover glass) may be disposed. The organic EL display device can be used, for example, as a monitor device constituting a personal computer, or a monitor device incorporated in a television receiver, a mobile phone, a personal digital assistant (PDA), or a game machine. Alternatively, the organic EL display device can be applied to an electronic view finder (EVF) or a head mounted display (HMD). Alternatively, the organic EL display device can constitute an image display device in electronic paper such as an electronic book or electronic newspaper, a bulletin board such as a signboard, a poster, or a blackboard, rewritable paper substituted for printer paper, a display unit of a home appliance, a card display unit of a point card and the like, an electronic advertisement, or an electronic POP. Furthermore, a lighting device can be constituted by the light emitting element unit and the like of the present disclosure, and examples of the lighting device include various lighting devices including a backlight device for a liquid crystal display device and a planar light source device. The head mounted display includes: for example, (a) a frame mounted on the head of an observer; and
(b) an image display device attached to the frame.

The image display device includes:
(A) the display device in the present disclosure; and
(B) an optical device on which light emitted from the display device in the present disclosure is incident and from which the light is emitted.

The optical device includes:
(B-1) a light guide plate in which light incident on the light guide plate from the display device in the present disclosure is propagated by total reflection and then the light is emitted from the light guide plate toward an observer;
(B-2) a first deflecting means (for example, including a volume hologram diffraction grating film) that deflects light incident on the light guide plate such that the light incident on the light guide plate is totally reflected in the light guide plate; and
(B-3) a second deflecting means (for example, including a volume hologram diffraction grating film) that deflects light propagated in the light guide plate by total reflection a plurality of times in order to emit the light propagated in the light guide plate by total reflection from the light guide plate.

Example 1

Figure 1B:
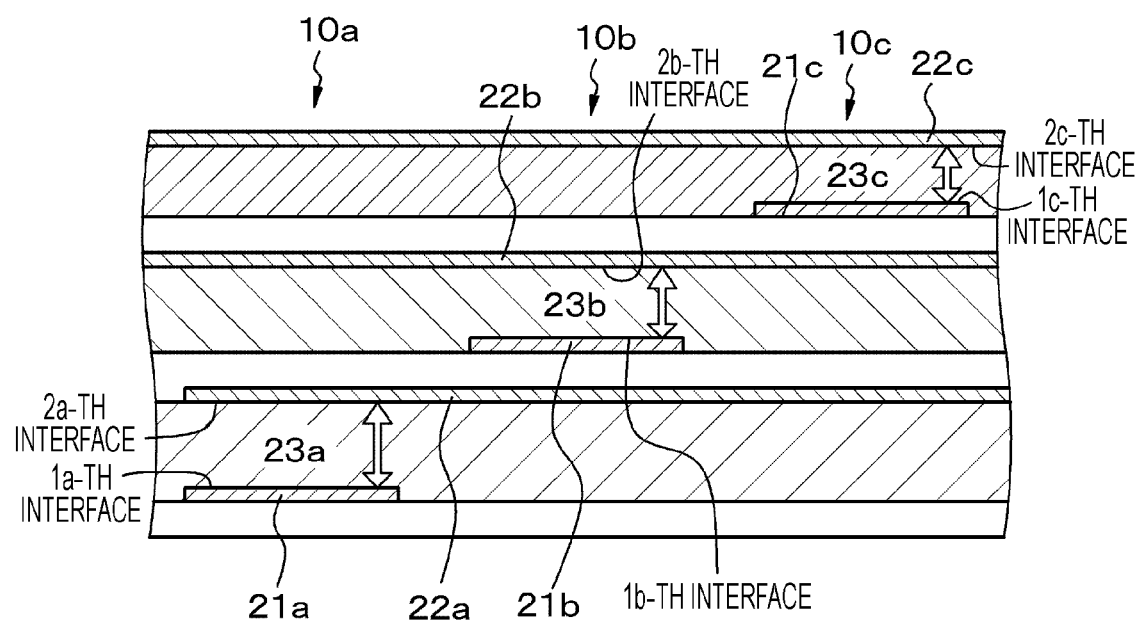
Figure 8:
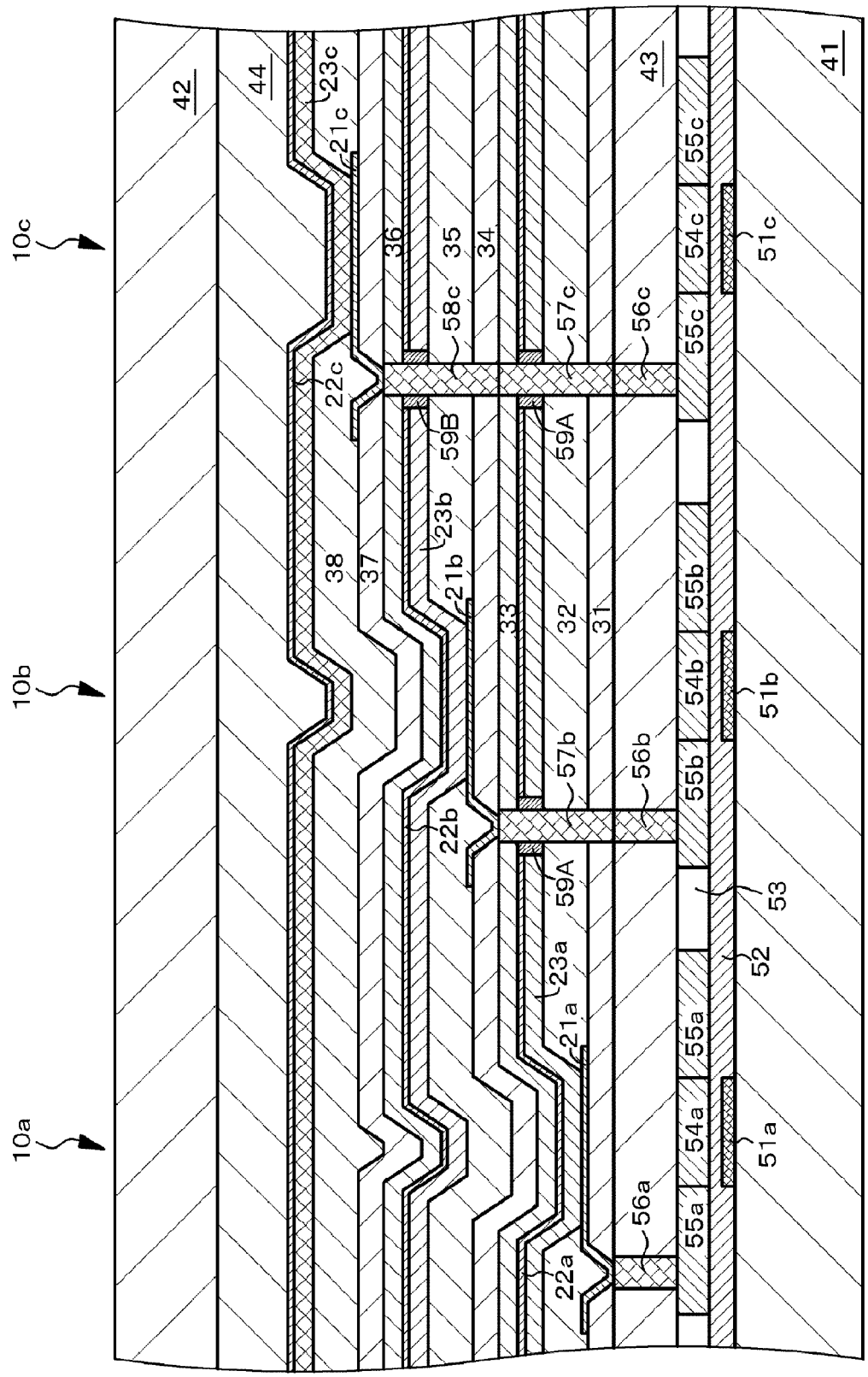
FIG. 8 is a schematic partial cross-sectional view of the light emitting element unit of Example 1.
Figure 10A:
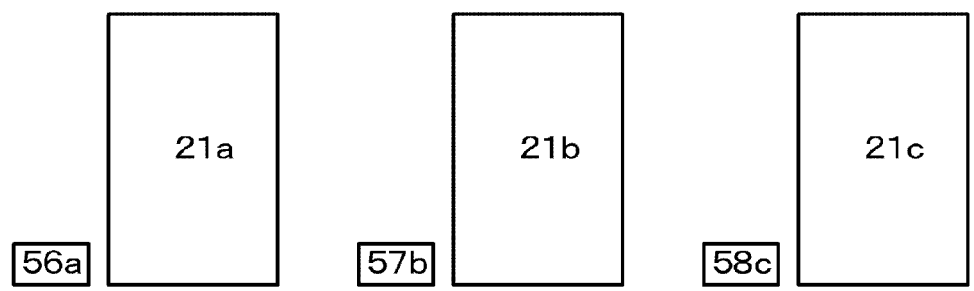
FIGS. 10A to 10D are diagrams for explaining an arrangement state of a first electrode and a contact hole portion in the light emitting element unit of Example 1.

Example 1 relates to the light emitting element unit according to the first and fourth aspects of the present disclosure. FIG. 1B illustrates a conceptual diagram of the light emitting element unit of Example 1. FIG. 8 illustrates a schematic partial cross-sectional view of the light emitting element unit of Example 1. FIG. 10A illustrates a schematic plan view of the first electrode and the like in the light emitting element unit of Example 1.

The light emitting element unit of Example 1 will be described in accordance with the light emitting element unit according to the first aspect of the present disclosure.

The light emitting element unit of Example 1 includes three light emitting elements 10 (10a, 10b, 10c).

The first light emitting element 10a is obtained by laminating a 1a-th electrode 21a, a first organic layer 23a including a first light emitting layer, a 2a-th electrode 22a, a second organic layer 23b including a second light emitting layer, and a third organic layer 23c including a third light emitting layer.

The second light emitting element 10b is obtained by laminating the first organic layer 23a, a 1b-th electrode 21b, the second organic layer 23b, a 2b-th electrode 22b, and the third organic layer 23c.

The third light emitting element 10c is obtained by laminating the first organic layer 23a, the second organic layer 23b, a 1c-th electrode 21c, the third organic layer 23c, and a 2c-th electrode 22c.

Furthermore, the light emitting element unit of Example 1 will be described in accordance with the light emitting element unit according to the fourth aspect of the present disclosure.

The light emitting element unit of Example 1 includes a plurality of light emitting elements 10 (10a, 10b, 10c) having a laminated structure obtained by laminating a plurality of organic layers 23 (23a, 23b, 23c) each including a light emitting layer.

Each of the light emitting elements 10 (10a, 10b, 10c) includes a first electrode 21(21a, 21b, 21c), any one of the plurality of organic layers 23 (23a, 23b, 23c), and a second electrode 22(22a, 22b, 22c), and the first electrodes 21 (21a, 21b, 21c) constituting the respective light emitting elements 10 (10a, 10b, 10c) do not overlap with each other between the light emitting elements. That is, orthogonal projection images (orthogonal projection images on the first substrate) of the first electrodes 21 (21a, 21b, 21c) do not overlap with each other.

Note that, in the light emitting element unit of Example 1 or Example 3 described later, specifically, the first light emitting element 10a is constituted by a red light emitting element (red organic EL light emitting element), the second light emitting element 10b is constituted by a green light emitting element (green organic EL light emitting element), and the third light emitting element 10c is constituted by a blue light emitting element (blue organic EL light emitting element).

In addition, in the organic EL display device of Example 1 or Example 2 or 3 described later, such light emitting element units are arranged in a two-dimensional matrix.

Above a first substrate 41, the first electrode 21 (21*a*, 21*b*, 21*c*), the organic layer 23 (23*a*, 23*b*, 23*c*), and the second electrode 22 (22*a*, 22*b*, 22*c*) are laminated in this order. Light emitted from the light emitting layer is emitted to the outside via a second substrate 42. That is, the display device of Example 1 is a top emission type display device.

The organic EL display device of Example 1 or Example 2 or 3 described later is a high-definition display device applied to, for example, an electronic viewfinder (EVF) or a head mounted display (HMD). Alternatively, the organic EL display device of Example 1 or Example 2 or 3 described later is a large organic EL display device such as a television receiver. The number of pixels is, for example, 1920×1080. One of the light emitting elements 10 constitutes one sub-pixel, and the number of light emitting elements (specifically, organic EL elements) 10 is three times the number of pixels. The number of light emitting element units is equal to the number of pixels.

In Example 1 or Example 2 or 3 described later, the first electrode 21 (21*a*, 21*b*, 21*c*) is used as an anode electrode, and the second electrode 22 (22*a*, 22*b*, 22*c*) is used as a cathode electrode. The first electrode 21 contains a light reflecting material, specifically, an Al—Nd alloy. The second electrode 22 has a laminated structure of a transparent conductive layer and a semi-transmissive conductive layer. Specifically, the transparent conductive layer contains IZO, and the semi-transmissive conductive layer contains an alloy of magnesium (Mg) and silver (Ag). The semi-transmissive conductive layer may have a laminated structure. In this case, an upper layer (layer located on the second substrate side) can contain an alloy of magnesium (Mg) and silver (Ag), and a lower layer (layer located on the first substrate side) can contain calcium (Ca). Note that the second electrode 22 is illustrated as a single layer in the drawings. The first electrode 21 is formed on the basis of a combination of a vacuum vapor deposition method and an etching method. Furthermore, the second electrode 22 is formed particularly by a film formation method in which the energy of film formation particles is small, such as a vacuum vapor deposition method, and is not patterned (see the conceptual diagram of FIG. 1B), but may be partially patterned as FIG. 1A illustrates a conceptual diagram.

In Example 1 or Example 2 or 3 described later, the organic EL element driving unit for driving the first light emitting element 10*a* is constituted by a TFT, and the TFT includes a gate electrode 51*a*, a gate insulating film 52, a silicon layer (semiconductor layer) 53, a channel forming region 54*a* disposed in the silicon layer 53, and a source/drain region 55*a*. A portion of the silicon layer 53 located between the source/drain regions 55*a* and above the gate electrode 51*a* corresponds to the channel forming region 54*a*. The organic EL element driving unit for driving the second light emitting element 10*b* is also constituted by a TFT, and the TFT includes a gate electrode 51*b*, the gate insulating film 52, the silicon layer 53, a channel forming region 54*b* disposed in the silicon layer 53, and a source/drain region 55*b*. A portion of the silicon layer 53 located between the source/drain regions 55*b* and above the gate electrode 51*b* corresponds to the channel forming region 54*b*. The organic EL element driving unit for driving the third light emitting element 10*c* is also constituted by a TFT, and the TFT includes a gate electrode 51*c*, the gate insulating film 52, the silicon layer 53, a channel forming region 54*c* disposed in the silicon layer 53, and a source/drain region 55*c*. A portion of the silicon layer 53 located between the source/drain regions 55*c* and above the gate electrode 51*c* corresponds to the channel forming region 54*c*.

Note that the TFT is a bottom gate type in the illustrated example, but the TFT may be a top gate type. The gate electrode of the TFT is connected to a scanning circuit (not illustrated). In the drawings, one TFT is illustrated for one organic EL element driving unit. The organic EL element driving unit is covered with an insulating layer 43.

The 1a-th electrode 21*a* constituting the first light emitting element 10*a* is formed on an interlayer insulating layer 31 disposed on the insulating layer 43, and is connected to one of the source/drain regions 55*a* of the TFT for driving the first light emitting element 10*a* through a contact hole portion 56*a* formed in the insulating layer 43. An interlayer insulating layer 32 having an opening is formed so as to surround the 1a-th electrode 21*a*, and the first organic layer 23*a* including the first light emitting layer is formed from the 1a-th electrode 21*a* exposed at a bottom of the opening to the interlayer insulating layer 32 so as to cover the 1a-th electrode 21*a* and the interlayer insulating layer 32. Moreover, the 2a-th electrode 22*a* is formed on the first organic layer 23*a*. The first organic layer 23*a* and the 2a-th electrode 22*a* are so-called solid films that are not patterned. Note that the second organic layer 23*b* including the second light emitting layer and the third organic layer 23*c* including the third light emitting layer are laminated above the 2a-th electrode 22*a*. Furthermore, an interlayer insulating layer 33 is formed on the 2a-th electrode 22*a*.

The 1b-th electrode 21*b* constituting the second light emitting element 10*b* is formed on an interlayer insulating layer 34 disposed on the insulating layer 33, and is connected to one of the source/drain regions 55*b* of the TFT for driving the second light emitting element 10*b* through contact hole portions 56*b* and 57*b* formed in the insulating layer 43 and the interlayer insulating layers 31, 32, and 33. An insulating film 59A is formed on a part of an inner surface of each of the contact hole portions 57*b* and 57*c* such that the contact hole portions 57*b* and 57*c* are not short-circuited with the 2a-th electrode 22*a*. An interlayer insulating layer 35 having an opening is formed so as to surround the 1b-th electrode 21*b*, and the second organic layer 23*b* including the second light emitting layer is formed from the 1b-th electrode 21*b* exposed at a bottom of the opening to the interlayer insulating layer 35 so as to cover the 1b-th electrode 21*b* and the interlayer insulating layer 35. Moreover, the 2b-th electrode 22*b* is formed on the second organic layer 23*b*. The second organic layer 23*b* and the 2b-th electrode 22*b* are so-called solid films that are not patterned. Note that the third organic layer 23*c* including the third light emitting layer is laminated above the 2b-th electrode 22*b*. Furthermore, the first organic layer 23*a* including the first light emitting layer is located below the 1b-th electrode 21*b*. An interlayer insulating layer 36 is formed on the 2b-th electrode 22*b*.

The 1c-th electrode 21*c* constituting the third light emitting element 10*c* is formed on an interlayer insulating layer 37 disposed on the insulating layer 36, and is connected to one of the source/drain regions 55*c* of the TFT for driving the third light emitting element 10*c* through contact hole portions 56*c*, 57*c*, and 58*c* formed in the insulating layer 43 and the interlayer insulating layers 31, 32, 33, 34, 35, and 36. An insulating film 59B is formed on a part of an inner surface of the contact hole portion 58*c* such that the contact hole portion 58*c* is not short-circuited with the 2b-th electrode 22*b*. An interlayer insulating layer 38 having an opening is formed so as to surround the 1c-th electrode 21*c*, and the third organic layer 23*c* including the third light emitting layer is formed from the 1c-th electrode 21*c* exposed at a bottom of the opening to the interlayer insulating layer 38 so as to cover the 1c-th electrode 21c and the interlayer insulating layer 38. Moreover, the 2c-th electrode 22c is formed on the third organic layer 23c. The third organic layer 23c and the 2c-th electrode 22c are so-called solid films that are not patterned. The second organic layer 23b including the second light emitting layer and the first organic layer 23a including the first light emitting layer are located below the 1c-th electrode 21c.

In the light emitting element unit of Example 1, the 2a-th electrode 22a, the 2b-th electrode 22b, and the 2c-th electrode 22c are connected to each other, for example, in an outer peripheral region (not illustrated) of the organic EL display device, and the same potential is applied thereto although not being limited thereto.

In addition, in the light emitting element unit of Example 1 or 3, in the first light emitting element 10a, between a 1a-th interface constituted by an interface between the 1a-th electrode 21a and the first organic layer 23a or a first light reflecting layer 25a, and a 2a-th interface constituted by an interface between the 2a-th electrode 22a and the first organic layer 23a, light emitted in the first light emitting layer is resonated, and a part of the resonated light is emitted from the 2a-th electrode 22a, in the second light emitting element 10b, between a 1b-th interface constituted by an interface between the 1b-th electrode 21b and the second organic layer 23b or a second light reflecting layer 25b, and a 2b-th interface constituted by an interface between the 2b-th electrode 22b and the second organic layer 23b, light emitted in the second light emitting layer is resonated, and a part of the resonated light is emitted from the 2b-th electrode 22b, and in a third light emitting element 10c, between a 1c-th interface constituted by an interface between the 1c-th electrode 21c and the third organic layer 23c or a third light reflecting layer 25c, and a 2c-th interface constituted by an interface between the 2c-th electrode 22c and the third organic layer 23c, light emitted in the third light emitting layer is resonated, and a part of the resonated light is emitted from the 2c-th electrode 22c. Note that, in Example 2 described later, in the third light emitting element 10c, between a 1c-th interface constituted by an interface between the 1c-th electrode 21c and the third organic layer 23c or the third light reflecting layer 25c, and a 2c-th interface constituted by an interface between the 2c-th electrode 22c and the third organic layer 23c, light emitted in the third light emitting layer is resonated, and a part of the resonated light is emitted from the 2c-th electrode 22c. That is, each light emitting element has a resonator structure. In FIGS. 1A and 1B, and FIGS. 2B, 3A, 4C, 5A, and 7 described later, the resonator structure is indicated by a white arrow.

Specifically, when a distance from a maximum emission position of the first light emitting layer to the 1a-th interface is represented by $L_{1A}$, an optical distance thereof is represented by $OL_{1A}$, a distance from the maximum emission position of the first light emitting layer to the 2a-th interface is represented by $L_{2A}$, an optical distance thereof is represented by $OL_{2A}$, and $m_{1A}$ and $m_{2A}$ represent integers, the following formulas (A-1), (A-2), (A-3), and (A-4) are satisfied, when a distance from a maximum emission position of the second light emitting layer to the 1b-th interface is represented by $L_{1B}$, an optical distance thereof is represented by $OL_{1B}$, a distance from the maximum emission position of the second light emitting layer to the 2b-th interface is represented by $L_{2B}$, an optical distance thereof is represented by $OL_{2B}$, and $m_{1B}$ and $m_{2B}$ represent integers, the following formulas (B-1), (B-2), (B-3), and (B-4) are satisfied, and when a distance from a maximum emission position of the third light emitting layer to the 1c-th interface is represented by $L_{1C}$, an optical distance thereof is represented by $OL_{1C}$, a distance from the maximum emission position of the third light emitting layer to the 2c-th interface is represented by $L_{2C}$, an optical distance thereof is represented by $OL_{2C}$, and $m_{1C}$ and $m_{2C}$ represent integers, the following formulas (C-1), (C-2), (C-3), and (C-4) are satisfied.

$$0.7\{-\Phi_{1A}/(2\pi)+m_{1A}\} \le 2\times OL_{1A}/\lambda_A \le 1.2\{-\Phi_{1A}/(2\pi)+m_{1A}\} \tag{A-1}$$

$$0.7\{-\Phi_{2A}/(2\pi)+m_{2A}\} \le 2\times OL_{2A}/\lambda_A \le 1.2\{-\Phi_{2A}/(2\pi)+m_{2A}\} \tag{A-2}$$

$$L_{1A} < L_{2A} \tag{A-3}$$

$$m_{1A} < m_{2A} \tag{A-4}$$

$$0.7\{-\Phi_{1B}/(2\pi)+m_{1B}\} \le 2\times OL_{1B}/\lambda_B \le 1.2\{-\Phi_{1B}/(2\pi)+m_{1B}\} \tag{B-1}$$

$$0.7\{-\Phi_{2B}/(2\pi)+m_{2B}\} \le 2\times OL_{2B}/\lambda_B \le 1.2\{-\Phi_{2B}/(2\pi)+m_{2B}\} \tag{B-2}$$

$$L_{1B} < L_{2B} \tag{B-3}$$

$$m_{1B} < m_{2B} \tag{B-4}$$

$$0.7\{-\Phi_{1C}/(2\pi)+m_{1C}\} \le 2\times OL_{1C}/\lambda_C \le 1.2\{-\Phi_{1C}/(2\pi)+m_{1C}\} \tag{C-1}$$

$$0.7\{-\Phi_{2C}/(2\pi)+m_{2C}\} \le 2\times OL_{2C}/\lambda_C \le 1.2\{-\Phi_{2C}/(2\pi)+m_{2C}\} \tag{C-2}$$

$$L_{1C} < L_{2C} \tag{C-3}$$

$$m_{1C} < m_{2C} \tag{C-4}$$

Here, $\lambda_A$: maximum peak wavelength of a spectrum of light generated in the first light emitting layer (or a desired wavelength of light generated in the first light emitting layer)

$\Phi_{1A}$: phase shift amount of light reflected by the 1a-th interface (unit: radian)

Provided that $-2\pi < \Phi_{1A} \le 0$ is satisfied.

$\Phi_{2A}$: phase shift amount of light reflected by the 2a-th interface (unit: radian)

Provided that $-2\pi < \Phi_{2A} \le 0$ is satisfied.

$\lambda_B$: maximum peak wavelength of spectrum of light generated in the second light emitting layer (or a desired wavelength of light generated in the second light emitting layer)

$\Phi_{1B}$: phase shift amount of light reflected by the 1b-th interface (unit: radian)

Provided that $-2\pi < \Phi_{1B} \le 0$ is satisfied.

$\Phi_{2B}$: phase shift amount of light reflected by the 2b-th interface (unit: radian)

Provided that $-2\pi < \Phi_{2B} \le 0$ is satisfied.

$\lambda_C$: maximum peak wavelength of a spectrum of light generated in the third light emitting layer (or a desired wavelength of light generated in the third light emitting layer)

$\Phi_{1C}$: phase shift amount of light reflected by the 1c-th interface (unit: radian)

Provided that $-2\pi < \Phi_{1C} \le 0$ is satisfied.

$\Phi_{2C}$: phase shift amount of light reflected by the 2c-th interface (unit: radian)

Provided that $-2\pi<\Phi_{2C}\leq 0$ is satisfied.

In addition, in this case, $m_{1A}=0$, $m_{2A}=1$, $m_{1B}=0$, $m_{2B}=1$, $m_{1C}=0$, and $m_{2C}=1$ are satisfied although not being limited thereto.

Figure 5A:
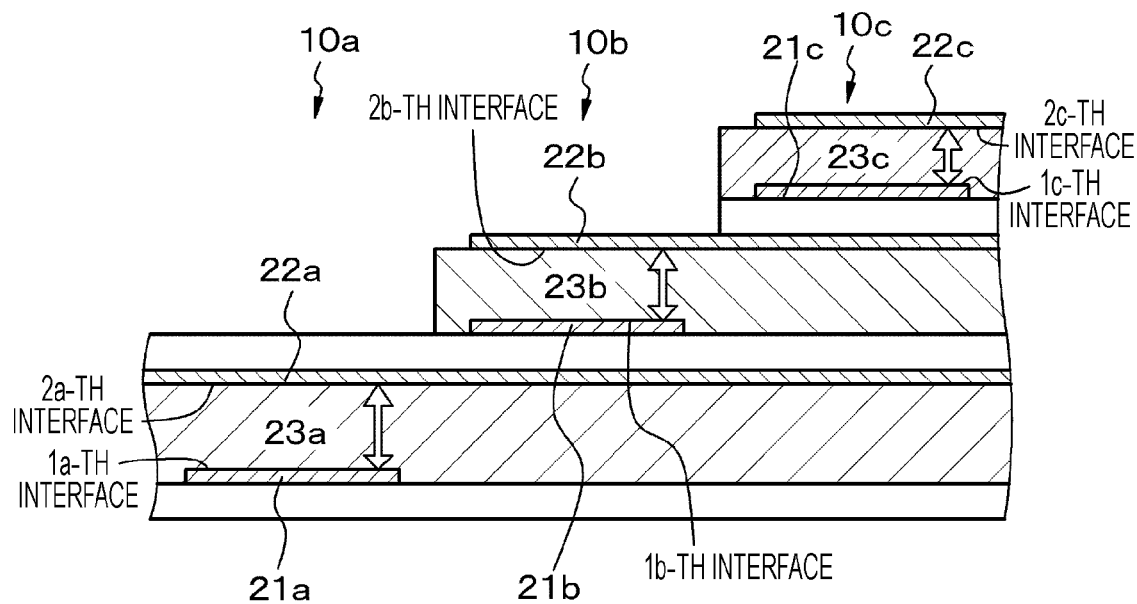
FIGS. 5A and 5B are conceptual diagrams of a light emitting element unit of Example 3 and Modification (1) thereof, respectively.

Note that in the example illustrated in FIGS. 1A, 1B, and 5A (Example 3), the 1a-th interface is constituted by the interface between the 1a-th electrode 21a and the first organic layer 23a, the 2a-th interface is constituted by the interface between the 1b-th electrode 21b and the second organic layer 23b, and the 3a-th interface is constituted by the interface between the 1c-th electrode 21c and the third organic layer 23c. Alternatively, as FIG. 2B [Modification (2) of Example 1] and FIG. 7 [Modification (4) of Example 3] illustrate, the first light reflecting layer 25a may be formed on the interlayer insulating layer 31 below the 1a-th electrode 21a, the second light reflecting layer 25b may be formed on the insulating layer 34 below the 1b-th electrode 21b, the third light reflecting layer 25c may be formed on the interlayer insulating layer 37 below the 1c-th electrode 21c, the 1a-th interface may be constituted by the first light reflecting layer 25a, the 2a-th interface may be constituted by the second light reflecting layer 25b, and the 3a-th interface may be constituted by the third light reflecting layer 25c. Furthermore, as FIG. 4C (Modification (4) of Example 2) illustrates, the third light reflecting layer 25c may be formed in the interlayer insulating layer 37 below the 1c-th electrode 21c, the 1a-th interface may be constituted by the first light reflecting layer 25a, the 2a-th interface may be constituted by the second light reflecting layer 25b, and the 3a-th interface may be constituted by the third light reflecting layer 25c. The first light reflecting layer 25a, the 2 light reflecting layer 25b, and the third light reflecting layer 25c can be each constituted by, for example, an aluminum (Al) layer, and the 1a-th electrode 21a, the 1b-th electrode 21b, and the 1c-th electrode 21c are each only required to be constituted by a transparent conductive material.

In Example 1 or Example 2 or 3 described later, the first substrate 41 is constituted by a silicon substrate, an alkali-free glass, or a quartz glass, and the second substrate 42 is constituted by an alkali-free glass or a quartz glass. A protective film 44 containing SiN is formed on the 2c-th electrode 22c, and the first substrate 41 and the second substrate 42 are bonded to each other (stuck to each other) with an adhesive layer (sealing layer) (not illustrated). A black matrix layer BM may be formed in a region of the second substrate 42 corresponding to a portion between the first light emitting element 10a and the second light emitting element 10b, in a region of the second substrate 42 corresponding to a portion between the first light emitting element 10a and the third light emitting element 10c, and in a region of the second substrate 42 corresponding to a portion between the second light emitting element 10b and the third light emitting element 10c.

Hereinafter, with reference to FIGS. 19A, 19B, 20A, 20B, 21, 22, 23, 24, 25 and 26, which are schematic partial end view of the first substrate and the like, a method for manufacturing the light emitting element unit and the organic EL display device of Example 1 will be described.

[Step-100]

First, the first substrate 41 is prepared, and on the first substrate 41, an organic EL driving unit including a TFT for driving the first light emitting element 10a, the second light emitting element 10b, and the third light emitting element 10c is disposed by a known method. Subsequently, the insulating layer 43 is formed on the entire surface by a known method.

[Step-110]

Thereafter, the first light emitting element 10a is formed.

[Step-110A]

Specifically, a hole portion is formed in the insulating layer 43 by a laser etching method, and one of the source/drain regions 55a, one of the source/drain regions 55b, and one of the source/drain regions 55c are each exposed at a bottom of the hole portion. Then, a conductive material film is formed on the insulating layer 43 including the inside of the hole portion, and the conductive material film is patterned to form the contact hole portions 56a, 56b, and 56c. Subsequently, the interlayer insulating layer 31 is formed on the entire surface by a known method, and a recess in which the contact hole portion 56a is exposed is formed in the interlayer insulating layer 31 above the contact hole portion 56a (see FIG. 19A).

[Step-110c]

Subsequently, a conductive material film for forming the 1a-th electrode 21a is formed on the interlayer insulating layer 31 including a recess, and the conductive material film is patterned to form the 1a-th electrode 21a. The 1a-th electrode 21a and one of the source/drain regions 55a are electrically connected to each other by the contact hole portion 56a.

[Step-110C]

Next, for example, the interlayer insulating layer 32 containing silicon oxynitride (SiON) is formed on the basis of a sputtering method or a CVD method, and an opening is formed in the interlayer insulating layer 32 on the basis of a photolithography method and an etching technique. The 1a-th electrode 21a is exposed at a bottom of the opening.

[Step-110D]

Thereafter, a hole injection layer, a hole transport layer, a red light emitting layer, an electron transport layer, and an electron injection layer are formed in this order from the 1a-th electrode 21a to the interlayer insulating layer 32 so as to cover the 1a-th electrode 21a and the interlayer insulating layer 32, for example, by a vapor deposition method to obtain the first organic layer 23a.

[Step-110E]

Figure 19A:
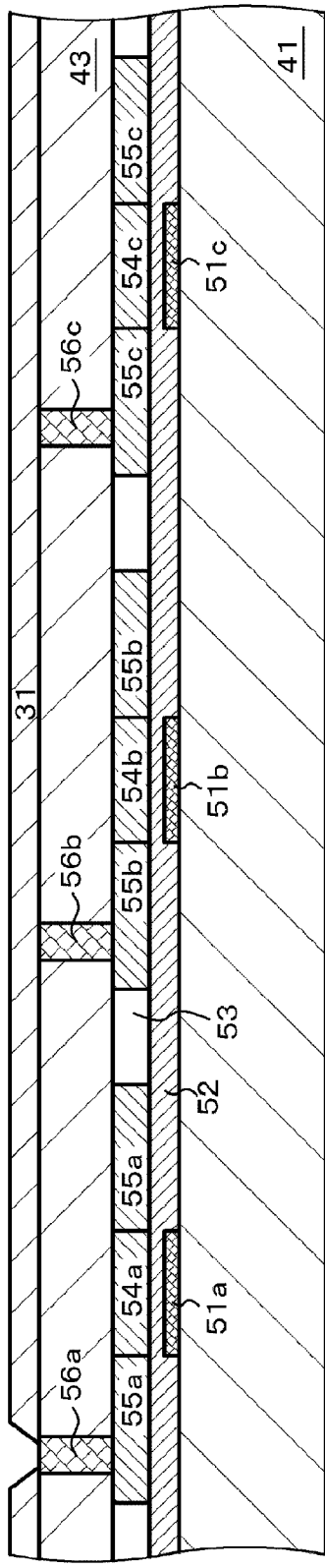
FIGS. 19A and 19B are schematic end views of a first substrate and the like for explaining a method for manufacturing the light emitting element unit of Example 1.
Figure 19B:
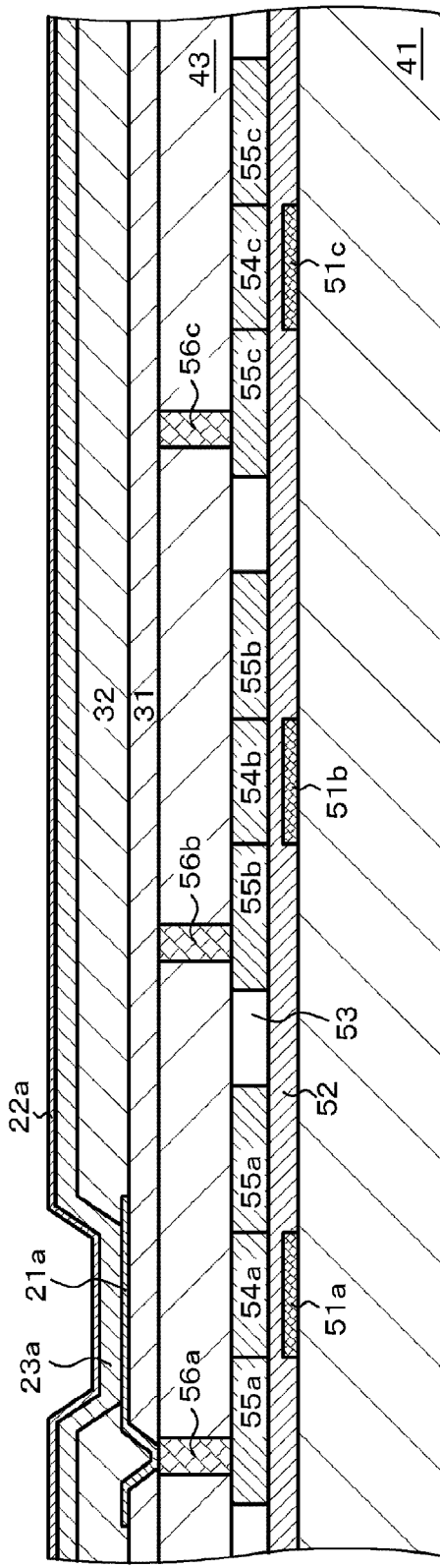
Figure 20A:
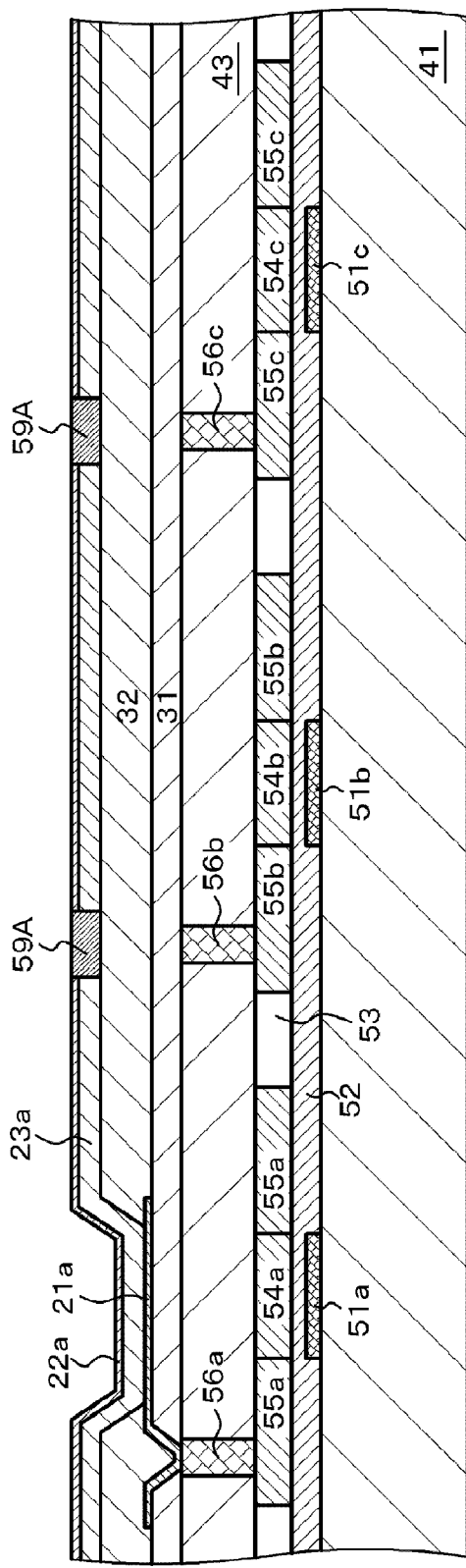
FIGS. 20A and 20B are schematic end views of the first substrate and the like for explaining the method for manufacturing the light emitting element unit of Example 1, following FIG. 19B.
Figure 20B:
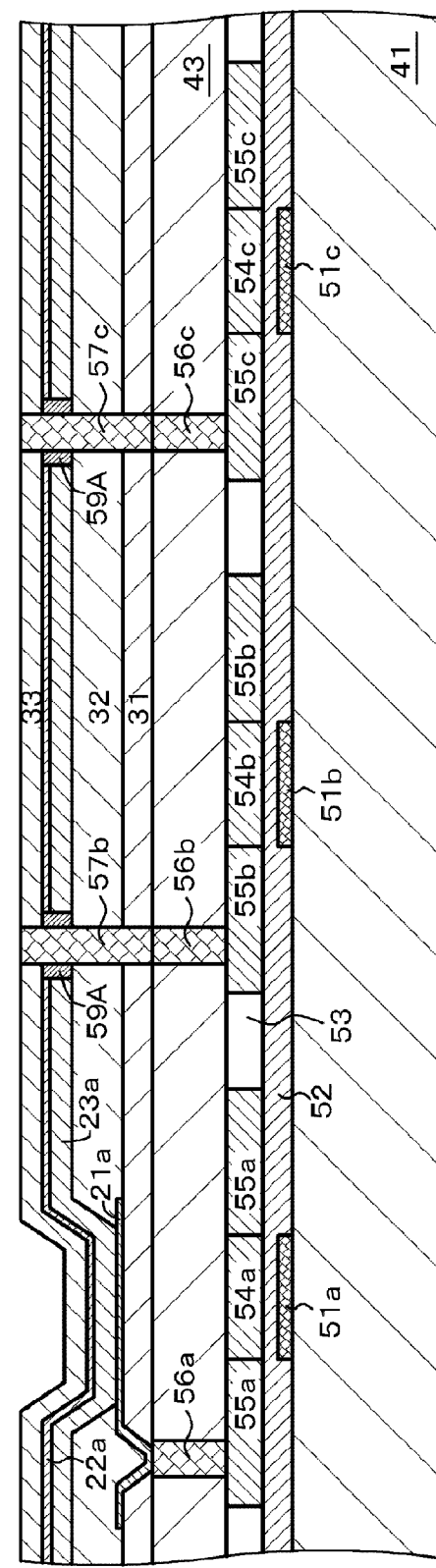
Figure 21:
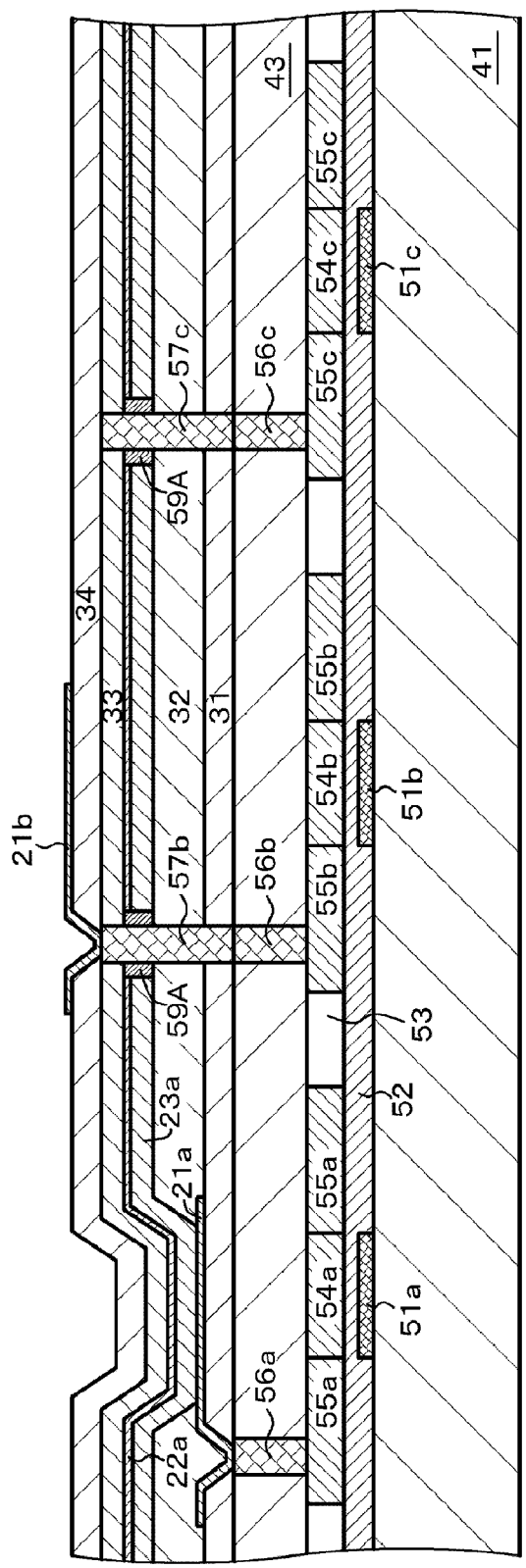
FIG. 21 is a schematic end view of the first substrate and the like for explaining the method for manufacturing the light emitting element unit of Example 1, following FIG. 20B.

Subsequently, the 2a-th electrode 22a is formed on the entire surface, for example, by a vapor deposition method (see FIG. 19B). Then, in order to prevent occurrence of a short circuit between contact hole portions 57b and 57c described next and the 2a-th electrode 22a, the insulating film 59A is formed (see FIG. 20A), and then the interlayer insulating layer 33 containing SiN is formed on the entire surface, for example, by a CVD method.

[Step-110]

Next, the second light emitting element 10b is formed.

[Step-120A]

Specifically, a hole portion is formed in the interlayer insulating layer 33, the insulating film 59A, and the interlayer insulating layers 32 and 31 by a laser etching method, and the contact hole portions 56b and 56c are each exposed at a bottom of the hole. Then, a conductive material film is formed on the interlayer insulating layer 33 including the inside of the hole portion, and the conductive material film is patterned to form the contact hole portions 57b and 57c (see FIG. 20B).

[Step-120B]

Subsequently, the interlayer insulating layer 34 is formed on the entire surface by a known method, and a recess in which the contact hole portion 57b is exposed is formed in the interlayer insulating layer 34 above the contact hole portion 57b. Then, a conductive material film for forming the 1b-th electrode 21b is formed on the interlayer insulating layer 34 including a recess, and the conductive material film is patterned to form the 1b-th electrode 21b (see FIG. 21). The 1b-th electrode 21b and one of the source/drain regions 55b are electrically connected to each other by the contact hole portions 57b and 56b.

[Step-120C]

Next, for example, the interlayer insulating layer 35 containing silicon oxynitride (SiON) is formed on the basis of a sputtering method or a CVD method, and an opening is formed in the interlayer insulating layer 35 on the basis of a photolithography method and an etching technique. The 1b-th electrode 21b is exposed at a bottom of the opening.

[Step-120D]

Thereafter, a hole injection layer, a hole transport layer, a green light emitting layer, an electron transport layer, and an electron injection layer are formed in this order from the 1b-th electrode 21b to the interlayer insulating layer 35 so as to cover the 1b-th electrode 21b and the interlayer insulating layer 35, for example, by a vapor deposition method to obtain the second organic layer 23b.

[Step-120E]

Figure 22:
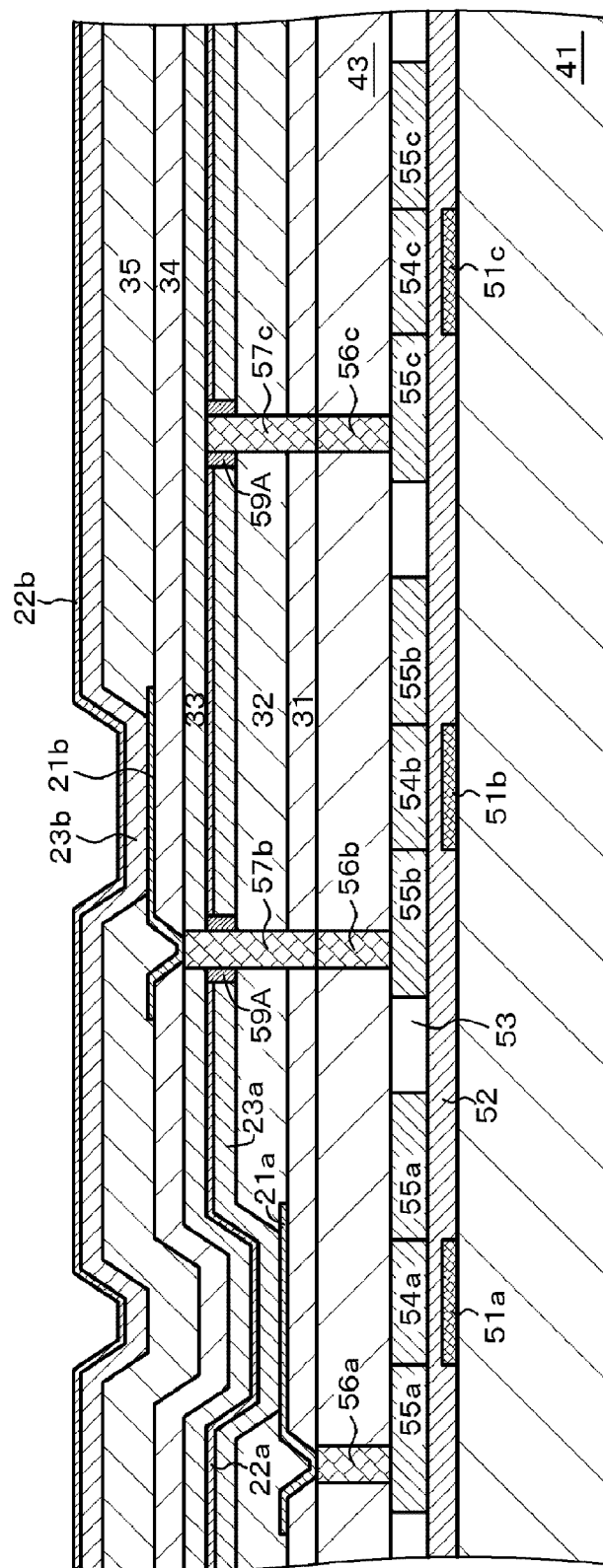
FIG. 22 is a schematic end view of the first substrate and the like for explaining the method for manufacturing the light emitting element unit of Example 1, following FIG. 21.
Figure 23:
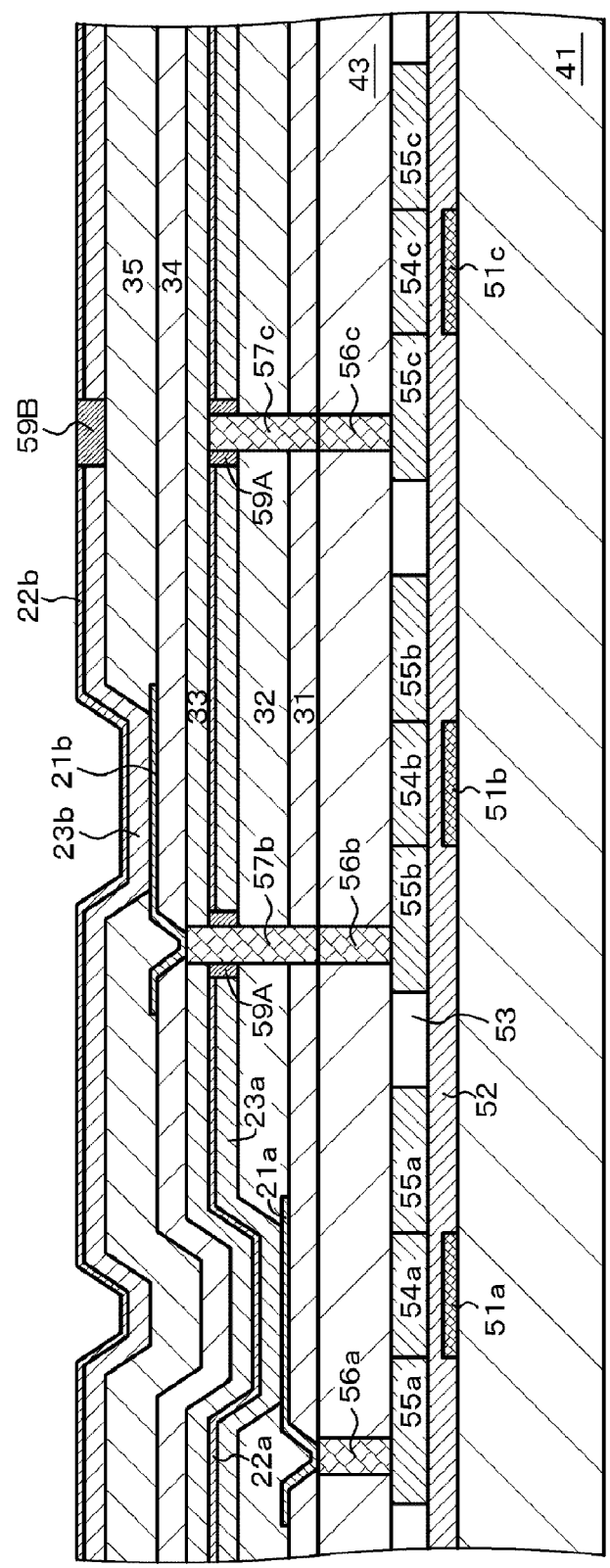
FIG. 23 is a schematic end view of the first substrate and the like for explaining the method for manufacturing the light emitting element unit of Example 1, following FIG. 22.
Figure 24:
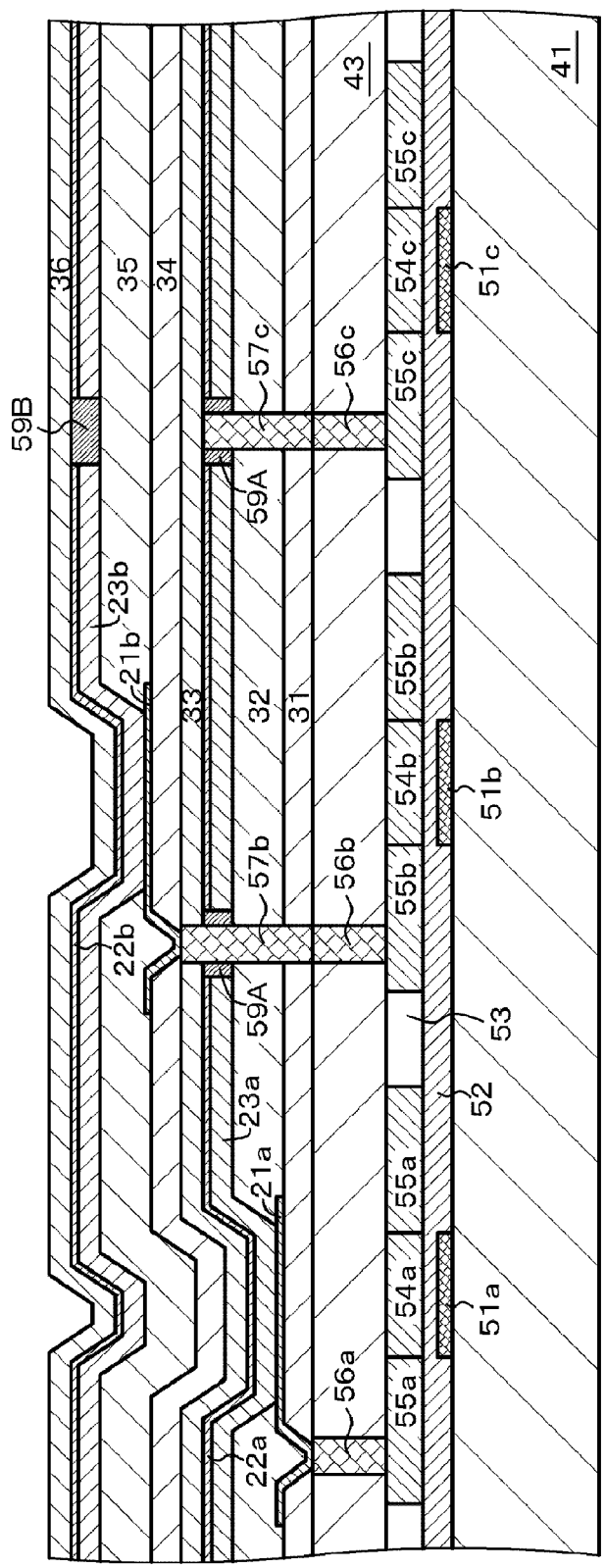
FIG. 24 is a schematic end view of the first substrate and the like for explaining the method for manufacturing the light emitting element unit of Example 1, following FIG. 23.
Figure 25:
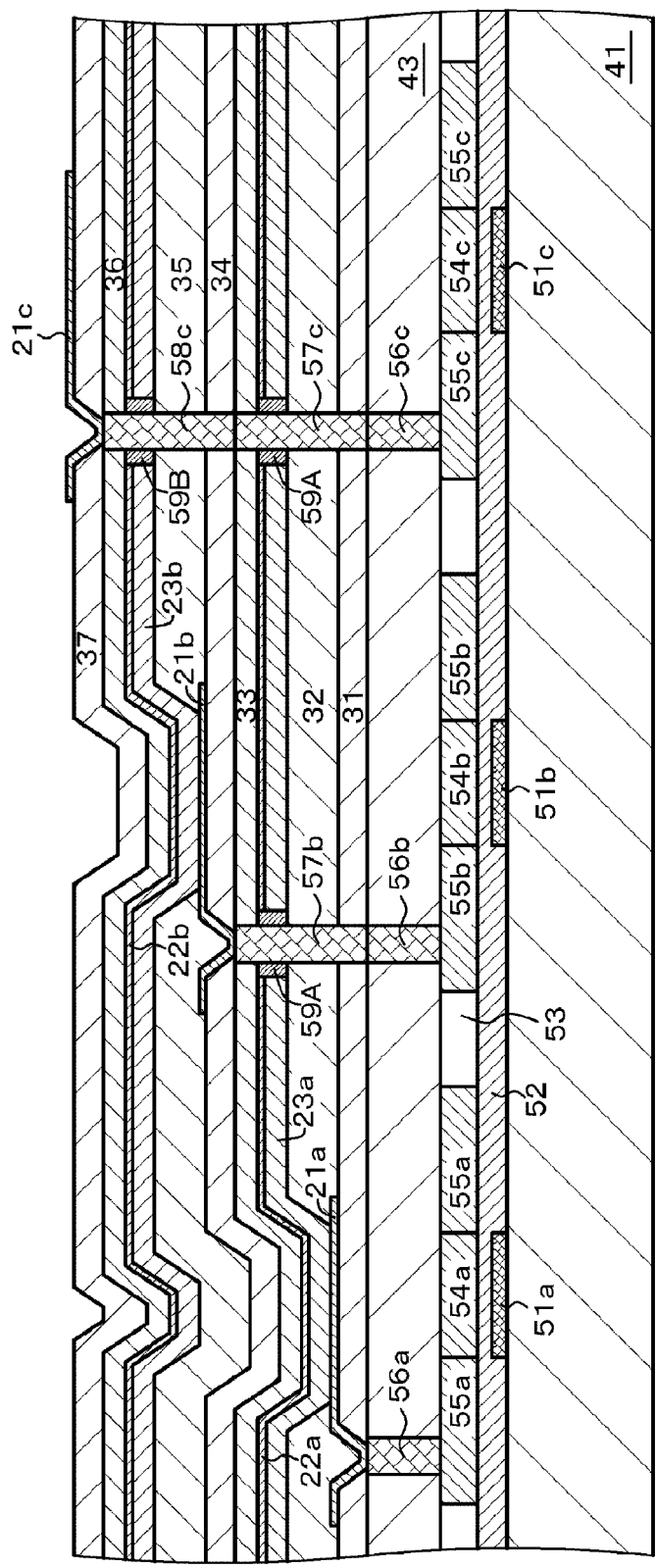
FIG. 25 is a schematic end view of the first substrate and the like for explaining the method for manufacturing the light emitting element unit of Example 1, following FIG. 24.

Subsequently, the 2b-th electrode 22b is formed on the entire surface, for example, by a vapor deposition method (see FIG. 22). Then, in order to prevent occurrence of a short circuit between a contact hole portion 58c described next and the 2b-th electrode 22b, an insulating film 59B is formed (see FIG. 23). Next, the interlayer insulating layer 36 containing SiN is formed on the entire surface, for example, by a CVD method (see FIG. 24).

[Step-130]

Next, the third light emitting element 10c is formed.

[Step-130A]

Specifically, a hole portion is formed in the interlayer insulating layer 36, the insulating film 59B, and the interlayer insulating layers 35 and 34 by a laser etching method, and the contact hole portion 57c is exposed at a bottom of the hole. Then, a conductive material film is formed on the interlayer insulating layer 36 including the inside of the hole portion, and the conductive material film is patterned to form the contact hole portion 58c.

[Step-130B]

Subsequently, the interlayer insulating layer 37 is formed on the entire surface by a known method, and a recess in which the contact hole portion 58c is exposed is formed in the interlayer insulating layer 37 above the contact hole portion 58c. Then, a conductive material film for forming the 1c-th electrode 21c is formed on the interlayer insulating layer 37 including a recess, and the conductive material film is patterned to form the 1c-th electrode 21c (see FIG. 25). The 1c-th electrode 21c and one of the source/drain regions 55c are electrically connected to each other by the contact hole portions 58c, 57c, and 56c.

[Step-130C]

Next, for example, the interlayer insulating layer 38 containing silicon oxynitride (SiON) is formed on the basis of a sputtering method or a CVD method, and an opening is formed in the interlayer insulating layer 38 on the basis of a photolithography method and an etching technique. The 1c-th electrode 21c is exposed at a bottom of the opening.

[Step-130D]

Thereafter, a hole injection layer, a hole transport layer, a blue light emitting layer, an electron transport layer, and an electron injection layer are formed in this order from the 1c-th electrode 21c to the interlayer insulating layer 37 so as to cover the 1c-th electrode 21c and the interlayer insulating layer 37, for example, by a vapor deposition method to obtain the third organic layer 23c.

[Step-130E]

Figure 26:
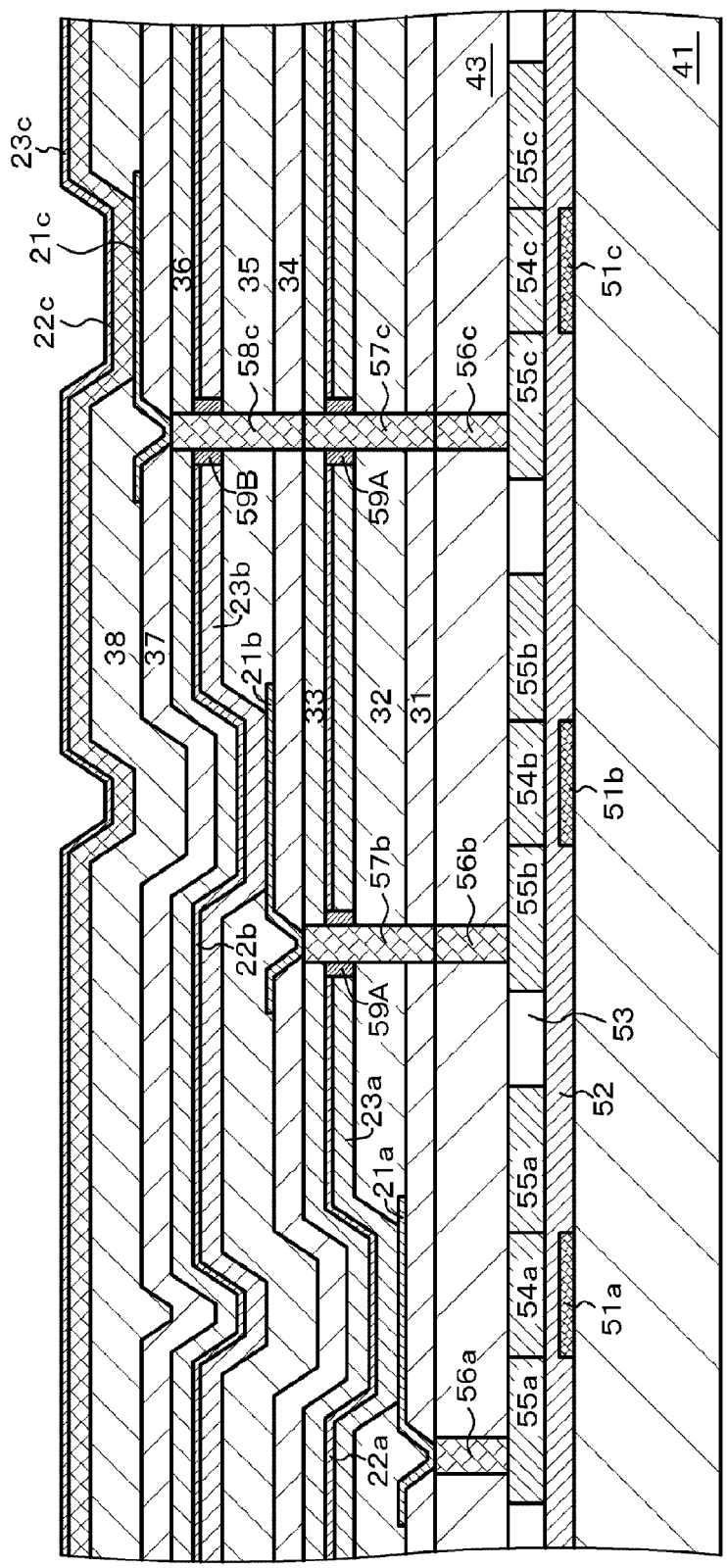
FIG. 26 is a schematic end view of the first substrate and the like for explaining the method for manufacturing the light emitting element unit of Example 1, following FIG. 25.

Subsequently, the 2c-th electrode 22c is formed on the entire surface, for example, by a vapor deposition method (see FIG. 26).

[Step-140]

Thereafter, a protective film 44 containing SiN is formed on the entire surface. Subsequently the first substrate 41 and the second substrate 42 are bonded (stuck) to each other with an adhesive layer (sealing layer) (not illustrated). By the above operations, an organic EL display device can be completed.

In the light emitting element unit of Example 1 described above, each of the light emitting elements is obtained by laminating the first organic layer, the second organic layer, and the third organic layer. That is, the organic layers can be deposited without using a vapor deposition mask. Therefore, mask alignment as in the RGB color-separated structure is unnecessary, and it is easy to manufacture various display devices, for example, a micro-display such as an organic EL display device with a fine pixel pitch or a large-scale display such as a large-scale organic EL display device to which a vapor deposition mask is hardly applied. Moreover, the first light emitting element has a first light emitting portion including the 1a-th electrode, the first organic layer, and the 2a-th electrode. The second light emitting element has a second light emitting portion including the 1b-th electrode, the second organic layer, and the 2b-th electrode. The third light emitting element has a third light emitting portion including the 1c-th electrode, the third organic layer, and the 2c-th electrode. In each of the light emitting portions, microcavity (resonator structure) can be optimized. Alternatively, each of the light emitting elements has a light emitting portion of a first electrode, an organic layer, and a second electrode, in which the first electrodes constituting the respective light emitting elements do not overlap with each other between the light emitting elements. Therefore, microcavity (resonator structure) can be optimized in each of the light emitting portions. Therefore, it is possible to improve light extraction efficiency and also to achieve high luminous efficiency and color purity.

Figure 2A:
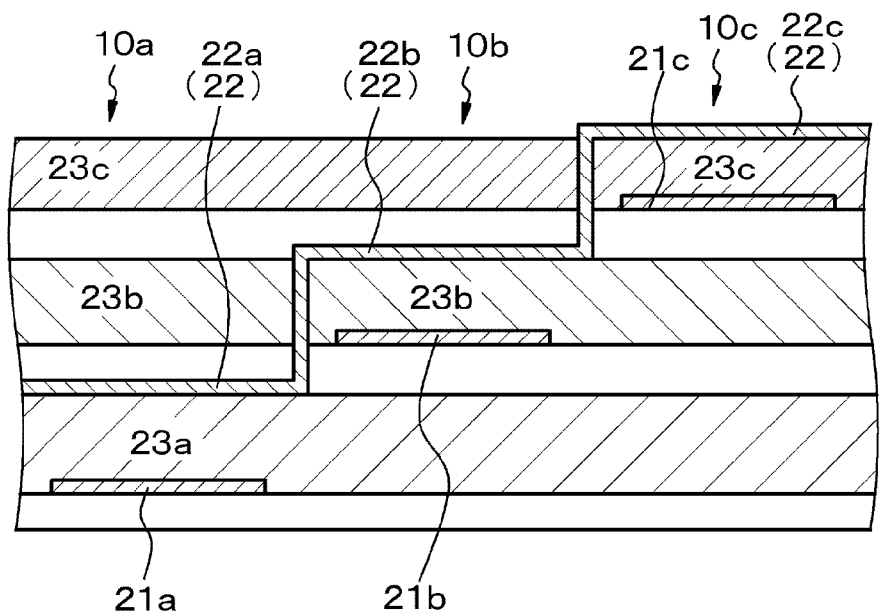
FIGS. 2A and 2B are conceptual diagrams of Modifications (1) and (2) of the light emitting element unit of Example 1, respectively.
Figure 2B:
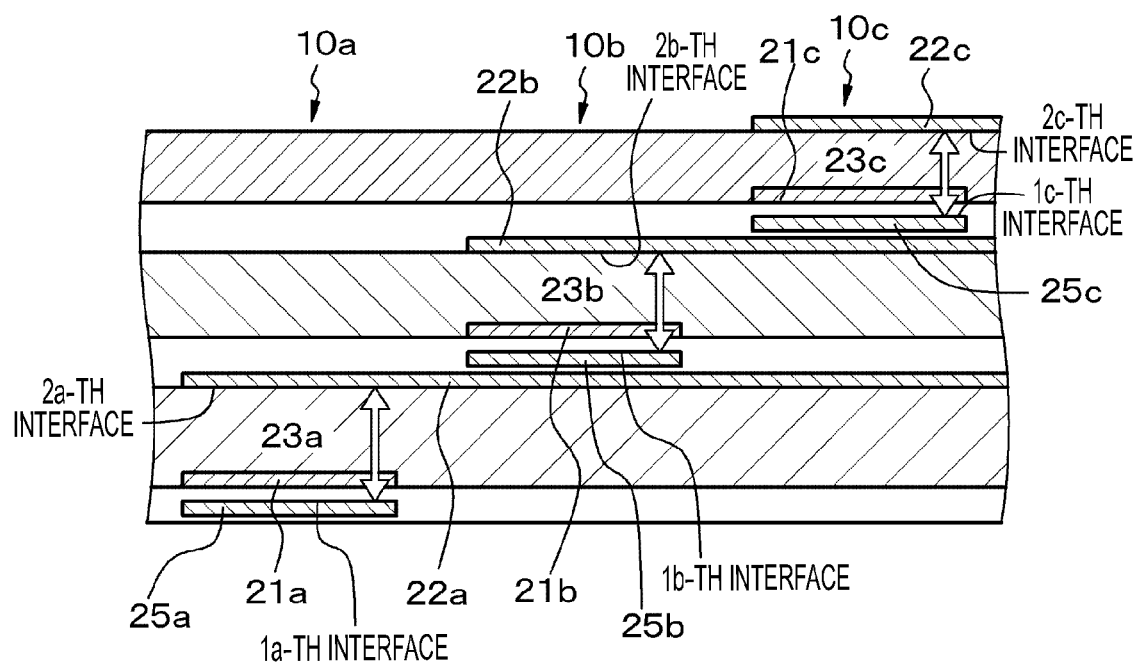
Figure 9:
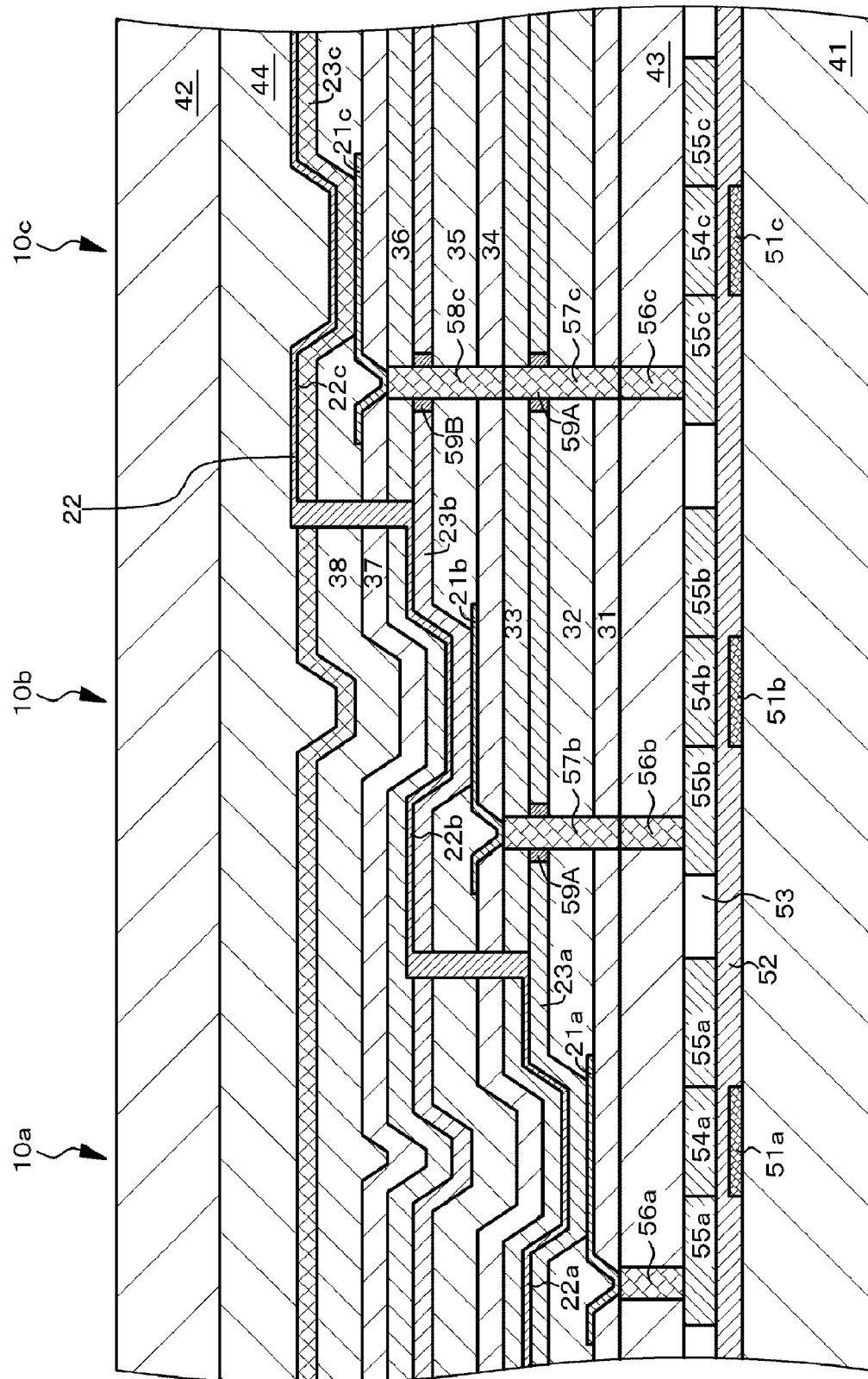
FIG. 9 is a schematic partial cross-sectional view of Modification (1) of the light emitting element unit of Example 1.

As FIG. 2A illustrates a conceptual diagram of Modification (1) of the light emitting element unit of Example 1 and FIG. 9 illustrates a schematic partial cross-sectional view thereof, the 2a-th electrode 22a, the 2b-th electrode 22b, and the 2c-th electrode 22c can be each constituted by a common second electrode 22. Note that a material constituting a portion of the second electrode 22 connecting the 2a-th electrode 22a and the 2b-th electrode 22b, and a portion of the second electrode 22 connecting the 2b-th electrode 22b and the 2c-th electrode 22c may be the same as or different from a material constituting the 2a-th electrode 22a, the 2b-th electrode 22b, and the 2c-th electrode 22c.

Figure 10B:
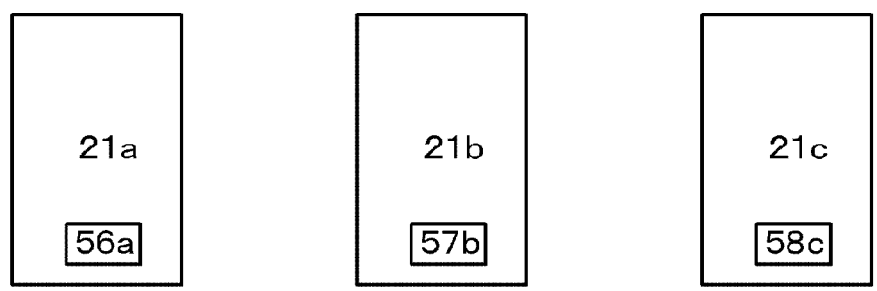
Figure 10C:
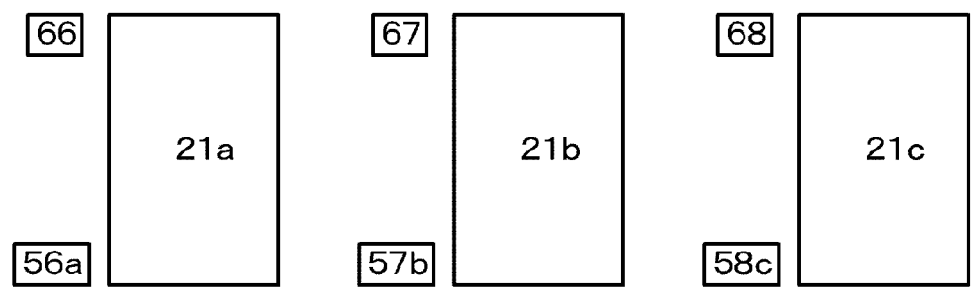
Figure 10D:
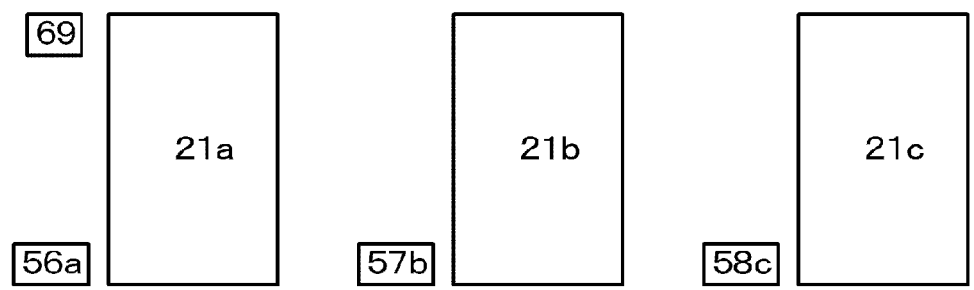

In Example 1 described above, as illustrated in FIG. 10A, the contact hole portions 56a, 57b, and 58c were formed adjacent to the 1a-th electrode 21a, the 1b-th electrode 21b, and the 1c-th electrode 21c, respectively. However, the formation of the contact hole portions is not limited to this formation. For example, as illustrated in FIG. 10B, the contact hole portions 56a, 57b, and 58c may be formed in lower portions of the 1a-th electrode 21a, the 1b-th electrode 21b, and the 1c-th electrode 21c, respectively. Furthermore, instead of connecting the 2a-th electrode 22a, the 2b-th electrode 22b, and the 2c-th electrode 22c to each other in an outer peripheral region (not illustrated) of the organic EL display device, as illustrated in FIG. 10C, the 2a-th electrode 22a, the 2b-th electrode 22b, and the 2c-th electrode 22c may be individually connected to the organic EL element driving unit through the contact hole portions 66, 67, and 68, or as illustrated in FIG. 10D, each light emitting element unit may be connected to the organic EL element driving unit through a contact hole portion 69. The same applies to Examples 2 and 3 described below.

Example 2

Figure 3A:
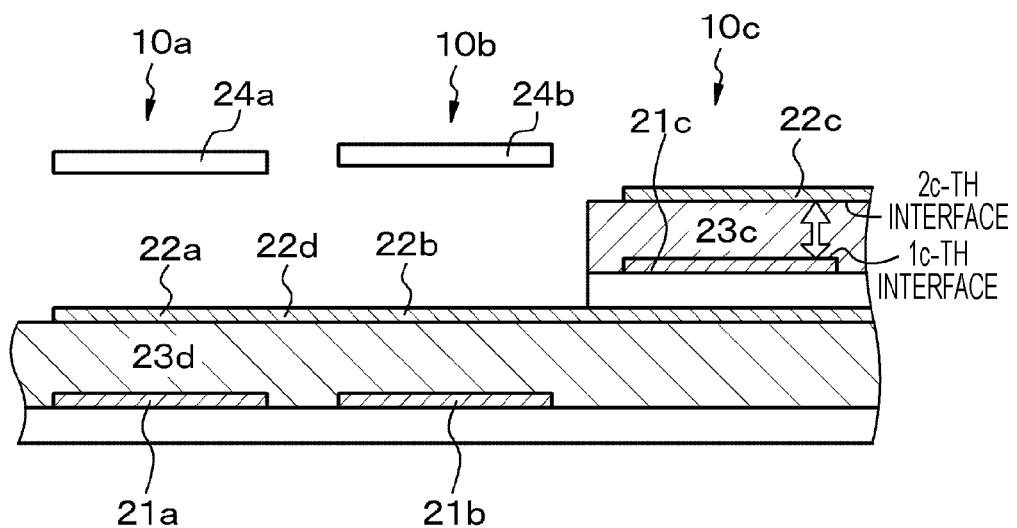
FIGS. 3A and 3B are conceptual diagrams of a light emitting element unit of Example 2 and Modification (1) thereof, respectively.
Figure 11:
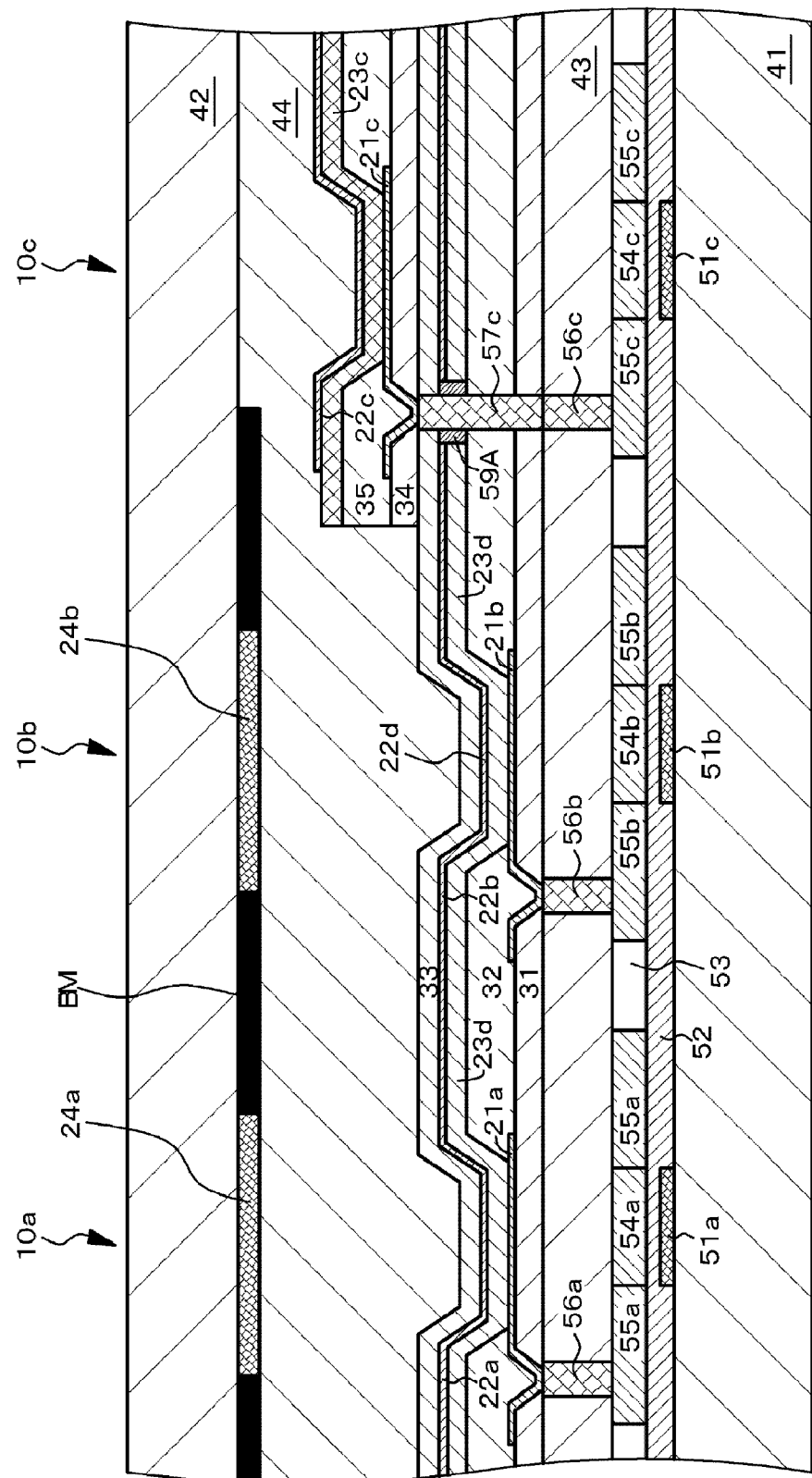
FIG. 11 is a schematic partial cross-sectional view of the light emitting element unit of Example 2.

Example 2 relates to the light emitting element unit according to the second and fourth aspects of the present disclosure. FIG. 3A illustrates a conceptual diagram of the light emitting element unit of Example 2. FIG. 11 illustrates a schematic partial cross-sectional view of the light emitting element unit of Example 2.

The light emitting element unit of Example 2 includes three light emitting elements 10 (10a, 10b, 10c), in which
the first light emitting element 10a and the second light emitting element 10b are juxtaposed, the first light emitting element 10a includes a 1a-th electrode 21a, a first organic layer 23d including a first light emitting layer, and a 2a-th electrode 22a, and the second light emitting element 10b includes a 1b-th electrode 21b, the first organic layer 23d, and a 2b-th electrode 22b,
the third light emitting element 10c is obtained by laminating the first organic layer 23d, a 1c-th electrode 21c, a third organic layer 23c including a third light emitting layer, and a 2c-th electrode 22c,
a first color filter 24a is disposed on a light emission side of the first light emitting element 10a, and
a second color filter 24b is disposed on a light emission side of the second light emitting element 10b.

Here, the 2a-th electrode 22a and the 2b-th electrode 22b are common, and may be hereinafter referred to as "common second electrode 22d".

Furthermore, the light emitting element unit of Example 2 will be described in accordance with the light emitting element unit according to the fourth aspect of the present disclosure.

The light emitting element unit of Example 2 includes a plurality of light emitting elements 10 (10a, 10b, 10c) having a laminated structure obtained by laminating a plurality of organic layers 23 (23d, 23d, 23c) each including a light emitting layer.

Each of the light emitting elements 10 (10a, 10b, 10c) includes a first electrode 21 (21a, 21b, 21c), any one of the plurality of organic layers 23 (23d, 23d, 23c), and a second electrode 22(22a, 22b, 22c), and
the first electrodes 21 (21a, 21b, 21c) constituting the respective light emitting elements 10 (10a, 10b, 10c) do not overlap with each other between the light emitting elements. That is, orthogonal projection images (orthogonal projection images on a first substrate 41) of the first electrodes 21 (21a, 21b, 21c) do not overlap with each other.

In the light emitting element unit of Example 2, the first light emitting element 10a and the second light emitting element 10b can be each constituted by a yellow light emitting element (yellow organic EL light emitting element), or can be constituted by an orange light emitting element (orange organic EL light emitting element). That is, the organic layer 23d emits yellow light or orange light. In addition, in this case, the first color filter 24a is only required to be a filter that selectively transmits red color, and the second color filter 24b is only required to be a filter that selectively transmits green color. Furthermore, the third light emitting element 10c is only required to be constituted by a blue light emitting element (blue organic EL light emitting element), and the organic layer 23c emits blue light. A black matrix layer BM may be disposed between a color filter and a color filter.

The 1a-th electrode 21a constituting the first light emitting element 10a is formed on an interlayer insulating layer 31 disposed on the insulating layer 43, and is connected to one of the source/drain regions 55a of the TFT for driving the first light emitting element 10a through a contact hole portion 56a formed in the insulating layer 43. The 1a-th electrode 21a constituting the second light emitting element 10b is also formed on the interlayer insulating layer 31 disposed on the insulating layer 43, and is connected to one of the source/drain regions 55b of the TFT for driving the second light emitting element 10b through the contact hole portion 56b formed in the insulating layer 43. An interlayer insulating layer 32 having an opening is formed so as to surround the 1a-th electrode 21a and the 1b-th electrode 21b, and the first organic layer 23d including a first light emitting layer is formed from the 1a-th electrode 21a and the 1b-th electrode 21b exposed at a bottom of the opening to the interlayer insulating layer 32 so as to cover the 1a-th electrode 21a, the 1b-th electrode 21b, and the interlayer insulating layer 32. Moreover, the common second electrode 22d is formed on the first organic layer 23d. The first organic layer 23d and the common second electrode 22d are so-called solid films that are not patterned. Note that the third organic layer 23c including the third light emitting layer is laminated above the common second electrode 22d located in a region other than the region of the first light emitting element 10a and the region of the second light emitting element 10b. Furthermore, the interlayer insulating layer 33 is formed on the common second electrode 22d.

The 1c-th electrode 21c constituting the third light emitting element 10c is formed on the interlayer insulating layer 34 disposed on the insulating layer 33, and is connected to one of the source/drain regions 55c of the TFT for driving the third light emitting element 10c through contact hole portions 56c and 57c formed in the insulating layer 43 and the interlayer insulating layers 31, 32, 33, and 34. An insulating film 59A is formed on a part of an inner surface of the contact hole portion 57c such that the contact hole portion 57c is not short-circuited with the common second electrode 22d. An interlayer insulating layer 35 having an opening is formed so as to surround the 1c-th electrode 21c, and the third organic layer 23c including the third light emitting layer is formed from the 1c-th electrode 21c exposed at a bottom of the opening to the interlayer insulating layer 35 so as to cover the 1c-th electrode 21c and the interlayer insulating layer 35. Moreover, the 2c-th electrode 22c is formed on the third organic layer 23c. The third organic layer 23c and the 2c-th electrode 22c are patterned.

Also in the light emitting element unit of Example 2, the common second electrode 22d and the 2c-th electrode 22c are connected to each other, for example, in an outer peripheral region (not illustrated) of the organic EL display device, and the same potential is applied thereto although not being limited thereto.

The light emitting element unit and the organic EL display device of Example 2 can be manufactured by a method substantially similar to the method for manufacturing a light emitting element unit and an organic EL display device described in Example 1, and therefore detailed description thereof is omitted.

In the light emitting element unit of Example 2 described above, the first light emitting element and the second light emitting element each include the first organic layer, and the third light emitting element is obtained by laminating the first organic layer and the third organic layer. That is, the organic layers can be deposited without using a vapor deposition mask. Therefore, mask alignment as in the RGB color-separated structure is unnecessary, and it is easy to manufacture various display devices, for example, a microdisplay such as an organic EL display device with a fine pixel pitch or a large-scale display such as a large-scale organic EL display device to which a vapor deposition mask is hardly applied. Moreover, the first light emitting element and the second light emitting element share the first organic layer. Therefore, this can simplify the structures of the first light emitting element and the second light emitting element, and makes manufacturing easy. Furthermore, the third light emitting element has the third light emitting portion including the 1c-th electrode, the third organic layer, and the 2c-th electrode, and can optimize microcavity (resonator structure) in the third light emitting portion. Therefore, light extraction efficiency can be improved, and high luminous efficiency and color purity can be achieved. Note that only two types of color filters are required, and therefore a decrease in luminous efficiency can be further reduced.

Figure 3B:
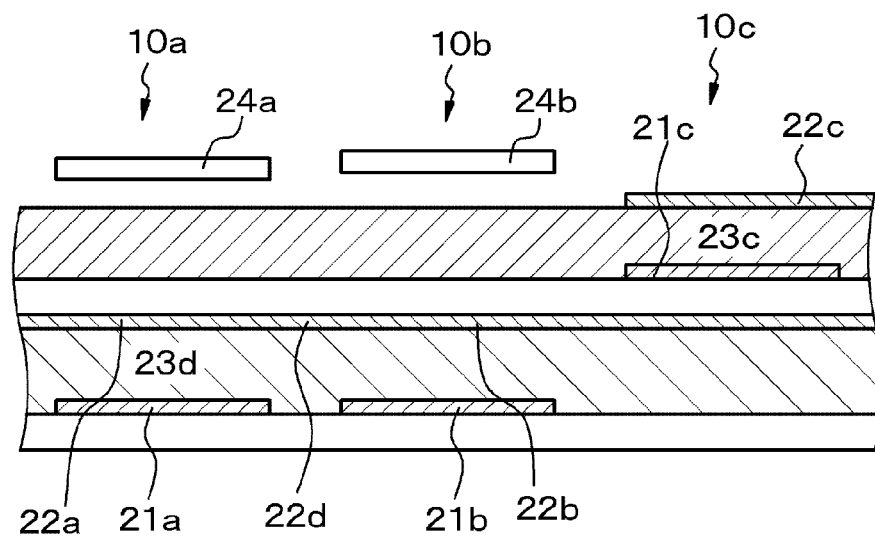
Figure 12:
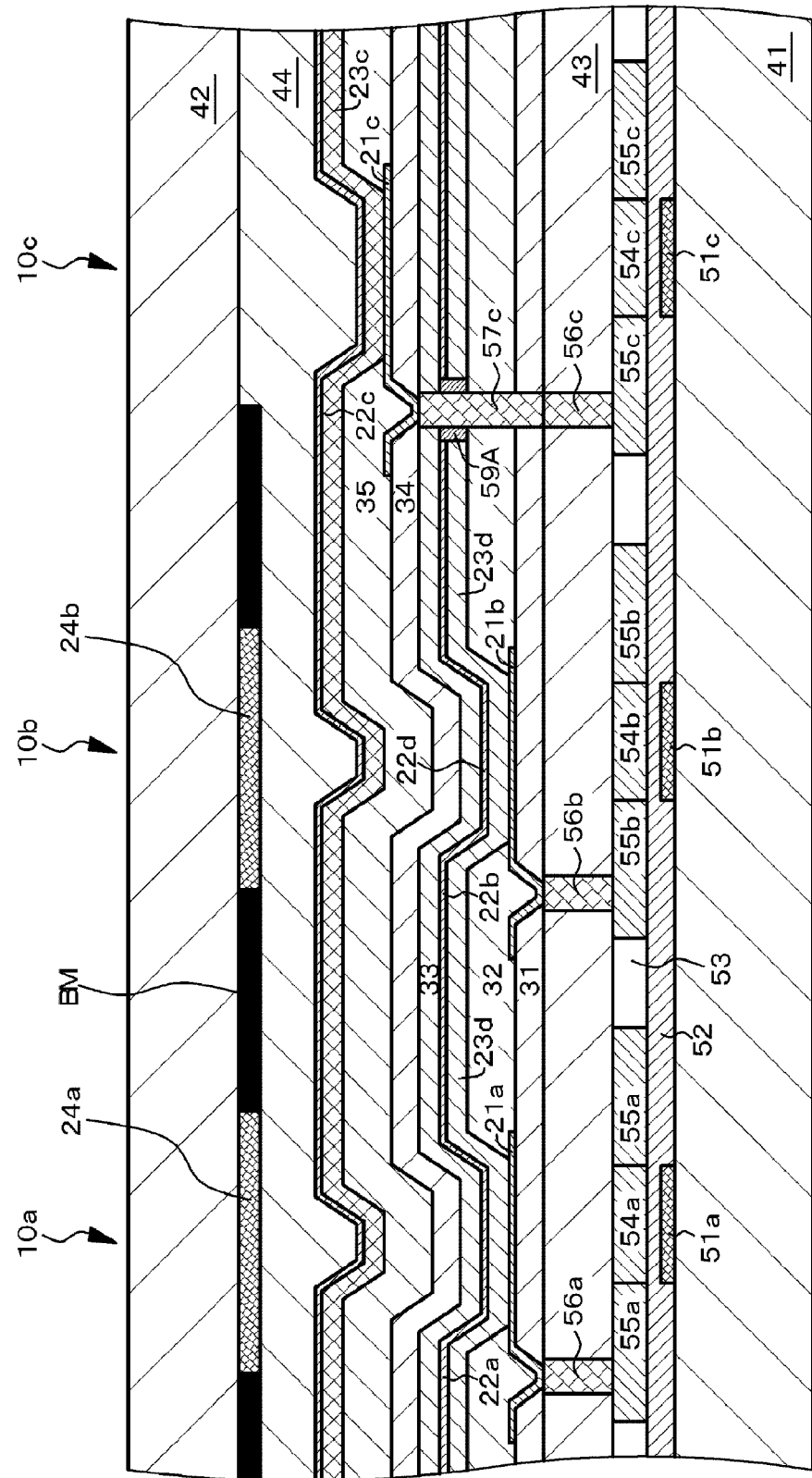
FIG. 12 is a schematic partial cross-sectional view of Modification (1) of the light emitting element unit of Example 2.

Note that as FIG. 3B illustrates a conceptual diagram of Modification (1) of the light emitting element unit of Example 2 and FIG. 12 illustrates a schematic partial cross-sectional view thereof, the third organic layer 23c including the third light emitting layer may be laminated above the common second electrode 22d located in the region of the first light emitting element 10a and the region of the second light emitting element 10b.

Figure 4A:
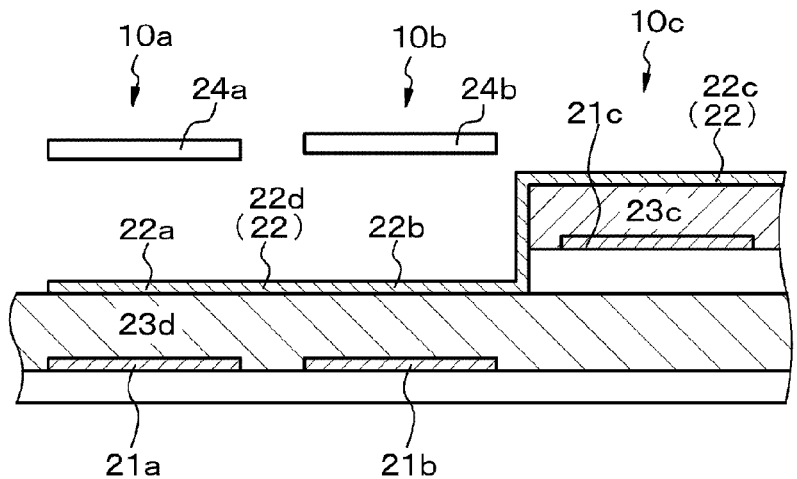
FIGS. 4A, 4B, and 4C are conceptual diagrams of Modifications (2), (3), and (4) of the light emitting element unit of Example 2, respectively.
Figure 13:
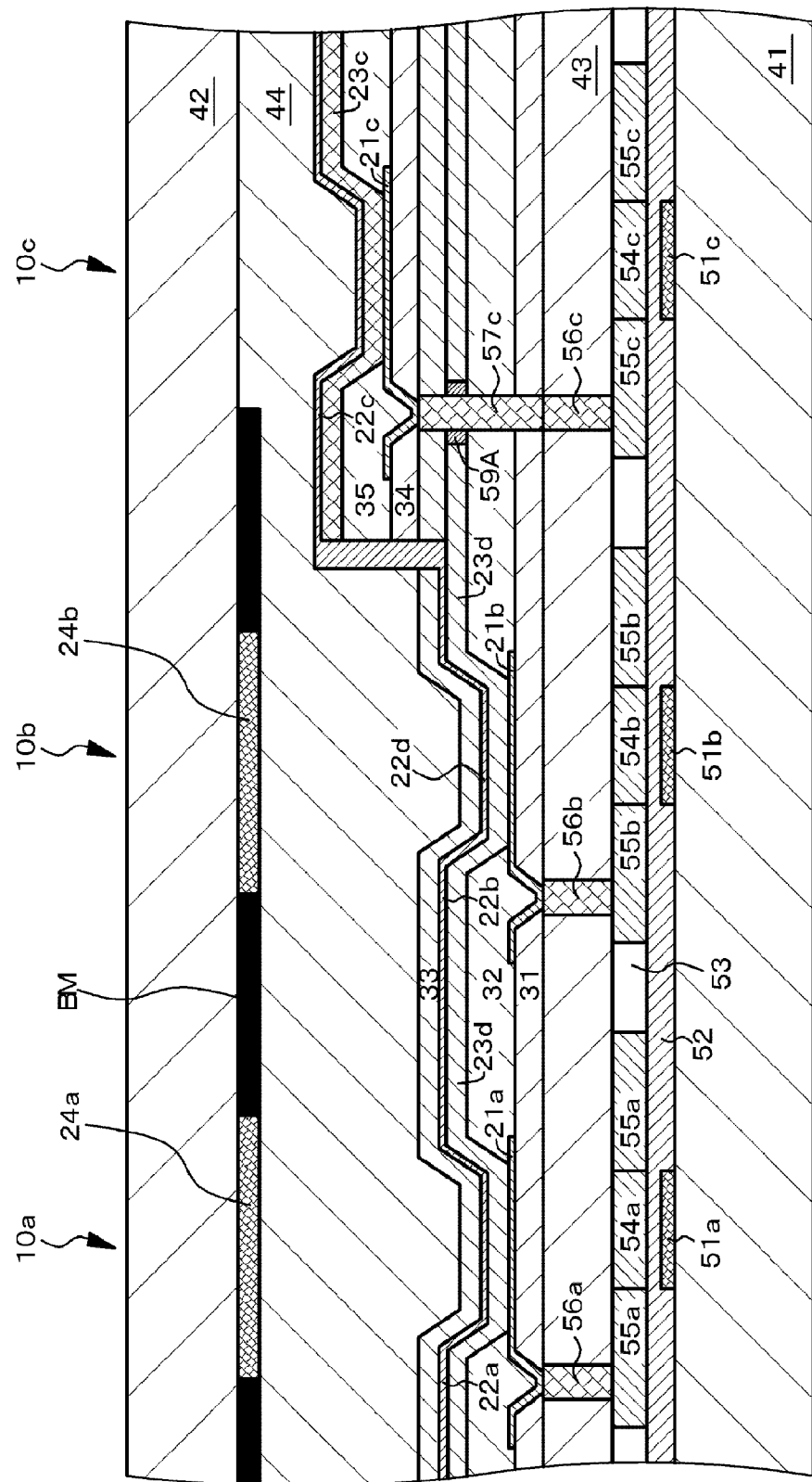
FIG. 13 is a schematic partial cross-sectional view of Modification (2) of the light emitting element unit of Example 2.

Furthermore, as FIG. 4A illustrates a conceptual diagram of Modification (2) of the light emitting element unit of Example 2 and FIG. 13 illustrates a schematic partial cross-sectional view thereof, a form can be adopted in which the same potential is applied to the 2a-th electrode 22a and the 2b-th electrode 22b, and moreover, a form can be adopted in which the same potential is applied to the 2a-th electrode 22a, the 2b-th electrode 22b, and the 2c-th electrode 22c. Specifically, the 2a-th electrode 22a, the 2b-th electrode 22b, and the 2c-th electrode 22c can be each constituted by the common second electrode 22. Note that a material constituting a portion of the second electrode 22 connecting the 2a-th electrode 22a, the 2b-th electrode 22b, and the 2c-th electrode 22c may be the same as or different from a material constituting the 2a-th electrode 22a, the 2b-th electrode 22b, and the 2c-th electrode 22c.

Figure 4B:
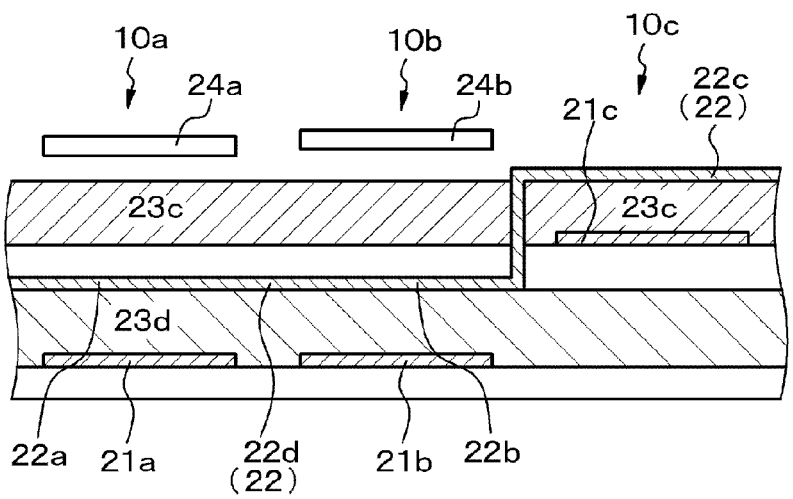
Figure 4C:
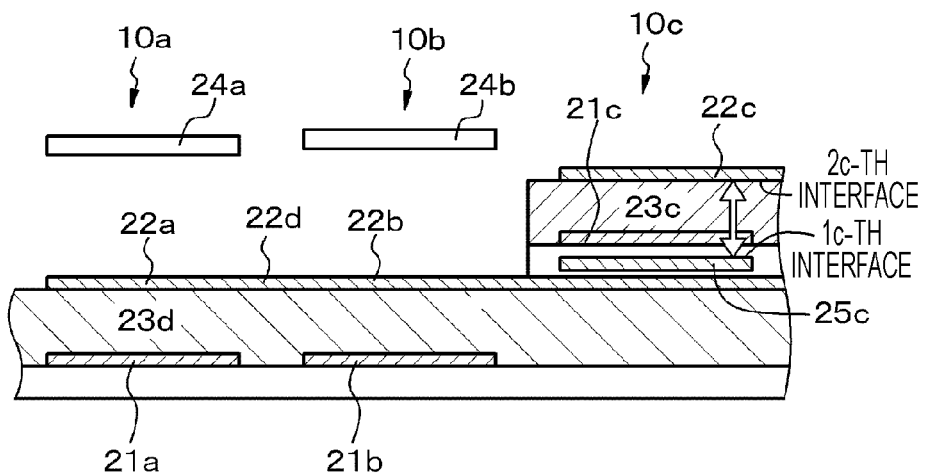
Figure 14:
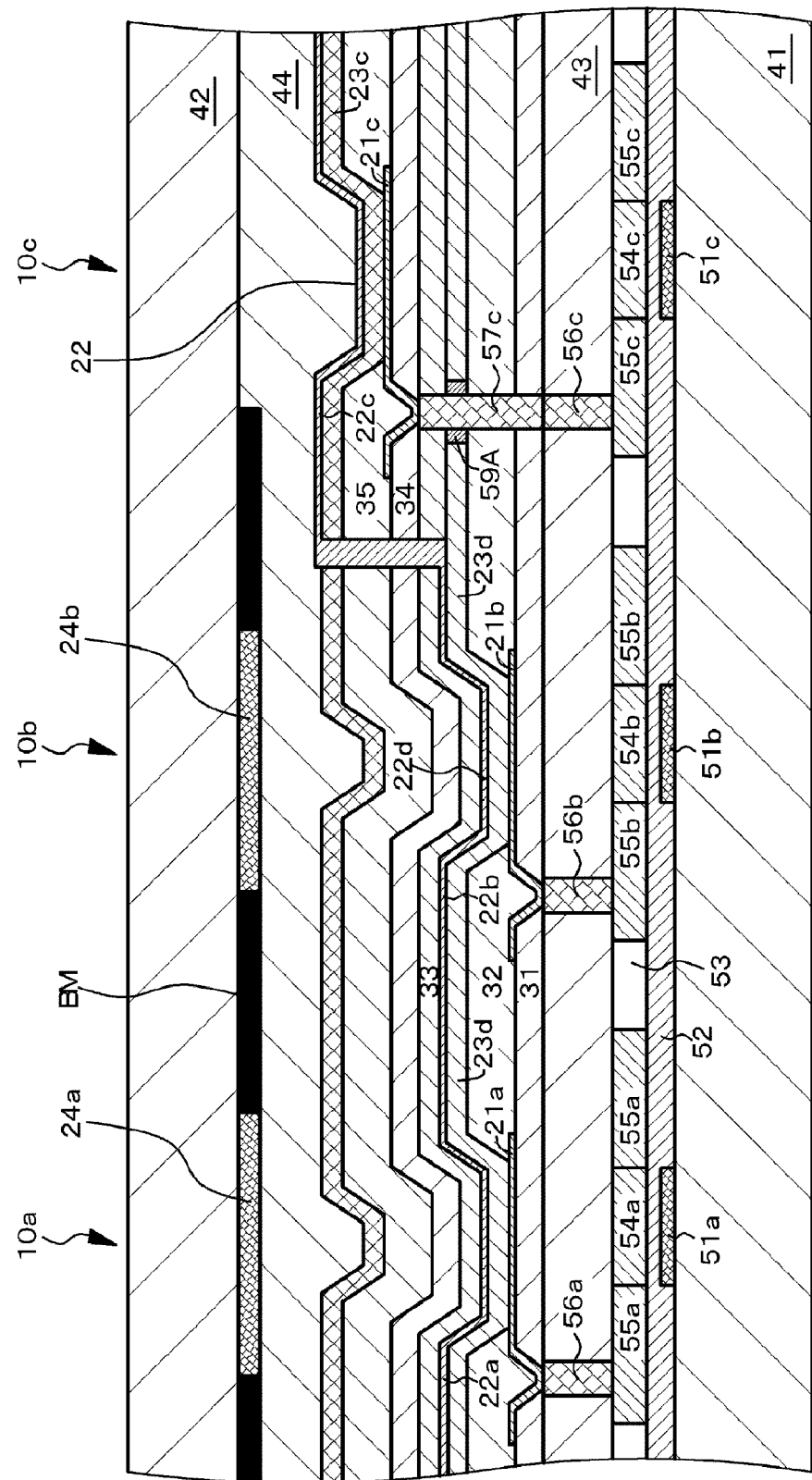
FIG. 14 is a schematic partial cross-sectional view of Modification (3) of the light emitting element unit of Example 2.

Moreover, as FIG. 4B illustrates a conceptual diagram of Modification (3), which is a modification of Modifications (1) and (2) of the light emitting element unit of Example 2, and FIG. 14 illustrates a schematic partial cross-sectional view thereof, the third organic layer 23c including the third light emitting layer may be laminated above the 2a-th electrode 22a and the 2b-th electrode 22b located in the region of the first light emitting element 10a and the region of the second light emitting element 10b.

Example 3

Figure 15:
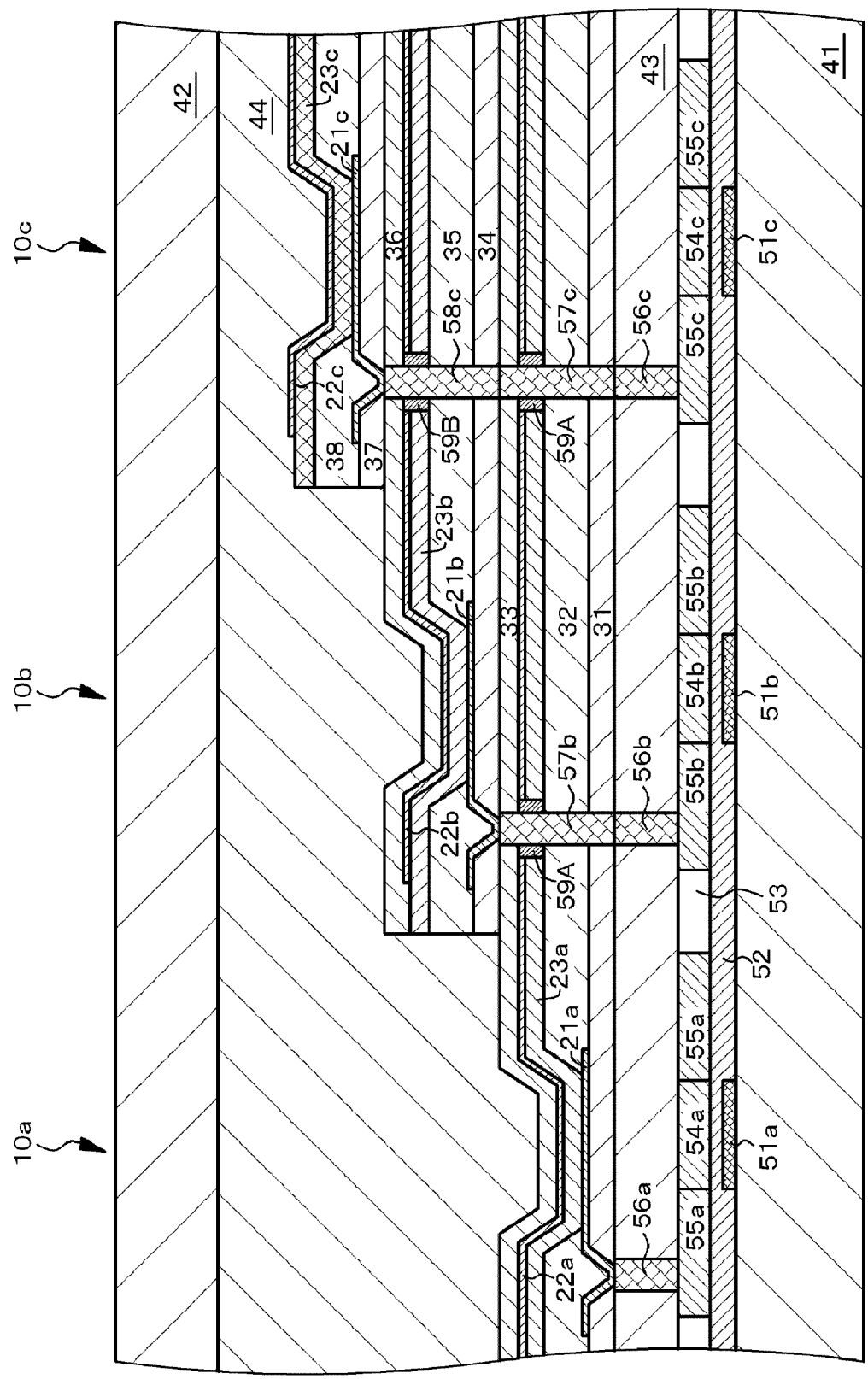
FIG. 15 is a schematic partial cross-sectional view of the light emitting element unit of Example 3.

Example 3 relates to the light emitting element unit according to the third and fourth aspects of the present disclosure. FIG. 5A illustrates a conceptual diagram of the light emitting element unit of Example 3. FIG. 15 illustrates a schematic partial cross-sectional view of the light emitting element unit of Example 3.

The light emitting element unit of Example 3 includes three light emitting elements 10 (10a, 10b, 10c).

The first light emitting element 10a is obtained by laminating a 1a-th electrode 21a, a first organic layer 23a including a first light emitting layer, and a 2a-th electrode 22a.

The second light emitting element 10b is obtained by laminating the first organic layer 23a, a 1b-th electrode 21b, a second organic layer 23b including a second light emitting layer, and a 2b-th electrode 22b.

The third light emitting element 10c is obtained by laminating the first organic layer 23a, the second organic layer 23b, a 1c-th electrode 21c, a third organic layer 23c including a third light emitting layer, and a 2c-th electrode 22c.

Furthermore, the light emitting element unit of Example 3 will be described in accordance with the light emitting element unit according to the fourth aspect of the present disclosure.

The light emitting element unit of Example 3 includes a plurality of light emitting elements 10 (10a, 10b, 10c) having a laminated structure obtained by laminating a plurality of organic layers 23 (23a, 23b, 23c) each including a light emitting layer.

Each of the light emitting elements 10 (10a, 10b, 10c) includes a first electrode 21 (21a, 21b, 21c), any one of the plurality of organic layers 23 (23a, 23b, 23c), and a second electrode 22 (22a, 22b, 22c), and the first electrodes 21 (21a, 21b, 21c) constituting the respective light emitting elements 10 (10a, 10b, 10c) do not overlap with each other between the light emitting elements. That is, orthogonal projection images (orthogonal projection images on a first substrate 41) of the first electrodes 21 (21a, 21b, 21c) do not overlap with each other.

The 1a-th electrode 21a constituting the first light emitting element 10a is formed on an interlayer insulating layer 31 disposed on the insulating layer 43, and is connected to one of the source/drain regions 55a of the TFT for driving the first light emitting element 10a through a contact hole portion 56a formed in the insulating layer 43. An interlayer insulating layer 32 having an opening is formed so as to surround the 1a-th electrode 21a, and the first organic layer 23a including the first light emitting layer is formed from the 1a-th electrode 21a exposed at a bottom of the opening to the interlayer insulating layer 32 so as to cover the 1a-th electrode 21a and the interlayer insulating layer 32. Moreover, the 2a-th electrode 22a is formed on the first organic layer 23a. The first organic layer 23a and the 2a-th electrode 22a are so-called solid films that are not patterned. Note that the second organic layer 23b including the second light emitting layer and the third organic layer 23c including the third light emitting layer are not disposed above the 2a-th electrode 22a. Furthermore, an interlayer insulating layer 33 is formed on a part of the 2a-th electrode 22a.

The 1b-th electrode 21b constituting the second light emitting element 10b is formed on an interlayer insulating layer 34 disposed on the insulating layer 33, and is connected to one of the source/drain regions 55b of the TFT for driving the second light emitting element 10b through contact hole portions 56b and 57b formed in the insulating layer 43 and the interlayer insulating layers 31, 32, and 33. An insulating film 59A is formed on a part of an inner surface of each of the contact hole portions 57b and 57c such that the contact hole portions 57b and 57c are not short-circuited with the 2a-th electrode 22a. An interlayer insulating layer 35 having an opening is formed so as to surround the 1b-th electrode 21b, and the second organic layer 23b including the second light emitting layer is formed from the 1b-th electrode 21b exposed at a bottom of the opening to the interlayer insulating layer 35 so as to cover the 1b-th electrode 21b and the interlayer insulating layer 35. Moreover, the 2b-th electrode 22b is formed on the second organic layer 23b. The second organic layer 23b and the 2b-th electrode 22b are patterned. The third organic layer 23c including the third light emitting layer is not disposed above the 2b-th electrode 22b. Furthermore, the first organic layer 23a including the first light emitting layer is located below the 1b-th electrode 21b. An interlayer insulating layer 36 is formed on a part of the 2b-th electrode 22b.

The 1c-th electrode 21c constituting the third light emitting element 10c is formed on an interlayer insulating layer 37 disposed on the insulating layer 36, and is connected to one of the source/drain regions 55c of the TFT for driving the third light emitting element 10c through contact hole portions 56c, 57c, and 58c formed in the insulating layer 43 and the interlayer insulating layers 31, 32, 33, 34, 35, and 36. An insulating film 59B is formed on a part of an inner surface of the contact hole portion 58c such that the contact hole portion 58c is not short-circuited with the 2b-th electrode 22b. An interlayer insulating layer 38 having an opening is formed so as to surround the 1c-th electrode 21c, and the third organic layer 23c including the third light emitting layer is formed from the 1c-th electrode 21c exposed at a bottom of the opening to the interlayer insulating layer 38 so as to cover the 1c-th electrode 21c and the interlayer insulating layer 38. Moreover, the 2c-th electrode 22c is formed on the third organic layer 23c. The third organic layer 23c and the 2c-th electrode 22c are patterned. The second organic layer 23b including the second light emitting layer and the first organic layer 23a including the first light emitting layer are located below the 1c-th electrode 21c.

Also in the light emitting element unit of Example 3, the 2a-th electrode 22a, the 2b-th electrode 22b, and the 2c-th electrode 22c are connected to each other, for example, in an outer peripheral region (not illustrated) of the organic EL display device, and the same potential is applied thereto although not being limited thereto.

The light emitting element unit and the organic EL display device of Example 3 can be manufactured by a method substantially similar to the method for manufacturing a light emitting element unit and an organic EL display device described in Example 1, and therefore detailed description thereof is omitted.

Also in the light emitting element unit of Example 3 described above, the organic layers can be deposited without using a vapor deposition mask. Therefore, mask alignment as in the RGB color-separated structure is unnecessary, and it is easy to manufacture various display devices, for example, a micro-display such as an organic EL display device with a fine pixel pitch or a large-scale display such as a large-scale organic EL display device to which a vapor deposition mask is hardly applied. Moreover, the first light emitting element has a first light emitting portion including the 1a-th electrode, the first organic layer, and the 2a-th electrode. The second light emitting element has a second light emitting portion including the 1b-th electrode, the second organic layer, and the 2b-th electrode. The third light emitting element has a third light emitting portion including the 1c-th electrode, the third organic layer, and the 2c-th electrode. In each of the light emitting portions, microcavity (resonator structure) can be optimized. Therefore, it is possible to improve light extraction efficiency and also to achieve high luminous efficiency and color purity.

Figure 5B:
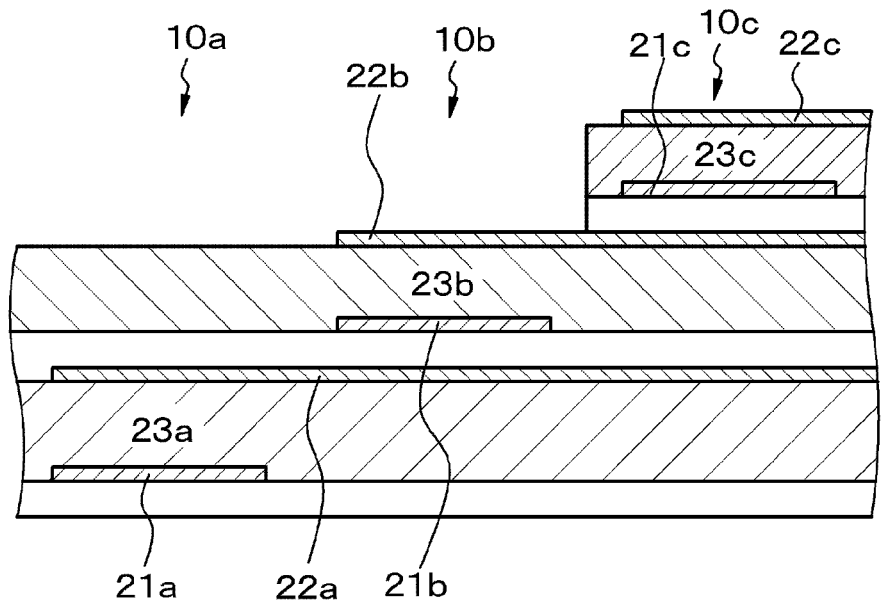
Figure 16:
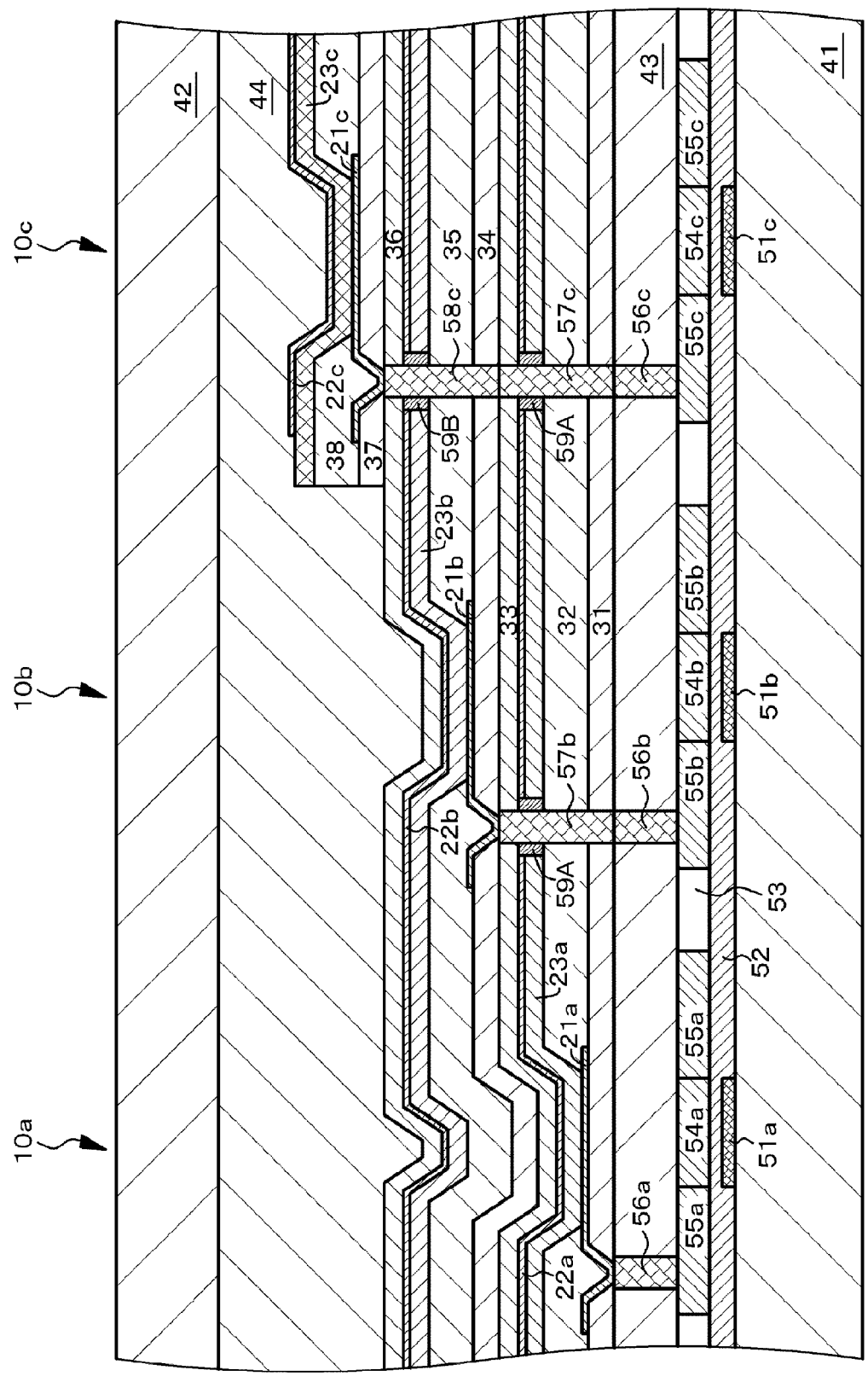
FIG. 16 is a schematic partial cross-sectional view of Modification (1) of the light emitting element unit of Example 3.

Note that as FIG. 5B illustrates a conceptual diagram of Modification (1) of the light emitting element unit of Example 3 and FIG. 16 illustrates a schematic partial cross-sectional view thereof, the second organic layer 23b may be formed on (or above) the 2a-th electrode 22a. That is, the second organic layer 23b including the second light emitting layer may be laminated above the 2a-th electrode 22a located in the region of the region of the first light emitting element 10a.

Figure 6A:
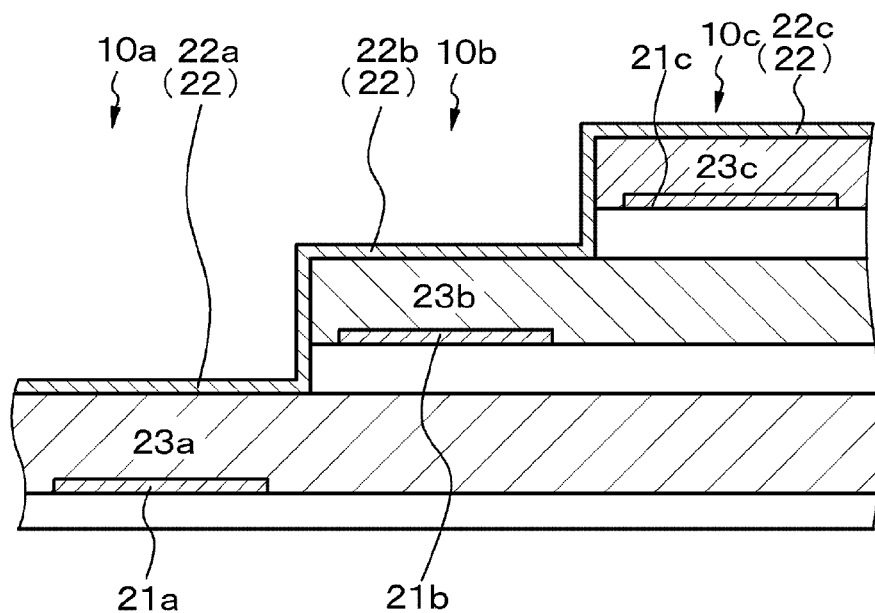
FIGS. 6A and 6B are conceptual diagrams of Modifications (2) and (3) of the light emitting element unit of Example 3, respectively.
Figure 6B:
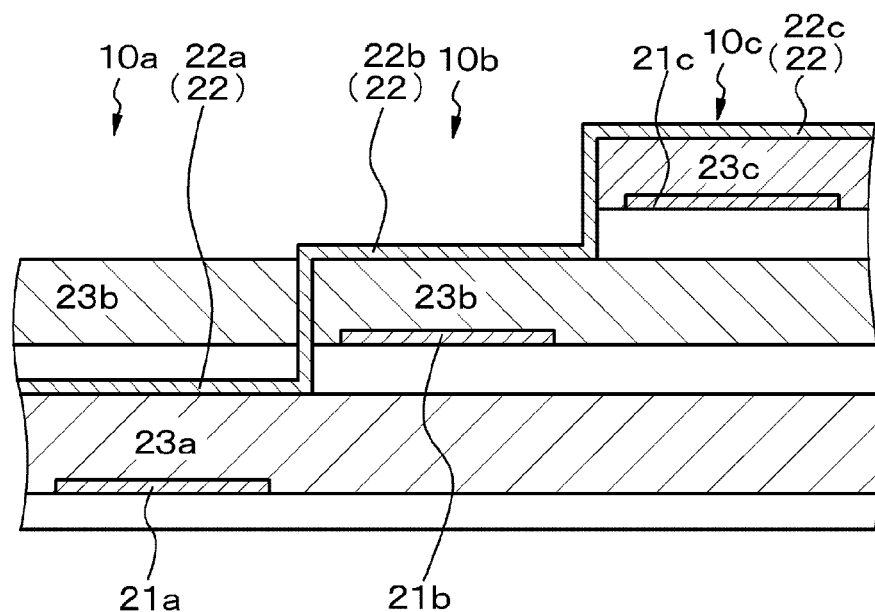
Figure 7:
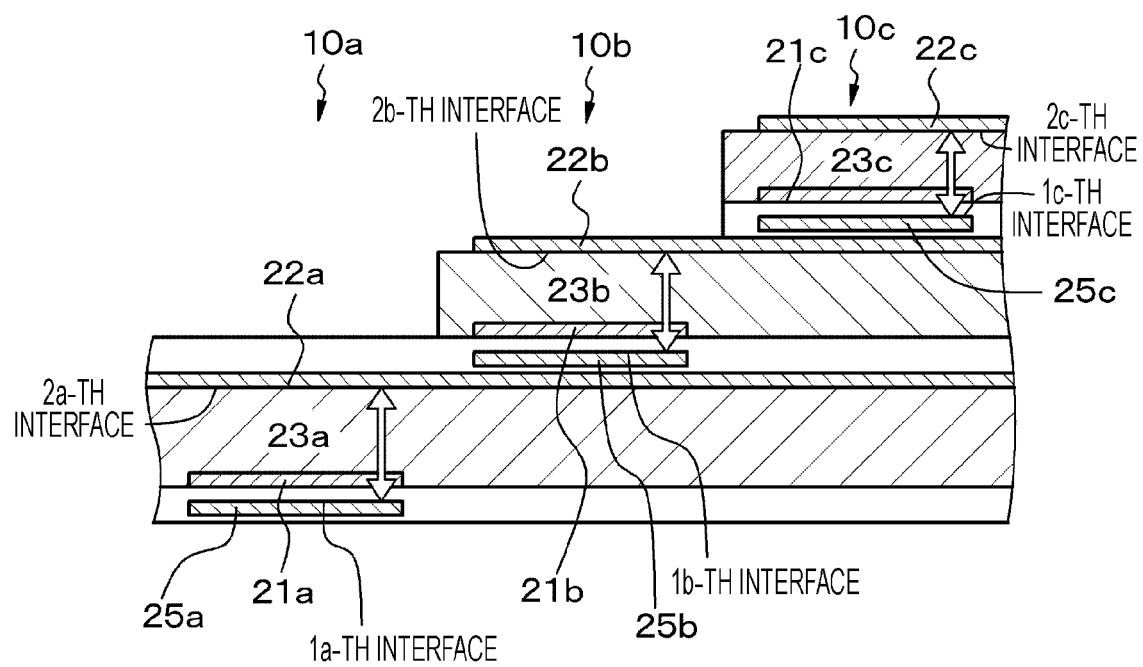
FIG. 7 is a conceptual diagram of Modification (4) of the light emitting element unit of Example 3.
Figure 17:
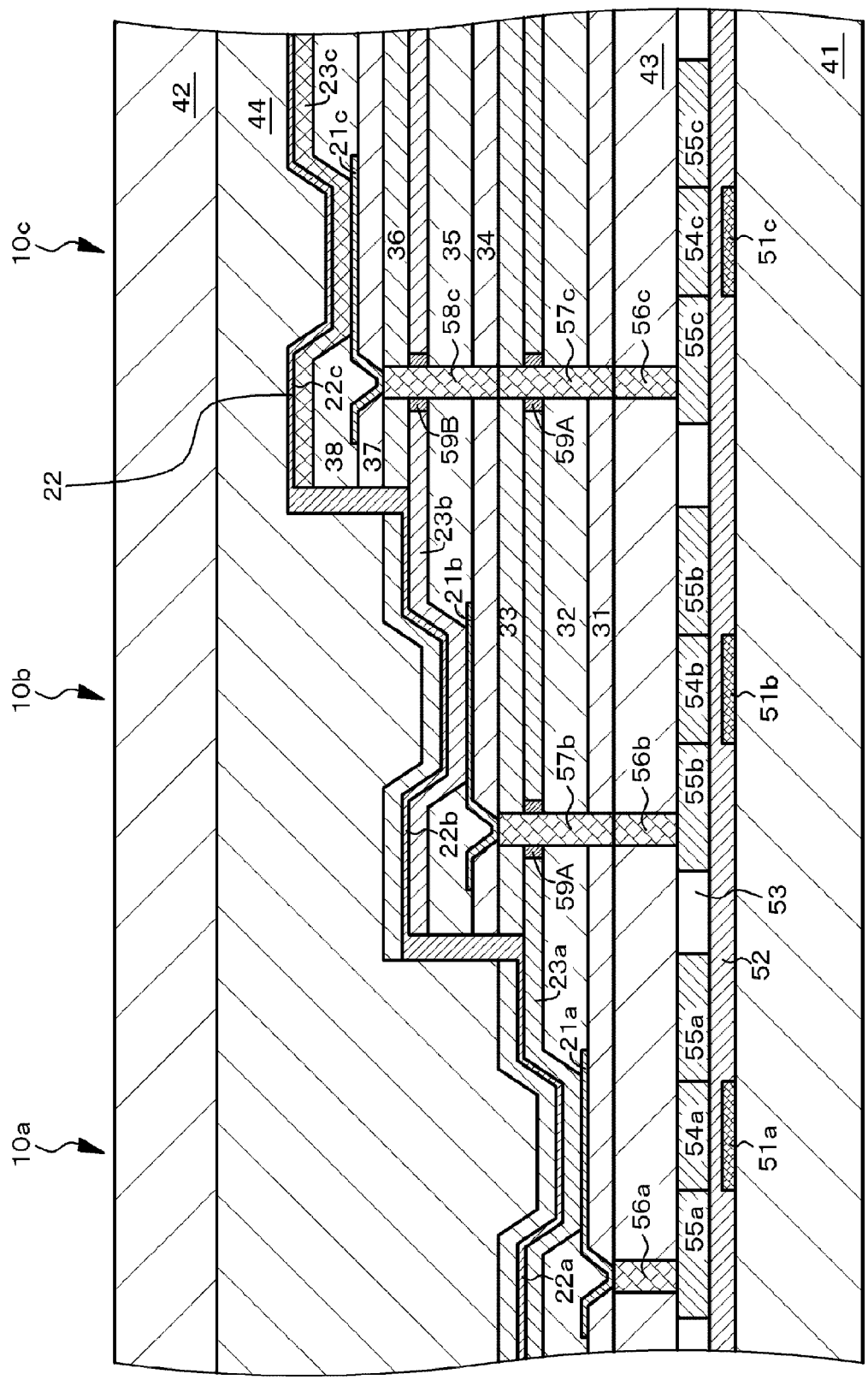
FIG. 17 is a schematic partial cross-sectional view of Modification (2) of the light emitting element unit of Example 3.
Figure 18:
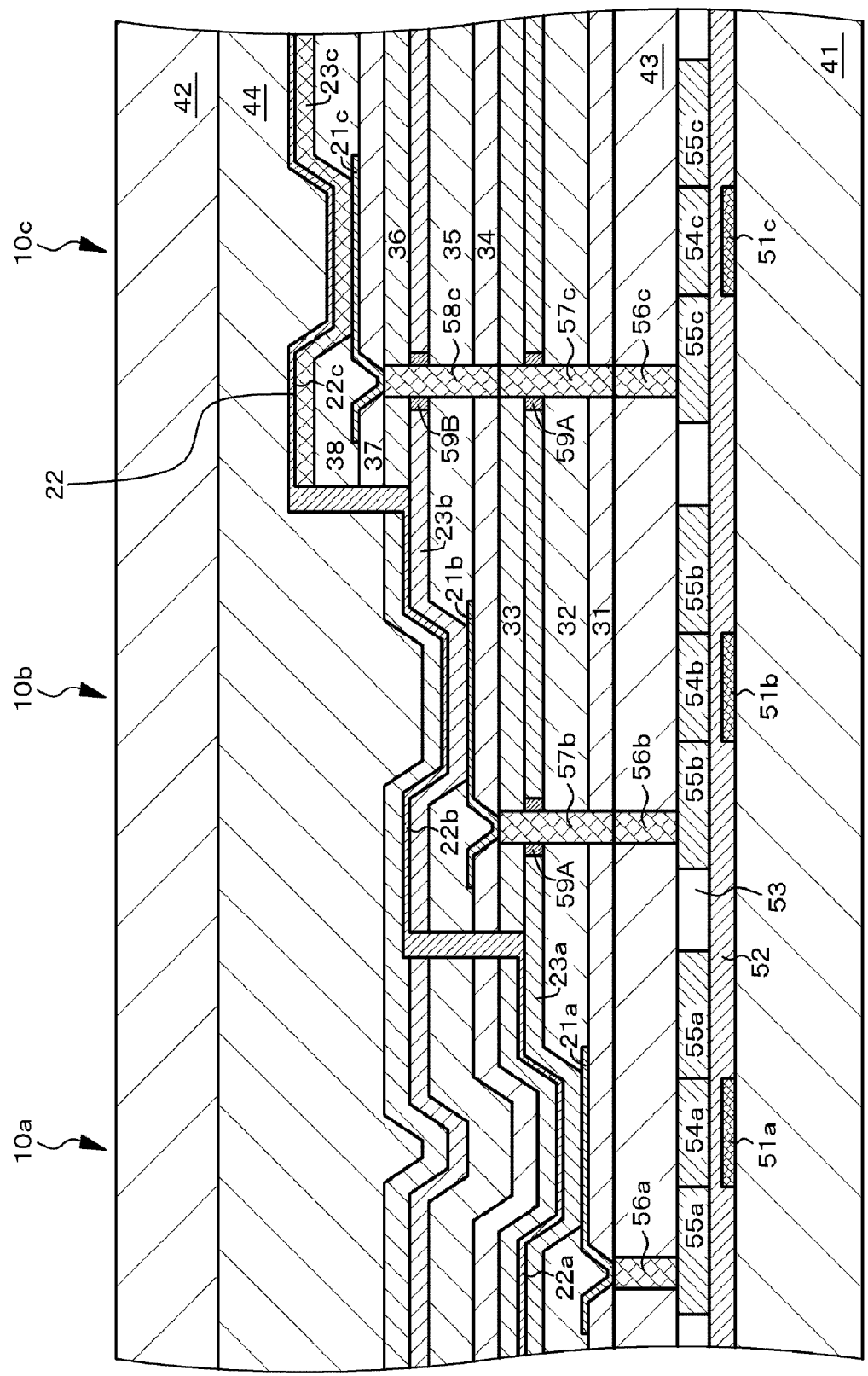
FIG. 18 is a schematic partial cross-sectional view of Modification (3) of the light emitting element unit of Example 3.

Furthermore, as FIG. 6A illustrates a conceptual diagram of Modification (2) of the light emitting element unit of Example 3 and FIG. 17 illustrates a schematic partial cross-sectional view thereof, and furthermore, as FIG. 6B illustrates a conceptual diagram of Modification (3), which is a modification of Modifications (1) and (2) of the light emitting element unit of Example 3, and FIG. 18 illustrates a schematic partial cross-sectional view thereof, the 2a-th electrode 22a, the 2b-th electrode 22b, and the 2c-th electrode 22c can be each constituted by a common second electrode 22. Note that a material constituting a portion of the second electrode 22 connecting the 2a-th electrode 22a and the 2b-th electrode 22b, and a portion of the second electrode 22 connecting the 2b-th electrode 22b and the 2c-th electrode 22c may be the same as or different from a material constituting the 2a-th electrode 22a, the 2b-th electrode 22b, and the 2c-th electrode 22c.

Hitherto, the present disclosure has been described on the basis of preferable Examples. However, the present disclosure is not limited to these Examples. The configurations and structures of the light emitting element unit, the light emitting element, and the organic EL display device described in Examples are illustrative and can be changed appropriately. In Examples 1 and 3, (the first light emitting element, the second light emitting element, and the third light emitting element) are constituted by (a red light emitting element, a green light emitting element, and a blue light emitting element), respectively. Alternatively, (the first light emitting element, the second light emitting element, and the third light emitting element) can be constituted by (a red light emitting element, a blue light emitting element, and a green light emitting element), (a green light emitting element, a red light emitting element, and a blue light emitting element), (a green light emitting element, a blue light emitting element, and a red light emitting element), (a blue light emitting element, a red light emitting element, and a green light emitting element), or (a blue light emitting element, a green light emitting element, and red light emitting element), respectively. The first organic layer, the second organic layer, and the third organic layer may be patterned into, for example, a strip shape, if desired.

A light shielding layer may be disposed between a light emitting element and a light emitting element in order to prevent light emitted from a certain light emitting element from entering a light emitting element adjacent to the certain light emitting element to cause optical crosstalk. In other words, a groove may be formed between a light emitting element and a light emitting element, and the groove may be filled with a light shielding material to form the light shielding layer. By disposing the light shielding layer in this way, it is possible to reduce a ratio at which light emitted from a certain light emitting element enters an adjacent light emitting element, and to suppress occurrence of a phenomenon that color mixing occurs and chromaticity of the entire pixels is shifted from desired chromaticity. In addition, color mixing can be prevented. Therefore, color purity increases when monochromatic light is emitted from a pixel, and a chromaticity point is deep. Therefore, a color gamut is widened, and a range of color expression of the display device is widened. Alternatively, a light shielding property may be imparted to a black matrix layer BM.

Figure 27A:
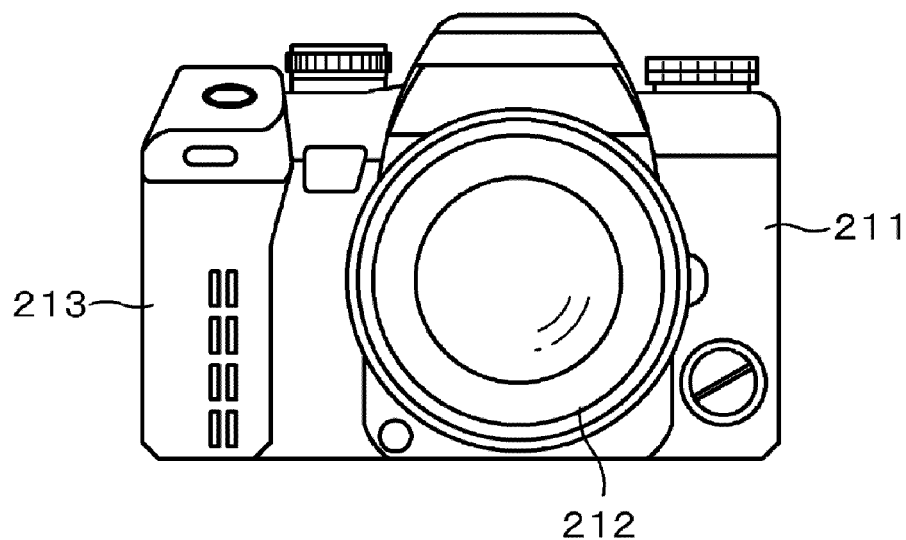
FIGS. 27A and 27B illustrate an example in which a display device in the present disclosure is applied to a lens interchangeable single-lens reflex type digital still camera.
Figure 27B:
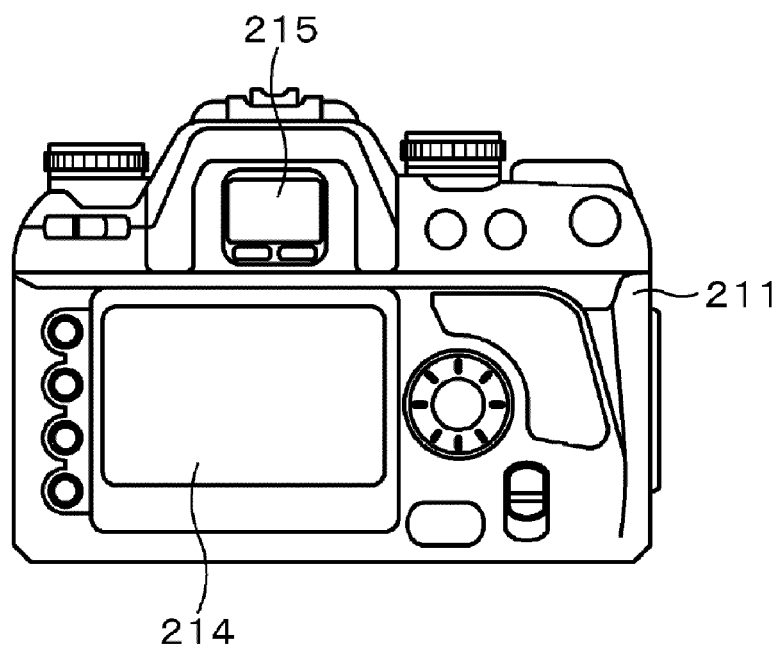

The display device in the present disclosure can be applied to a lens interchangeable single-lens reflex type digital still camera. FIG. 27A illustrates a front view of the digital still camera, and FIG. 27B illustrates a rear view thereof. This lens interchangeable single-lens reflex type digital still camera has, for example, an interchangeable imaging lens unit (interchangeable lens) 212 on the front right side of a camera body 211, and has a grip portion 213 to be gripped by an imaging person on the front left side thereof. In addition, a monitor 214 is disposed at substantially the center of a rear surface of the camera body 211. An electronic viewfinder (eyepiece window) 215 is disposed above a monitor 214. By looking through the electronic viewfinder 215, an imaging person can visually confirm a light image of a subject guided from the imaging lens unit 212 and determine a composition. In the lens interchangeable single-lens reflex type digital still camera having such a configuration, the display device in the present disclosure can be used as the electronic viewfinder 215.

Figure 28:
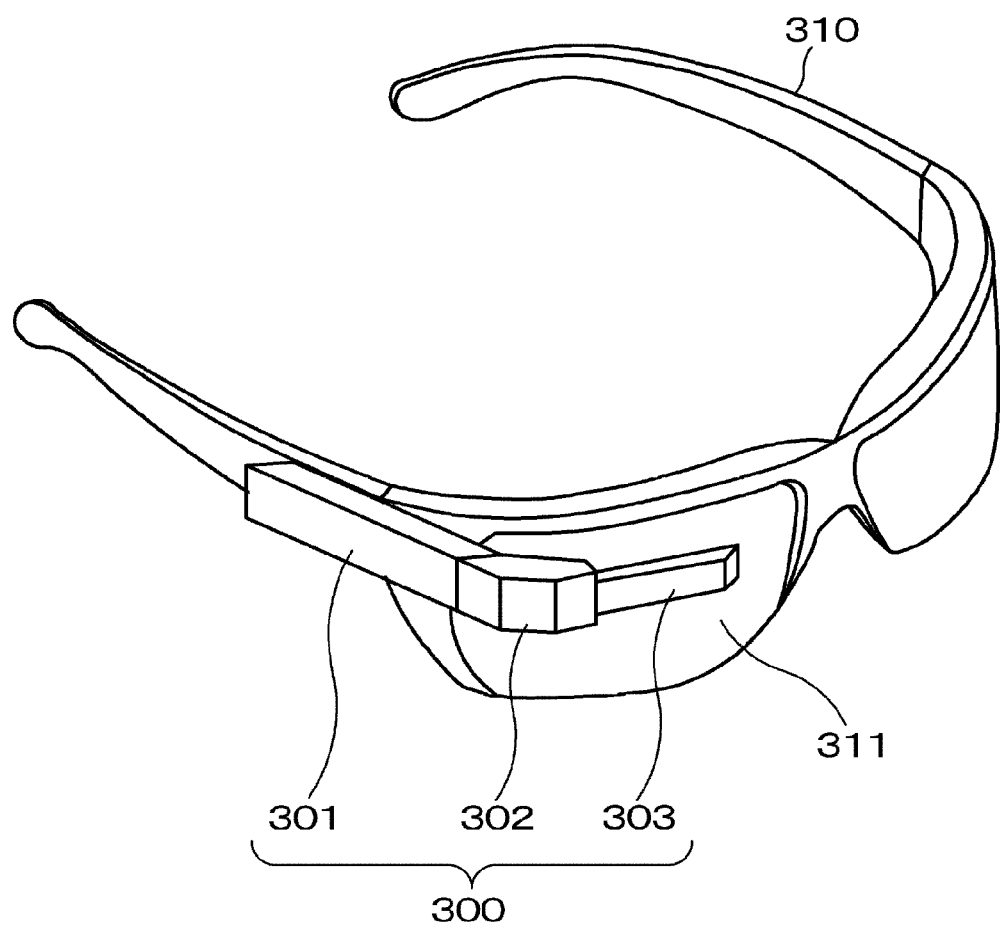
FIG. 28 is an external view of a head mounted display illustrating an example in which the display device in the present disclosure is applied to the head mounted display.

Alternatively, the display device in the present disclosure can be applied to a head mounted display. As FIG. 28 illustrates an external view, a head mounted display 300 is constituted by a transmissive head mounted display having a main body 301, an arm 302 and a lens barrel 303. The main body 301 is connected to the arm 302 and glasses 310. Specifically, an end of the main body 301 in a long side direction is attached to the arm 302. Furthermore, one of side surfaces of the main body 301 is connected to the glasses 310 through a connecting member (not illustrated). Note that the main body 301 may be directly mounted on the head of a human body. The main body 301 has a control substrate for controlling operation of the head mounted display 300 and a display unit built-in. The arm 302 supports the lens barrel 303 with respect to the main body 301 by connecting the main body 301 to the lens barrel 303. Specifically, the arm 302 fixes the lens barrel 303 to the main body 301 by being bonded to an end of the main body 301 and an end of the lens barrel 303. Furthermore, the arm 302 has a built-in signal line for communicating data related to an image provided from the main body 301 to the lens barrel 303. The lens barrel 303 projects image light provided from the main body 301 via the arm 302 toward the eyes of a user wearing the head mounted display 300 through the lens 311 of the glasses 310. In the head mounted display 300 having the configuration described above, the display device in the present disclosure can be used as the display unit built in the main body 301.

Note that the present disclosure can have the following configurations.

[A01]<<Light Emitting Element Unit: First Aspect>>

A light emitting element unit including three light emitting elements, in which a first light emitting element is obtained by laminating a 1a-th electrode, a first organic layer including a first light emitting layer, a 2a-th electrode, a second organic layer including a second light emitting layer, and a third organic layer including a third light emitting layer, a second light emitting element is obtained by laminating the first organic layer, a 1b-th electrode, the second organic layer, a 2b-th electrode, and the third organic layer, and a third light emitting element is obtained by laminating the first organic layer, the second organic layer, a 1c-th electrode, the third organic layer, and a 2c-th electrode.

[A02] The light emitting element unit according to [A01], in which the 2a-th electrode, the 2b-th electrode, and the 2c-th electrode are each constituted by a common second electrode.

[A03] The light emitting element unit according to [A01] or [A02], in which the same potential is applied to the 2a-th electrode, the 2b-th electrode, and the 2c-th electrode.

[A04] The light emitting element unit according to any one of [A01] to [A03], in which the 2a-th electrode, the 2b-th electrode, and the 2c-th electrode each have a laminated structure of a transparent conductive layer and a semi-transmissive conductive layer.

[A05] The light emitting element unit according to [A04], in which the transparent conductive layer contains an oxide of indium and zinc (IZO).

[A06] The light emitting element unit according to [A04] or [A05], in which the semi-transmissive conductive layer contains an alloy of magnesium and silver.

[A07] The light emitting element unit according to any one of [A01] to [A06], in which in the first light emitting element, between a 1a-th interface constituted by an interface between the 1a-th electrode and the first organic layer or a first light reflecting layer, and a 2a-th interface constituted by an interface between the 2a-th electrode and the first organic layer, light emitted in the first light emitting layer is resonated, and a part of the resonated light is emitted from the 2a-th electrode, in the second light emitting element, between a 1b-th interface constituted by an interface between the 1b-th electrode and the second organic layer or a second light reflecting layer, and a 2b-th interface constituted by an interface between the 2b-th electrode and the second organic layer, light emitted in the second light emitting layer is resonated, and a part of the resonated light is emitted from the 2b-th electrode, and in the third light emitting element, between a 1c-th interface constituted by an interface between the 1c-th electrode and the third organic layer or a third light reflecting layer, and a 2c-th interface constituted by an interface between the 2c-th electrode and the third organic layer, light emitted in the third light emitting layer is resonated, and a part of the resonated light is emitted from the 2c-th electrode.

[A08] The light emitting element unit according to [A07], in which when a distance from a maximum emission position of the first light emitting layer to the 1a-th interface is represented by $L_{1A}$, an optical distance thereof is represented by $OL_{1A}$, a distance from the maximum emission position of the first light emitting layer to the 2a-th interface is represented by $L_{2A}$, an optical distance thereof is represented by $OL_{2A}$, and $m_{1A}$ and $m_{2A}$ represent integers, the following formulas (A-1), (A-2), (A-3), and (A-4) are satisfied, when a distance from a maximum emission position of the second light emitting layer to the 1b-th interface is represented by $L_{1B}$, an optical distance thereof is represented by $OL_{1B}$, a distance from the maximum emission position of the second light emitting layer to the 2b-th interface is represented by $L_{2B}$, an optical distance thereof is represented by $OL_{2B}$, and $m_{1B}$ and $m_{2B}$ represent integers, the following formulas (B-1), (B-2), (B-3), and (B-4) are satisfied, and when a distance from a maximum emission position of the third light emitting layer to the 1c-th interface is represented by $L_{1C}$, an optical distance thereof is represented by $OL_{1C}$, a distance from the maximum emission position of the third light emitting layer to the 2c-th interface is represented by $L_{2C}$, an optical distance thereof is represented by $OL_{2C}$, and $m_{1C}$ and $m_{2C}$ represent integers, the following formulas (C-1), (C-2), (C-3), and (C-4) are satisfied.

$$0.7\{-\Phi_{1A}/(2\pi)+m_{1A}\} \le 2 \times OL_{1A}/\lambda_A \le 1.2\{-\Phi_{1A}/(2\pi)+m_{1A}\} \quad (A\text{-}1)$$

$$0.7\{-\Phi_{2A}/(2\pi)+m_{2A}\} \le 2 \times OL_{2A}/\lambda_A \le 1.2\{-\Phi_{2A}/(2\pi)+m_{2A}\} \quad (A\text{-}2)$$

$$L_{1A} < L_{2A} \quad (A\text{-}3)$$

$$m_{1A} < m_{2A} \quad (A\text{-}4)$$

$$0.7\{-\Phi_{1B}/(2\pi)+m_{1B}\} \le 2 \times OL_{1B}/\lambda_B \le 1.2\{-\Phi_{1B}/(2\pi)+m_{1B}\} \quad (B\text{-}1)$$

$$0.7\{-\Phi_{2B}/(2\pi)+m_{2B}\} \le 2 \times OL_{2B}/\lambda_B \le 1.2\{-\Phi_{2B}/(2\pi)+m_{2B}\} \quad (B\text{-}2)$$

$$L_{1B} < L_{2B} \quad (B\text{-}3)$$

$$m_{1B} < m_{2B} \quad (B\text{-}4)$$

$$0.7\{-\Phi_{1C}/(2\pi)+m_{1C}\} \le 2 \times OL_{1C}/\lambda_C \le 1.2\{-\Phi_{1C}/(2\pi)+m_{1C}\} \quad (C\text{-}1)$$

$$0.7\{-\Phi_{2C}/(2\pi)+m_{2C}\} \le 2 \times OL_{2C}/\lambda_C \le 1.2\{-\Phi_{2C}/(2\pi)+m_{2C}\} \quad (C\text{-}2)$$

$$L_{1C} < L_{2C} \quad (C\text{-}3)$$

$$m_{1C} < m_{2C} \quad (C\text{-}4)$$

Here, $\lambda_A$: maximum peak wavelength of a spectrum of light generated in the first light emitting layer (or a desired wavelength of light generated in the first light emitting layer)

$\Phi_{1A}$: phase shift amount of light reflected by the 1a-th interface (unit: radian)

Provided that $-2\pi < \Phi_{1A} \le 0$ is satisfied.

$\Phi_{2A}$: phase shift amount of light reflected by the 2a-th interface (unit: radian)

Provided that $-2\pi < \Phi_{2A} \le 0$ is satisfied.

$\lambda_B$: maximum peak wavelength of spectrum of light generated in the second light emitting layer (or a desired wavelength of light generated in the second light emitting layer)

$\Phi_{1B}$: phase shift amount of light reflected by the 1b-th interface (unit: radian)

Provided that $-2\pi < \Phi_{1B} \le 0$ is satisfied.

$\Phi_{2B}$: phase shift amount of light reflected by the 2b-th interface (unit: radian)

Provided that $-2\pi < \Phi_{2B} \le 0$ is satisfied.

$\lambda_C$: maximum peak wavelength of a spectrum of light generated in the third light emitting layer (or a desired wavelength of light generated in the third light emitting layer)

$\Phi_{1C}$: phase shift amount of light reflected by the 1c-th interface (unit: radian)

Provided that $-2\pi < \Phi_{1C} \le 0$ is satisfied.

$\Phi_{2C}$: phase shift amount of light reflected by the 2c-th interface (unit: radian)

Provided that $-2\pi < \Phi_{2C} \le 0$ is satisfied.

[A09] The light emitting element unit according to [A08], in which $m_{1A}=0$, $m_{2A}=1$, $m_{1B}=0$, $m_{2B}=1$, $m_{1C}=0$, and $m_{2C}=1$ are satisfied.

[B01]<<Light Emitting Element Unit: Second Aspect>>

A light emitting element unit including three light emitting elements, in which a first light emitting element and a second light emitting element are juxtaposed, the first light emitting element includes a 1a-th electrode, a first organic layer including a first light emitting layer, and a 2a-th electrode, and the second light emitting element includes a 1b-th electrode, the first organic layer, and a 2b-th electrode, a third light emitting element is obtained by laminating the first organic layer, a 1c-th electrode, a third organic layer including a third light emitting layer, and a 2c-th electrode, a first color filter is disposed on a light emission side of the first light emitting element, and a second color filter is disposed on a light emission side of the second light emitting element.

[B02] The light emitting element unit according to [B01], in which the 2a-th electrode, the 2b-th electrode, and the 2c-th electrode are each constituted by a common second electrode.

[B03] The light emitting element unit according to [B01] or [B02], in which the same potential is applied to the 2a-th electrode, the 2b-th electrode, and the 2c-th electrode.

[B04] The light emitting element unit according to any one of [B1] to [B03], in which the 2a-th electrode and the 2b-th electrode each have a laminated structure of a transparent conductive layer and a semi-transmissive conductive layer.

[B05] The light emitting element unit according to [B04], in which the transparent conductive layer contains an oxide of indium and zinc (IZO).

[B06] The light emitting element unit according to [B04] or [B05], in which the semi-transmissive conductive layer contains an alloy of magnesium and silver.

[B07] The light emitting element unit according to any one of [B1] to [B03], in which the 2c-th electrode contains an alloy of magnesium and silver.

[B08] The light emitting element unit according to any one of [B1] to [B03], in which the structures of the 2a-th electrode and the 2b-th electrode are different from the structure of the 2c-th electrode.

[B09] The light emitting element unit according to any one of [B01] to [B06], in which in the third light emitting element, between the 1c-th interface constituted by an interface between the 1c-th electrode and the third organic layer or the third light reflecting layer, and a 2c-th interface constituted by an interface between the 2c-th electrode and the third organic layer, light emitted in the third light emitting layer is resonated, and a part of the resonated light is emitted from the 2c-th electrode.

[B10] The light emitting element unit according to [B09], in which when a distance from a maximum emission position of the third light emitting layer to the 1c-th interface is represented by $L_{1C}$, an optical distance thereof is represented by $OL_{1C}$, a distance from the maximum emission position of the third light emitting layer to the 2c-th interface is represented by $L_{2C}$, an optical distance thereof is represented by $OL_{2C}$, and $m_{1C}$ and $m_{2C}$ represent integers, the following formulas (C-1), (C-2), (C-3), and $$0.7\{-\Phi_{1C}/(2\pi)+m_{1C}\} \le 2 \times OL_{1C}/\lambda_C \le 1.2\{-\Phi_{1C}/(2\pi)+m_{1C}\} \quad (C\text{-}1)$$

$$0.7\{-\Phi_{2C}/(2\pi)+m_{2C}\} \le 2 \times OL_{2C}/\lambda_C \le 1.2\{-\Phi_{2C}/(2\pi)+m_{2C}\} \quad (C\text{-}2)$$

$$L_{1C} < L_{2C} \quad (C\text{-}3)$$

$$m_{1C} < m_{2C} \quad (C\text{-}4)$$

Here, $\lambda_C$: maximum peak wavelength of a spectrum of light generated in the third light emitting layer (or a desired wavelength of light generated in the third light emitting layer)

$\Phi_{1C}$: phase shift amount of light reflected by the 1c-th interface (unit: radian)

Provided that $-2\pi < \Phi_{1C} \leq 0$ is satisfied.

$\Phi_{2C}$: phase shift amount of light reflected by the 2c-th interface (unit: radian)

Provided that $-2\pi < \Phi_{2C} \leq 0$ is satisfied.

[B11] The light emitting element unit according to [B10], in which $m_{1C}=0$ and $m_{2C}=1$ are satisfied.

[C01] <<Light Emitting Element Unit: Third Aspect>>

A light emitting element unit including three light emitting elements, in which a first light emitting element is obtained by laminating a 1a-th electrode, a first organic layer including a first light emitting layer, and a 2a-th electrode, a second light emitting element is obtained by laminating the first organic layer, a 1b-th electrode, a second organic layer including a second light emitting layer, and a 2b-th electrode, and a third light emitting element is obtained by laminating the first organic layer, the second organic layer, a 1c-th electrode, a third organic layer including a third light emitting layer, and a 2c-th electrode.

[C02] The light emitting element unit according to [C01], in which the 2a-th electrode, the 2b-th electrode, and the 2c-th electrode are each constituted by a common second electrode.

[C03] The light emitting element unit according to [C01] or [C02], in which the same potential is applied to the 2a-th electrode, the 2b-th electrode, and the 2c-th electrode.

[C04] The light emitting element unit according to any one of [C01] to [C03], in which the 2a-th electrode, the 2b-th electrode, and the 2c-th electrode each have a laminated structure of a transparent conductive layer and a semi-transmissive conductive layer.

[C05] The light emitting element unit according to [C04], in which the transparent conductive layer contains an oxide of indium and zinc (IZO).

[C06] The light emitting element unit according to [C04] or [C05], in which the semi-transmissive conductive layer contains an alloy of magnesium and silver.

[C07] The light emitting element unit according to any one of [C01] to [C06], in which in the first light emitting element, between a 1a-th interface constituted by an interface between the 1a-th electrode and the first organic layer or a first light reflecting layer, and a 2a-th interface constituted by an interface between the 2a-th electrode and the first organic layer, light emitted in the first light emitting layer is resonated, and a part of the resonated light is emitted from the 2a-th electrode, in the second light emitting element, between a 1b-th interface constituted by an interface between the 1b-th electrode and the second organic layer or a second light reflecting layer, and a 2b-th interface constituted by an interface between the 2b-th electrode and the second organic layer, light emitted in the second light emitting layer is resonated, and a part of the resonated light is emitted from the 2b-th electrode, and in the third light emitting element, between a 1c-th interface constituted by an interface between the 1c-th electrode and the third organic layer or a third light reflecting layer, and a 2c-th interface constituted by an interface between the 2c-th electrode and the third organic layer, light emitted in the third light emitting layer is resonated, and a part of the resonated light is emitted from the 2c-th electrode.

[C08] The light emitting element unit according to [C07], in which when a distance from a maximum emission position of the first light emitting layer to the 1a-th interface is represented by $L_{1A}$, an optical distance thereof is represented by $OL_{1A}$, a distance from the maximum emission position of the first light emitting layer to the 2a-th interface is represented by $L_{2A}$, an optical distance thereof is represented by $OL_{2A}$, and $m_{1A}$ and $m_{2A}$ represent integers, the following formulas (A-1), (A-2), (A-3), and (A-4) are satisfied, when a distance from a maximum emission position of the second light emitting layer to the 1b-th interface is represented by $L_{1B}$, an optical distance thereof is represented by $OL_{1B}$, a distance from the maximum emission position of the second light emitting layer to the 2b-th interface is represented by $L_{2B}$, an optical distance thereof is represented by $OL_{2B}$, and $m_{1B}$ and $m_{2B}$ represent integers, the following formulas (B-1), (B-2), (B-3), and (B-4) are satisfied, and when a distance from a maximum emission position of the third light emitting layer to the 1c-th interface is represented by $L_{1C}$, an optical distance thereof is represented by $OL_{1C}$, a distance from the maximum emission position of the third light emitting layer to the 2c-th interface is represented by $L_{2C}$, an optical distance thereof is represented by $OL_{2C}$, and $m_{1C}$ and $m_{2C}$ represent integers, the following formulas (C-1), (C-2), (C-3), and (C-4) are satisfied.

$$0.7\{-\Phi_{1A}/(2\pi)+m_{1A}\} \leq 2\times OL_{1A}/\lambda_A \leq 1.2\{-\Phi_{1A}/(2\pi)+m_{1A}\} \tag{A-1}$$

$$0.7\{-\Phi_{2A}/(2\pi)+m_{2A}\} \leq 2\times OL_{2A}/\lambda_A \leq 1.2\{-\Phi_{2A}/(2\pi)+m_{2A}\} \tag{A-2}$$

$$L_{1A} < L_{2A} \tag{A-3}$$

$$m_{1A} < m_{2A} \tag{A-4}$$

$$0.7\{-\Phi_{1B}/(2\pi)+m_{1B}\} \leq 2\times OL_{1B}/\lambda_B \leq 1.2\{-\Phi_{1B}/(2\pi)+m_{1B}\} \tag{B-1}$$

$$0.7\{-\Phi_{2B}/(2\pi)+m_{2B}\} \leq 2\times OL_{2B}/\lambda_B \leq 1.2\{-\Phi_{2B}/(2\pi)+m_{2B}\} \tag{B-2}$$

$$L_{1B} < L_{2B} \tag{B-3}$$

$$m_{1B} < m_{2B} \tag{B-4}$$

$$0.7\{-\Phi_{1C}/(2\pi)+m_{1C}\} \leq 2\times OL_{1C}/\lambda_C \leq 1.2\{-\Phi_{1C}/(2\pi)+m_{1C}\} \tag{C-1}$$

$$0.7\{-\Phi_{2C}/(2\pi)+m_{2C}\} \leq 2\times OL_{2C}/\lambda_C \leq 1.2\{-\Phi_{2C}/(2\pi)+m_{2C}\} \tag{C-2}$$

$$L_{1C} < L_{2C} \tag{C-3}$$

$$m_{1C} < m_{2C} \tag{C-4}$$

Here, $\lambda_A$: maximum peak wavelength of a spectrum of light generated in the first light emitting layer (or a desired wavelength of light generated in the first light emitting layer)

$\Phi_{1A}$: phase shift amount of light reflected by the 1a-th interface (unit: radian)

Provided that $-2\pi < \Phi_{1A} \leq 0$ is satisfied.

$\Phi_{2A}$: phase shift amount of light reflected by the 2a-th interface (unit: radian)

Provided that $-2\pi < \Phi_{2A} \leq 0$ is satisfied.

$\lambda_B$: maximum peak wavelength of spectrum of light generated in the second light emitting layer (or a desired wavelength of light generated in the second light emitting layer)

$\Phi_{1B}$: phase shift amount of light reflected by the 1b-th interface (unit: radian)

Provided that $-2\pi < \Phi_{1B} \leq 0$ is satisfied.

$\Phi_{2B}$: phase shift amount of light reflected by the 2b-th interface (unit: radian)

Provided that $-2\pi < \Phi_{2B} \leq 0$ is satisfied.

$\lambda_C$: maximum peak wavelength of a spectrum of light generated in the third light emitting layer (or a desired wavelength of light generated in the third light emitting layer)

$\Phi_{1C}$: phase shift amount of light reflected by the 1c-th interface (unit: radian)

Provided that $-2\pi < \Phi_{1C} \leq 0$ is satisfied.

$\Phi_{2C}$: phase shift amount of light reflected by the 2c-th interface (unit: radian)

Provided that $-2\pi < \Phi_{2C} \leq 0$ is satisfied.

[C09] The light emitting element unit according to [C08], in which $m_{1A}=0$, $m_{2A}=1$, $m_{1B}=0$, $m_{2B}=1$, $m_{1C}=0$, and $m_{2C}=1$ are satisfied.

[D01]<<Light emitting element unit: fourth aspect>>

A light emitting element unit including a plurality of light emitting elements having a laminated structure obtained by laminating a plurality of organic layers each including a light emitting layer, in which each of the light emitting elements includes a first electrode, any one of the plurality of organic layers, and a second electrode, and the first electrodes constituting the respective light emitting elements do not overlap with each other between the light emitting elements.

[E01]<<Organic Electroluminescence Display Device>>

An organic electroluminescence display device obtained by arranging the light emitting element units according to any one of [A01] to [D01] in a two-dimensional matrix.

[E02]<<Display Device>>

A display device obtained by arranging the light emitting element units according to any one of [A01] to [D01] in a two-dimensional matrix.

REFERENCE SIGNS LIST 10 (10a, 10b, 10c) Light emitting element
10a First light emitting element
10b Second light emitting element
10c Third light emitting element
21a 1a-th electrode
21b 1b-th electrode
21c 1c-th electrode
22a 2a-th electrode
22b 2b-th electrode
22c 2c-th electrode
22d Common second electrode (2a-th electrode and 2b-th electrode)
23a First organic layer including first light emitting layer
23b Second organic layer including second light emitting layer
23c Third organic layer including third light emitting layer
23d First organic layer and second organic layer
24a, 24b Color filter
25a, 25b, 25c Light reflecting layer BM Black matrix layer
31, 32, 33, 34, 35, 36, 37, 38 Interlayer insulating layer
41 First substrate
42 Second substrate
43 Insulating layer
44 Protective film
51a, 51b, 51c Gate electrode
52 Gate insulating film
53 Silicon layer (semiconductor layer)
54a, 54b, 54c Channel forming region
55a, 55b, 55c Source/drain region
56a, 56b, 56c, 57b, 57c, 58c
66, 67, 68, 69 Contact hole portion
59A, 59B Insulating film

The invention claimed is:

1. A light emitting element unit comprising:
a first light emitting element;
a second light emitting element; and
a third light emitting element, wherein
the first light emitting element is formed by laminating a 1a-th electrode, a first organic layer including a first light emitting layer, a 2a-th electrode, a second organic layer including a second light emitting layer, and a third organic layer including a third light emitting layer, the first organic layer extending across the first light emitting element, the second light emitting element and the third light emitting element, the 1a-th electrode not extending into locations of the second and third light emitting elements,
a second light emitting element is formed by laminating the first organic layer, a 1b-th electrode, the second organic layer, a 2b-th electrode, and the third organic layer, and
a third light emitting element is formed by laminating the first organic layer, the second organic layer, a 1c-th electrode, the third organic layer, and a 2c-th electrode, the 1c-th electrode and the 2c-th electrode not extending into locations of the first and second light emitting elements.

2. The light emitting element unit according to claim 1, wherein the same potential is applied to the 2a-th electrode, the 2b-th electrode, and the 2c-th electrode.

3. The light emitting element unit according to claim 1, wherein
in the first light emitting element, between a 1a-th interface constituted by an interface between the 1a-th electrode and the first organic layer or a first light reflecting layer, and a 2a-th interface constituted by an interface between the 2a-th electrode and the first organic layer, light emitted in the first light emitting layer is resonated, and a part of the resonated light is emitted from the 2a-th electrode,
in the second light emitting element, between a 1b-th interface constituted by an interface between the 1b-th electrode and the second organic layer or a second light reflecting layer, and a 2b-th interface constituted by an interface between the 2b-th electrode and the second organic layer, light emitted in the second light emitting layer is resonated, and a part of the resonated light is emitted from the 2b-th electrode, and
in the third light emitting element, between a 1c-th interface constituted by an interface between the 1c-th electrode and the third organic layer or a third light reflecting layer, and a 2c-th interface constituted by an interface between the 2c-th electrode and the third organic layer, light emitted in the third light emitting layer is resonated, and a part of the resonated light is emitted from the 2c-th electrode.

4. The light emitting element unit according to claim 3, wherein when a distance from a maximum emission position of the first light emitting layer to the 1a-th interface is represented by $L_{1A}$, an optical distance thereof is represented by $OL_{1A}$, a distance from the maximum emission position of the first light emitting layer to the 2a-th interface is represented by $L_{2A}$, an optical distance thereof is represented by $OL_{2A}$, and $m_{1A}$ and $m_{2A}$ represent integers, the following formulas (A-1), (A-2), (A-3), and (A-4) are satisfied, when a distance from a maximum emission position of the second light emitting layer to the 1b-th interface is represented by $L_{1B}$, an optical distance thereof is represented by $OL_{1B}$, a distance from the maximum emission position of the second light emitting layer to the 2b-th interface is represented by $L_{2B}$, an optical distance thereof is represented by $OL_{2B}$, and $m_{1B}$ and $m_{2B}$ represent integers, the following formulas (B-1), (B-2), (B-3), and (B-4) are satisfied, and when a distance from a maximum emission position of the third light emitting layer to the 1c-th interface is represented by $L_{1C}$, an optical distance thereof is represented by $OL_{1C}$, a distance from the maximum emission position of the third light emitting layer to the 2c-th interface is represented by $L_{2C}$, an optical distance thereof is represented by $OL_{2C}$, and $m_{1C}$ and $m_{2C}$ represent integers, the following formulas (C-1), (C-2), (C-3), and (C-4) are satisfied;

$$0.7\{-\Phi_{1A}/(2\pi)+m_{1A}\} \leq 2 \times OL_{1A}/\lambda_A \leq 1.2\{-\Phi_{1A}/(2\pi)+m_{1A}\} \tag{A-1}$$

$$0.7\{-\Phi_{2A}/(2\pi)+m_{2A}\} \leq 2 \times OL_{2A}/\lambda_A \leq 1.2\{-\Phi_{2A}/(2\pi)+m_{2A}\} \tag{A-2}$$

$$L_{1A} < L_{2A} \tag{A-3}$$

$$m_{1A} < m_{2A} \tag{A-4}$$

$$0.7\{-\Phi_{1B}/(2\pi)+m_{1B}\} \leq 2 \times OL_{1B}/\lambda_B \leq 1.2\{-\Phi_{1B}/(2\pi)+m_{1B}\} \tag{B-1}$$

$$0.7\{-\Phi_{2B}/(2\pi)+m_{2B}\} \leq 2 \times OL_{2B}/\lambda_B \leq 1.2\{-\Phi_{2B}/(2\pi)+m_{2B}\} \tag{B-2}$$

$$L_{1B} < L_{2B} \tag{B-3}$$

$$m_{1B} < m_{2B} \tag{B-4}$$

$$0.7\{-\Phi_{1C}/(2\pi)+m_{1C}\} \leq 2 \times OL_{1C}/\lambda_C \leq 1.2\{-\Phi_{1C}/(2\pi)+m_{1C}\} \tag{C-1}$$

$$0.7\{-\Phi_{2C}/(2\pi)+m_{2C}\} \leq 2 \times OL_{2c}/\lambda_C \leq 1.2\{-\Phi_{2C}/(2\pi)+m_{2C}\} \tag{C-2}$$

$$L_{1C} < L_{2C} \tag{C-3}$$

$$m_{1C} < m_{2C} \tag{C-4}$$

here, $\lambda_A$: maximum peak wavelength of a spectrum of light generated in the first light emitting layer (or a desired wavelength of light generated in the first light emitting layer)

$\Phi_{1A}$: phase shift amount of light reflected by the 1a-th interface (unit: radian) provided, that $-2\pi < \Phi_{1A} \leq 0$ is satisfied;

$\Phi_{2A}$: phase shift amount of light reflected by the 2a-th interface (unit: radian) provided that $-2\pi < \Phi_{2A} \leq 0$ is satisfied;

$\lambda_B$: maximum peak wavelength of spectrum of light generated in the second light emitting layer (or a desired wavelength of light generated in the second light emitting layer)

$\Phi_{1B}$: phase shift amount of light reflected by the 1 b-th interface (unit: radian) provided that $-2\pi < \Phi_{1B} \leq 0$ is satisfied;

$\Phi_{2B}$: phase shift amount of light reflected by the 2b-th interface (unit: radian) provided that $-2\pi < \Phi_{2B} \leq 0$ is satisfied;

$\lambda_C$: maximum peak wavelength of a spectrum of light generated in the third light emitting layer (or a desired wavelength of light generated in the third light emitting layer)

$\Phi_{1C}$: phase shift amount of light reflected by the 1c-th interface (unit: radian) provided that $-2\pi < \Phi_{1C} \leq 0$ is satisfied;

$\Phi_{2C}$: phase shift amount of light reflected by the 2c-th interface (unit: radian) provided that $-2\pi < \Phi_{2C} \leq 0$ is satisfied.

5. The light emitting element unit according to claim 4, wherein $m_{1A}=0$, $m_{2A}=1$, $m_{1B}=0$, $m_{2B}=1$, $m_{1C}=0$, and $m_{2C}=1$ are satisfied.

6. A light emitting element unit comprising:
a first light emitting element;
a second light emitting element; and
a third light emitting element, wherein
the first light emitting element is formed by laminating a 1a-th electrode, a first organic layer including a first light emitting layer, a 2a-th electrode, a second organic layer including a second light emitting layer, and a third organic layer including a third light emitting layer,
the second light emitting element is formed by laminating the first organic layer, a 1b-th electrode, the second organic layer, a 2b-th electrode, and the third organic layer,
the third light emitting element is formed by laminating the first organic layer, the second organic layer, a 1c-th electrode, the third organic layer, and a 2c-th electrode, and
the 2a-th electrode, the 2b-th electrode, and the 2c-th electrode are each constituted by a common second electrode.

7. A light emitting element unit comprising:
a first light emitting element;
a second light emitting element; and
a third light emitting element, wherein
the first light emitting element is formed by laminating a 1a-th electrode, a first organic layer including a first light emitting layer, a 2a-th electrode, a second organic layer including a second light emitting layer, and a third organic layer including a third light emitting layer,
the second light emitting element is formed by laminating the first organic layer, a 1b-th electrode, the second organic layer, a 2b-th electrode, and the third organic layer,
the third light emitting element is formed by laminating the first organic layer, the second organic layer, a 1c-th electrode, the third organic layer, and a 2c-th electrode, and
the 2a-th electrode, the 2b-th electrode, and the 2c-th electrode each have a laminated structure of a transparent conductive layer and a semi-transmissive conductive layer.

8. The light emitting element unit according to claim 7, wherein the transparent conductive layer contains an oxide of indium and zinc (IZO).

9. The light emitting element unit according to claim 7, wherein the semi-transmissive conductive layer contains an alloy of magnesium and silver.

10. A light emitting element unit comprising:
a first light emitting element;
a second light emitting element; and
a third light emitting element, wherein
the first light emitting element is formed by laminating a 1a-th electrode, a first organic layer including a first light emitting layer, and a 2a-th electrode, the first organic layer extending across the first light emitting element, the second light emitting element and the third light emitting element, the 1a-th electrode not extending into locations of the second and third light emitting elements,
the second light emitting element is formed by laminating the first organic layer, a 1b-th electrode, a second organic layer including a second light emitting layer, and a 2b-th electrode, and
the third light emitting element is formed by laminating the first organic layer, the second organic layer, a 1c-th electrode, a third organic layer including a third light emitting layer, and a 2c-th electrode, the 1c-th electrode and the 2c-th electrode not extending into locations of the first and second light emitting elements.

\* \* \* \* \*